United States Patent
Busnaina et al.

(10) Patent No.: US 11,220,756 B2
(45) Date of Patent: Jan. 11, 2022

(54) THREE-DIMENSIONAL CRYSTALLINE, HOMOGENEOUS, AND HYBRID NANOSTRUCTURES FABRICATED BY ELECTRIC FIELD DIRECTED ASSEMBLY OF NANOELEMENTS

(71) Applicant: Northeastern University, Boston, MA (US)

(72) Inventors: Ahmed Busnaina, Needham, MA (US); Cihan Yilmaz, Boston, MA (US); TaeHoon Kim, Revere, MA (US); Sivasubramanian Somu, Natick, MA (US)

(73) Assignee: Northeastern University, Boston, MA (US)

( * ) Notice: Subject to any disclaimer, the term of this patent is extended or adjusted under 35 U.S.C. 154(b) by 315 days.

(21) Appl. No.: 16/131,658

(22) Filed: Sep. 14, 2018

(65) Prior Publication Data

US 2019/0017190 A1  Jan. 17, 2019

Related U.S. Application Data

(62) Division of application No. 14/410,961, filed as application No. PCT/US2013/048948 on Jul. 1, 2013, now abandoned.

(Continued)

(51) Int. Cl.
*C25D 13/18*    (2006.01)
*C25D 13/12*    (2006.01)
(Continued)

(52) U.S. Cl.
CPC .............. *C25D 13/18* (2013.01); *B23K 31/00* (2013.01); *B81C 1/00111* (2013.01); *C25D 5/02* (2013.01);
(Continued)

(58) Field of Classification Search
None
See application file for complete search history.

(56) References Cited

U.S. PATENT DOCUMENTS

| 7,105,428 B2 | 9/2006 | Pan et al. |
| 7,233,041 B2 | 6/2007 | Duan et al. |

(Continued)

FOREIGN PATENT DOCUMENTS

| CN | 100366528 C | 2/2008 |
| TW | 201223856 A | 6/2012 |

(Continued)

OTHER PUBLICATIONS

Mokari et al. "Selective Growth of Metal Tips onto Semiconductor Quantum Rods and Tetrapods", Science, vol. 304, Jun. 18, 2004, pp. 1787-1790.

(Continued)

*Primary Examiner* — Louis J Rufo
(74) *Attorney, Agent, or Firm* — Verrill Dana, LLP

(57) ABSTRACT

A variety of homogeneous or layered hybrid nanostructures are fabricated by electric field-directed assembly of nanoelements. The nanoelements and the fabricated nanostructures can be conducting, semi-conducting, or insulating, or any combination thereof. Factors for enhancing the assembly process are identified, including optimization of the electric field and combined dielectrophoretic and electrophoretic forces to drive assembly. The fabrication methods are rapid and scalable. The resulting nanostructures have electrical and optical properties that render them highly useful in nanoscale electronics, optics, and biosensors.

12 Claims, 30 Drawing Sheets

Related U.S. Application Data

(60) Provisional application No. 61/666,181, filed on Jun. 29, 2012.

(51) Int. Cl.
| | |
|---|---|
| C25D 13/22 | (2006.01) |
| C25D 5/02 | (2006.01) |
| C25D 13/02 | (2006.01) |
| C25D 3/48 | (2006.01) |
| B23K 31/00 | (2006.01) |
| B81C 1/00 | (2006.01) |
| H01L 21/768 | (2006.01) |
| H01L 21/288 | (2006.01) |

(52) U.S. Cl.
CPC ............. *C25D 13/02* (2013.01); *C25D 13/12* (2013.01); *C25D 13/22* (2013.01); *H01L 21/2885* (2013.01); *H01L 21/76879* (2013.01); *H01L 21/76885* (2013.01); *B81B 2203/0361* (2013.01); *B81B 2207/056* (2013.01); *B81C 2201/0187* (2013.01); *C25D 3/48* (2013.01); *H01L 2221/1094* (2013.01)

(56) References Cited

U.S. PATENT DOCUMENTS

| | | | |
|---|---|---|---|
| 7,851,338 | B2 | 12/2010 | Alivisatos et al. |
| 2004/0178076 | A1 | 9/2004 | Stonas et al. |
| 2005/0156157 | A1 | 7/2005 | Parsons et al. |
| 2006/0216740 | A1 | 9/2006 | Edman et al. |
| 2007/0089564 | A1 | 4/2007 | Tung |
| 2007/0096616 | A1 | 5/2007 | Han et al. |
| 2007/0116627 | A1 | 5/2007 | Collier et al. |
| 2007/0182015 | A1 | 8/2007 | Kornilovich et al. |
| 2008/0289965 | A1 | 11/2008 | Engheta et al. |
| 2009/0002004 | A1 | 1/2009 | Wang et al. |
| 2009/0087622 | A1 | 4/2009 | Busnaina et al. |
| 2009/0134033 | A1 | 5/2009 | Mead et al. |
| 2009/0242405 | A1 | 10/2009 | Mayer et al. |
| 2009/0278556 | A1 | 11/2009 | Man et al. |
| 2009/0294966 | A1 | 12/2009 | Liu et al. |
| 2010/0038794 | A1 | 2/2010 | Busnaina et al. |
| 2010/0129623 | A1 | 5/2010 | Johansson et al. |
| 2011/0024719 | A1 | 2/2011 | Sridhar et al. |
| 2011/0193054 | A1* | 8/2011 | Ryan ............ C25D 13/02 257/9 |
| 2011/0275005 | A1 | 11/2011 | Zhu et al. |
| 2011/0300400 | A1 | 12/2011 | Tomita et al. |
| 2011/0311791 | A1 | 12/2011 | Chien et al. |

FOREIGN PATENT DOCUMENTS

| | | | |
|---|---|---|---|
| WO | 2004034421 A3 | 4/2004 | |
| WO | 2007064530 A1 | 6/2007 | |
| WO | 2011041682 A1 | 4/2011 | |
| WO | WO-2011041682 A1 * | 4/2011 | ......... H01L 21/2885 |
| WO | 2011131979 A2 | 10/2011 | |
| WO | 2012075006 A2 | 6/2012 | |

OTHER PUBLICATIONS

Cetin et al. "Monopole Antenna Arrays for Optical Trapping, Spectroscopy, and Sensing", Applied Physics Letters, vol. 98, No. 11, Mar. 17, 2011, pp. 111110-1-111110-3.
Nicewarner-Pena et al. "Submicrometer Metallic Barcodes", Science, vol. 294, No. 5540, Oct. 5, 2001, pp. 137-141.
Aydin et al. "Broadband Polarization-Independent Resonant Light Absorption Using Ultrathin Plasmonic Super Absorbers", Nature Communications. 2:517, Nov. 1, 2011, pp. 1-7.
Barsotti et al, "Assembly of Metal Nanoparticles into Nanogaps", Small vol. 3, No. 3, 2007, pp. 488-499.
Baughman et al., "Carbon Nanotubes—the Route Toward Applications", Science, vol. 297, Aug. 2, 2002, pp. 787-792.
Bernard et al., "Controlled Formation of Metallic Nanowires via Au Nanoparticle ac Trapping", Nanotechnology 18, 235202, 2007, 14 pgs.
Bhatt and Velev, "Control and Modeling of the Dielectrophoretic Assembly of On-Chip Nanoparticle Wires", Langmuir, 20, 2004, pp. 467-476.
Bhatt et al., "An AC Electrokinetic Technique for Collection and Concentration of Particles and Cells on Patterned Electrodes", Langmuir, 21, 2005, pp. 6603-6612.
Boltasseva, "Plasmonic Components Fabrication via Nanoimprint", J. Opt. A: Pure Appl. Opt., 11, 114001, 2009, 11 pgs.
Calleja, "Fabrication of Gold Nanowires on Insulating Substrates by Field-Induced Mass Transport", Applied Physics Letters, vol. 79, No. 15, Oct. 8, 2001, pp. 2471-2473.
Cha et al., "Convective Assembly and Dry Transfer of Nanoparticles Using Hydrophobic/Hydrophilic Monolayer Templates", Langmuir, vol. 25, No. 19, 2009, pp. 11375-11382.
Chappert et al., "The Emergence of Spin Electronics in Data Storage", Nature Materials, vol. 6, Nov. 2007, pp. 813-823.
Chen et al., "Fabrication of Metal Nanowires by Atomic Force Microscopy Nanoscratching and Lift-Off Process", Nanotechnology, vol. 16, 2005, pp. 1112-1115.
Colodrero et al., "Nanoparticle-Based One-Dimensional Photonic Crystals", Langmuir, vol. 24, 2008, pp. 4430-4434.
Cui et al., "Integration of Colloidal Nanocrystals into Lithographically Patterned Devices", Nano Letters, vol. 4, No. 6, 2004, pp. 1093-1098.
Daniel and Astruc, "Gold Nanoparticles: Assembly, Supramolecular Chemistry, Quantum-Size-Related Properties, and Applications toward Biology, Catalysis, and Nanotechnology", Chem. Rev., vol. 104, 2004, pp. 293-346.
Erb et al., "Magnetic Assembly of Colloidal Superstructures with Multipole Symmetry", Nature, vol. 457, Feb. 2009, pp. 999-1002.
Fan et al., "Three-Dimensional Nanopillar-Anay Photovoltaics on Low-Cost and Flexible Substrates", Nature Materials vol. 8, Aug. 2009, pp. 648-653.
Gierhart et al., "Frequency Dependence of Gold Nanoparticle Superassembly by Dielectrophoresis", Langmuir, vol. 23, 2007, pp. 12450-12456.
Gierhart et al., "Nanopore with Transverse Nanoelectrodes for Electrical Characterization and Sequencing of DNA", Sens Actuators B Chem., 132:2, Jun. 16, 2008, pp. 593-600.
Hermanson et al., "Dielectrophoretic Assembly of Electrically Functional Microwires from Nanoparticle Suspensions", Science, vol. 294, Nov. 2, 2001, pp. 1082-1086.
Huang et al., "Gold Nanorods: From Synthesis and Properties to Biological and Biomedical Applications", Advanced Materials, vol. 21, 2009, 31 pgs.
Kabashin et al., "Plasmonic Nanorod Metamaterials for Biosensing", Nature Materials, vol. 8, Nov. 2009, pp. 867-871.
Khademhosseinieh et al., "Lensfree Sensing on a Microfluidic Chip Using Plasmonic Nanoapertures", Applied Physics Letters, 97, 221107, 2010, 3 pgs.
Khanduja et al., "Three Dimensional Controlled Assembly of Gold Nanoparticles Using a Micromachined Platform", Applied Physics Letters, vol. 90, 083105, 2007, 3 pgs.
Ko et al., "Nanoforest of Hydrothermally grown Hierarchical ZnO Nanowires for a High Efficiency Dye-Sensitized Solar Cell", Nano Letters, vol. 11, 2011, pp. 666-671.
Kraus et al., "Nanoparticle Printing with Single-Particle Resolution", Nature Nanotechnology, vol. 2, Sep. 2007, pp. 570-576.
Lee, "Gas Sensors Using Hierarchical and Hollow Oxide Nanostructures: Overview", Sensors and Actuators B, 140, 2009, pp. 319-336.
Lee et al., "Three-Dimensional Assembly of Nanoparticles from Charged Aerosols", Nano Letters, 11, 2011, pp. 119-124.
Liberman et al., "A Nanoparticle Convective Directed Assembly Process for the Fabrication of Periodic Surface Enhanced Raman Spectroscopy Substrates", Advanced Materials, 22, 2010, pp. 4298-4302.

(56) References Cited

OTHER PUBLICATIONS

Liu and Lu, "A colorimetric Lead Biosensor Using DNAzyme-Directed Assembly of Gold Nanoparticles", J. Am. Chem. Soc., vol. 125, 2003, pp. 6642-6643.
Lu et al., "Plasmonic Nanolaser Using Epitaxially Grown Silver Film", Science, vol. 337, Jul. 27, 2012, pp. 450-453.
Lu and Lieber, "Nanoelectronics from the Bottom Up", Nature Materials, vol. 6, Nov. 2007, pp. 841-850.
Maier et al., Local Detection of Electromagnetic Energy Transport Below the Diffraction Limit in Metal Nanoparticle Plasmon Waveguides, Nature Materials, vol. 2, Apr. 2003, pp. 229-232.
Maury et al., "Directed Assembly of Nanoparticles onto Polymer-Imprinted or Chemically Patterned Templates Fabricated by Nanoimprint Lithography", Advanced Materials, vol. 17, 2005, pp. 2718-2723.
Min et al., "The Role of Interparticle and External Forces in Nanoparticle Assembly", Nature Materials, vol. 7, Jul. 2008, pp. 527-538.
Morgan and Green, AC Electrokinetics: colloids and nanoparticles, Research Studies Press Ltd., Baldock, Hertfordshire, England, 2003, Chapter 10, 27 pgs.
Murray et al., "Synthesis and Characterization of Monodisperse Nanocrystals and Close-Packed Nanocrystal Assemblies", Annu. Rev. Mater. Sci., vol. 30, 2000, pp. 545-610.
Naeemi and Meindl, "Design and Performance Modeling for Single-Walled Carbon Nanotubes as Local, Semiglobal, and Global Interconnects in Gigascale Integrated Systems", IEEE Transactions on Electron Devices, vol. 54, No. 1, Jan. 2007, pp. 26-37.
Nieuwoudt and Massoud, "Optimizing the Design of Tunable Spiral Inductors for On-Chip Wireless Applications", Nanotechnol. IEEE Trans., 5, 2006, 5 pgs.
Nihei et al., "Low-Resistance Multi-Walled Carbon Nanotube Vias with Parallel Channel Conduction of Inner Shells", Proc. IEEE Int. Interconnect Tech. Conf., Piscataway, 2005, pp. 234-236.
Park and Kim, "Seedless Copper Electrodeposition onto Tungsten Diffusion Barrier", Journal of the Electrochemical Society, 157 (12), 2010, pp. D609-D613.
Muzykov et al., "Study of Leakage Current and Breakdown Issues in 4H—SiC Unterminated Schottky Diodes", Solid State Electronics, 53, 2009, pp. 14-17 (listed as "Reid et al." in application).
Salem et al., "Multifunctional Nanorods for Gene Delivery", Nature Materials, vol. 2, Oct. 2003, pp. 668-671.
Tang et al., "Spontaneous Organization of Single CdTe Nanoparticles into Luminescent Nanowires", Science, vol. 297, Jul. 12, 2002, pp. 237-240.
Tsong et al., "Effects of an Electric Field in Atomic Manipulations", Physical Review B, vol. 44, No. 24, Dec. 15, 1991, pp. 13703-13710.
Vajtai et al., "Building and Testing Organized Architectures of Carbon Nanotubes", IEEE Transactions on Nanotechnology, vol. 2, No. 4, Dec. 2003, pp. 355-361.
Velev and Bhatt, "On-Chip Micromanipulation and Assembly of Colloidal Particles by Electric Fields", Soft Matter, 2, 2006, pp. 738-750.

Wadell et al., "Optical Absorption Engineering in Stacked Plasmonic Au—SiO2—Pd Nanoantennas", Nano Letters, 12, 2012, pp. 4784-4790.
Wu et al., "Single-Crystal Metallic Nanowires and Metal/Semiconductor Nanowire Heterostructures", Nature, vol. 430, Jul. 1, 2004, pp. 61-65.
Xia et al., "One-Dimensional Nanostructures: Synthesis, Characterization, and Applications", Advanced Materials, vol. 15, No. 5, Mar. 4, 2003, pp. 353-389.
Xiong et al., "Directed Assembly of Gold Nanoparticle Nanowires and Networks for Nanodevices", Applied Physics Letters, 91, 063101, 2007, 3 pgs.
Xiong et al., "Large Scale Directed Assembly of Nanoparticles using Nanotrench Templates", Applied Physics Letters, vol. 89, 193108, 2006, 3 pgs.
Yan et al., "Engineered SERS Substrates with Multiscale Signal Enhancement: Nanoparticle Cluster Arrays", Amer. Chem. Soc (ACS) Nano, vol. 3, No. 5, 2009, pp. 1190-1202.
Yanik et al., "An Optofluidic-Nanoplasmonic Biosensor for Direct Detection of Live Viruses from Biological Media", Nano Letters, 10 (12), Dec. 8, 2010, pp. 4962-4969.
Yilmaz et al., "Large-Scale Nanorods Nanomanufacturing by Electric-Field-Directed Assembly for Nanoscale Device Applications", IEEE Transactions on Nanotechnology, vol. 9, No. 5, Sep. 2010, pp. 653-658.
Zayats et al., "Probing Photoelectrochemical Processes in Au—CdS Nanoparticle Arrays by Surface Plasmon Resonance: Application for the Detection of Acetylcholine Esterase Inhibitors", J. Am. Chem. Soc., vol. 125, No. 51, 2003, pp. 16006-16014.
Y, Li, et al., "Synthesis and growth mechanism of oriented amorphous SiO2 nanowires", Materials Science in Semiconductor Processing, (2012), vol. 15, pp. 428-431.
M. Li, et al., "Synthesis of Au—CdS Core-Shell Hetero-Nanorods with Efficient-Plasmon Interactions", Advanced Functional Materials, (2011), vol. 21, pp. 1788-1794.
Savas, et al., "Properties of large-area nanomagnet arrays with 100 nm period made by interferometric lithography", Apr. 1999, J. App. Phys., vol. 85, pp. 6160-6162.
Song, et al., "Ag—SiO2 Core-Shell Nanorod Arrays: Morphological, Optical, SERS, and Wetting Properties", November 1011, Langmuir, vol. 28, pp. 1488-1495.
Yang, et al., "Incorporation of Gold Nanorods and Their Enhancement of Fluorescence in Mesostructured Silica Thin Films", Nov. 2008, J. Phys. Chem. C., vol. 112, pp. 18895-18903.
Kong, et al., "Single-Walled Carbon Nanotube Gold Nanohybrids: Application in Highly Effective Transparent and Conductive Films". May 2007, J. Phys. Chem. C, vol. 111, pp. 8377-8382.
Im, H., et al., "Vertically Oriented Sub-10-mm Planmonic Nanogap Arrays", May 2010, Nano Left, vol. 10. pp. 2231-2236.
Hwang, I.C., et al., "Controlling metal nanotoppings on the tip of silicide nanostructures", Nanotechnology, (2009), vol. 20, 7 pgs.

* cited by examiner

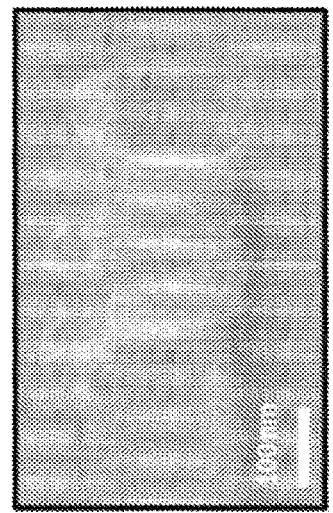
FIG. 2A
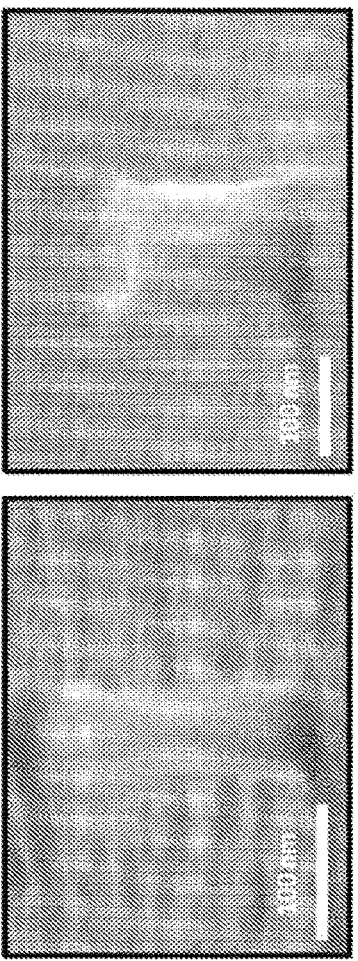
FIG. 2B
FIG. 2C
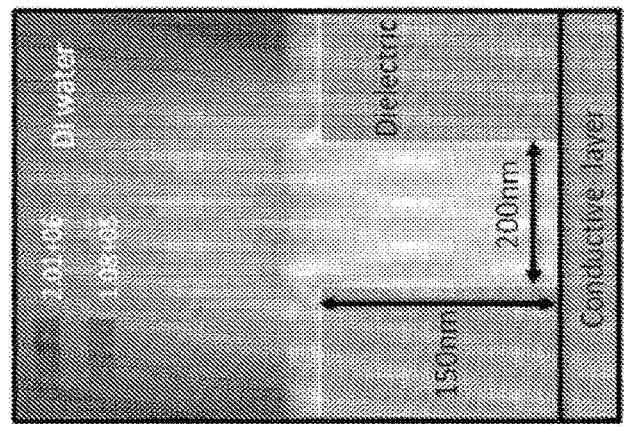
FIG. 2D
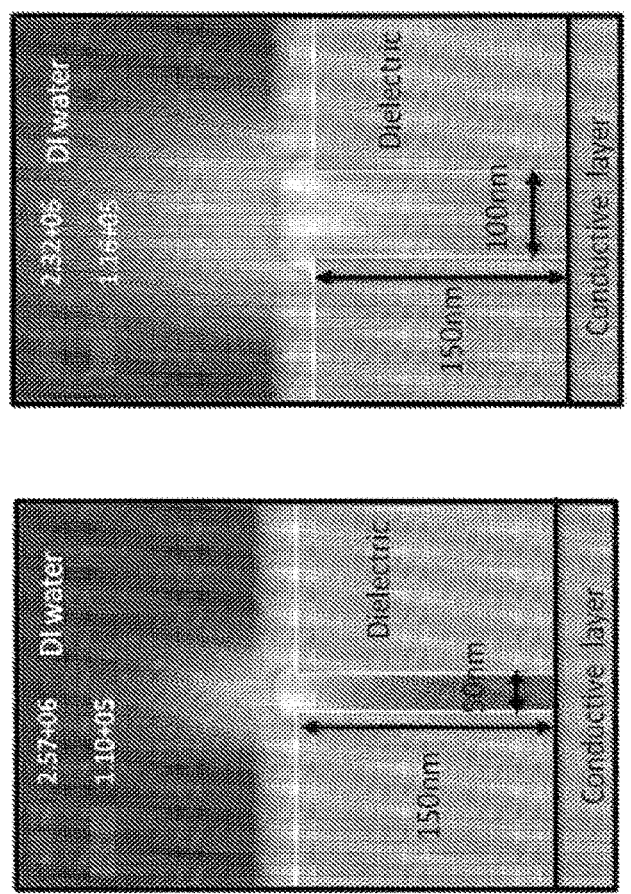
FIG. 2E
FIG. 2F

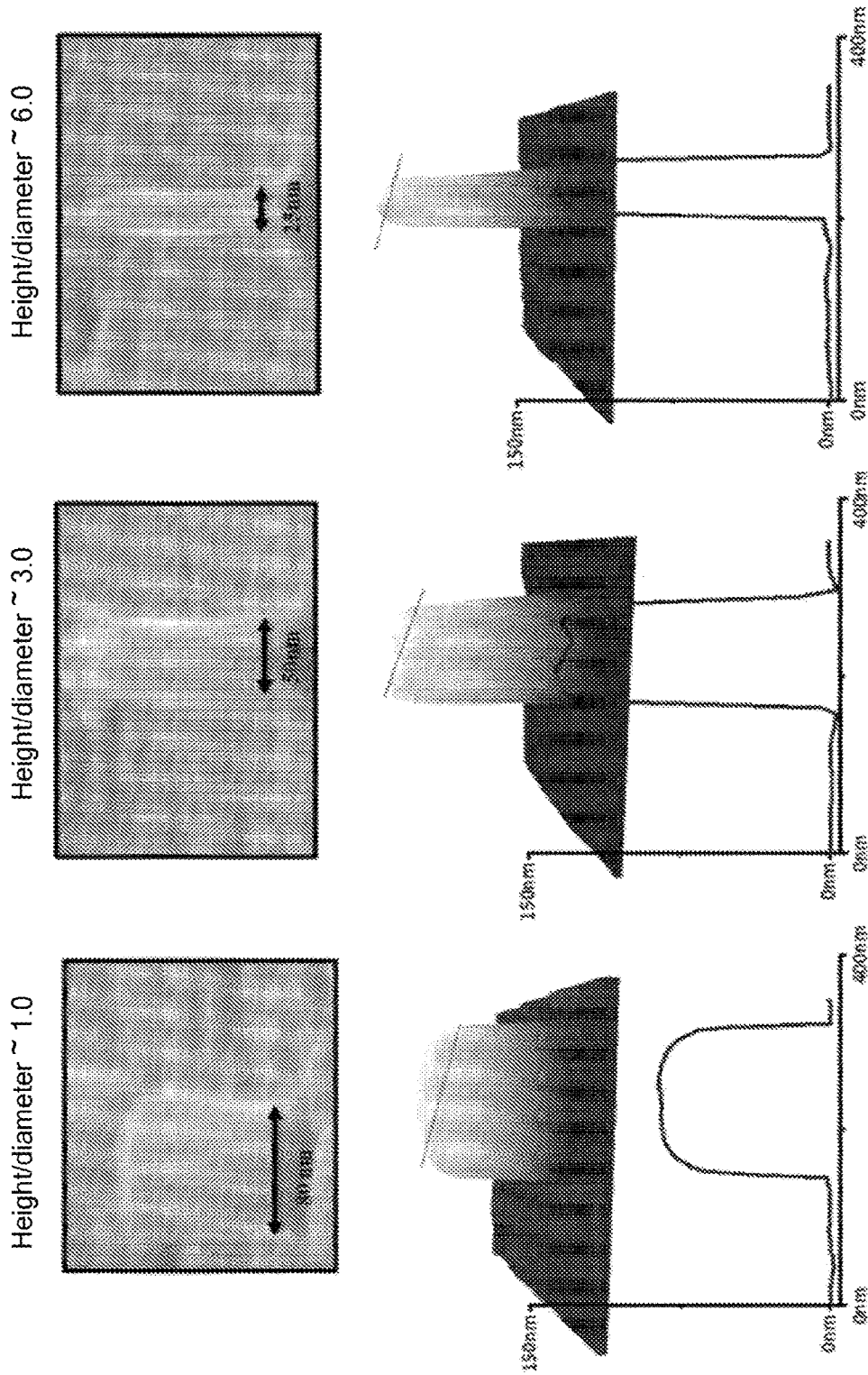

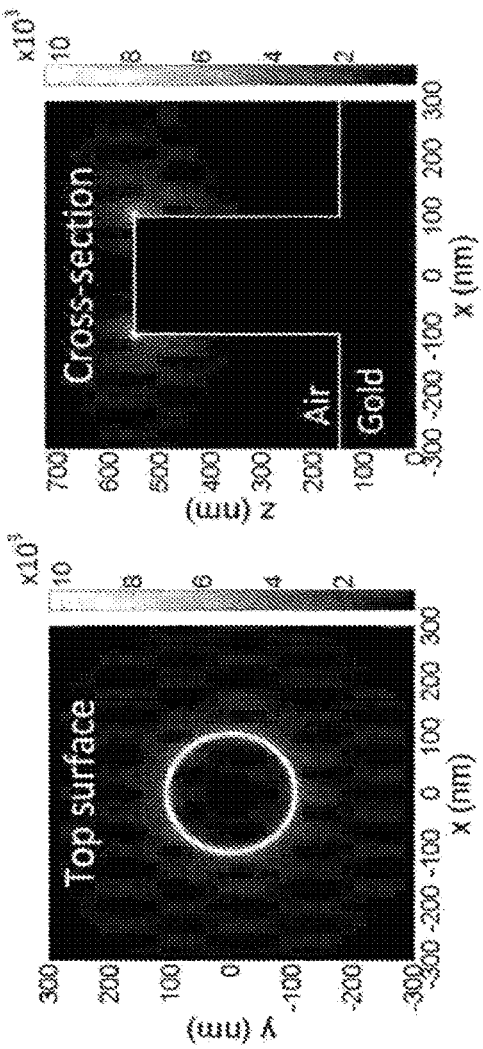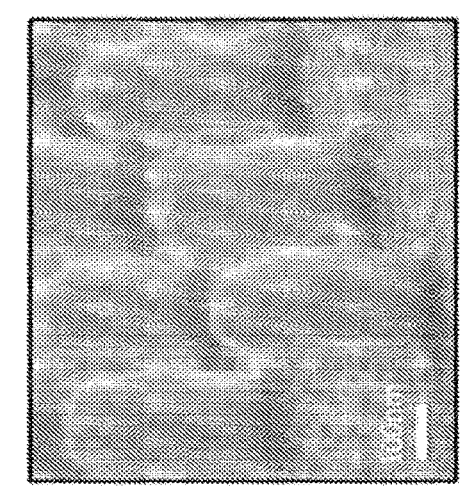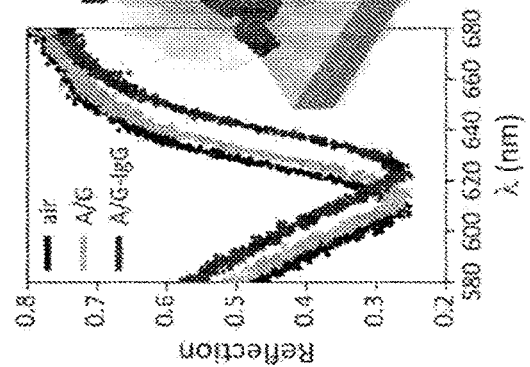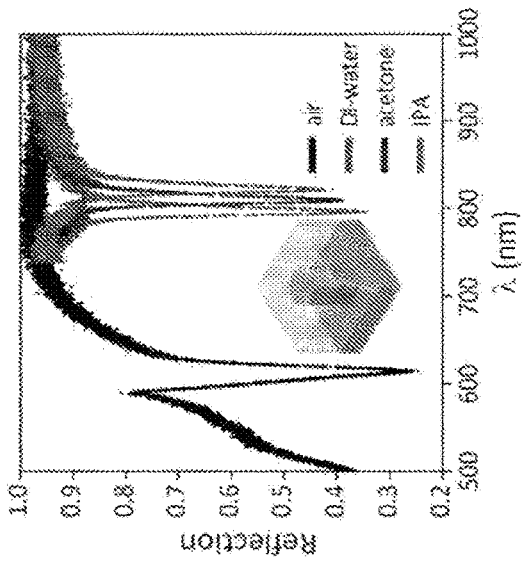
FIG. 5A  FIG. 5B  FIG. 5C  FIG. 5D  FIG. 5E

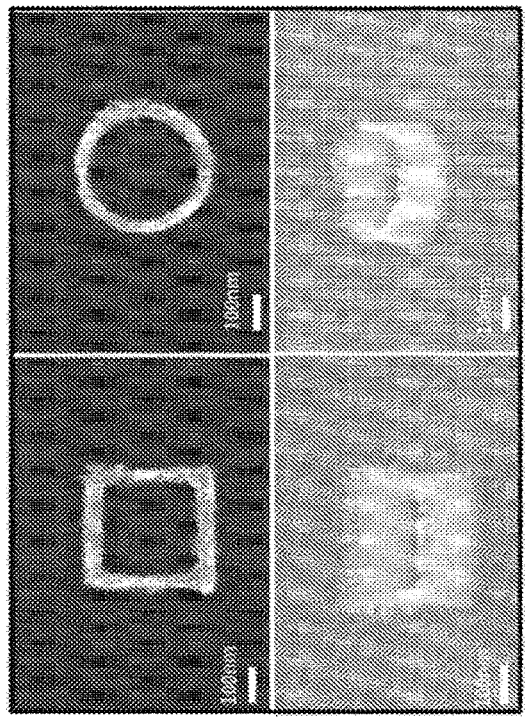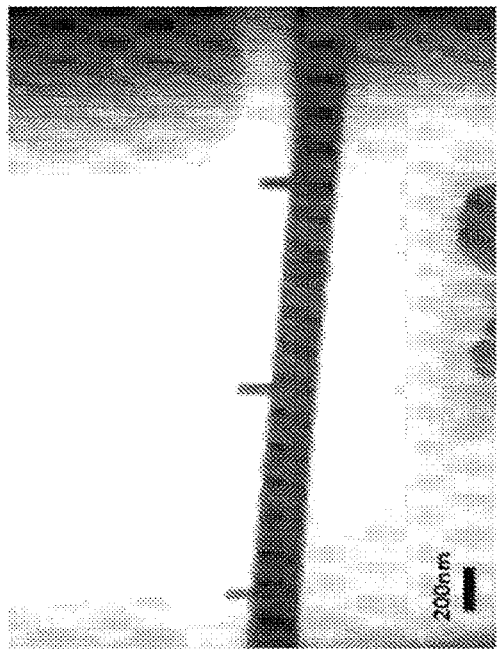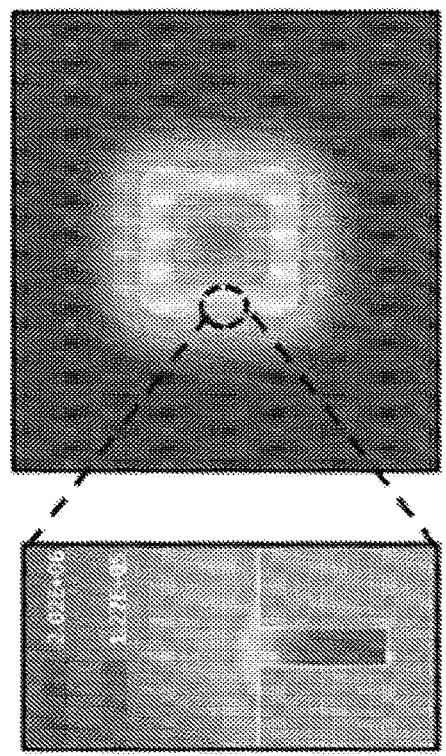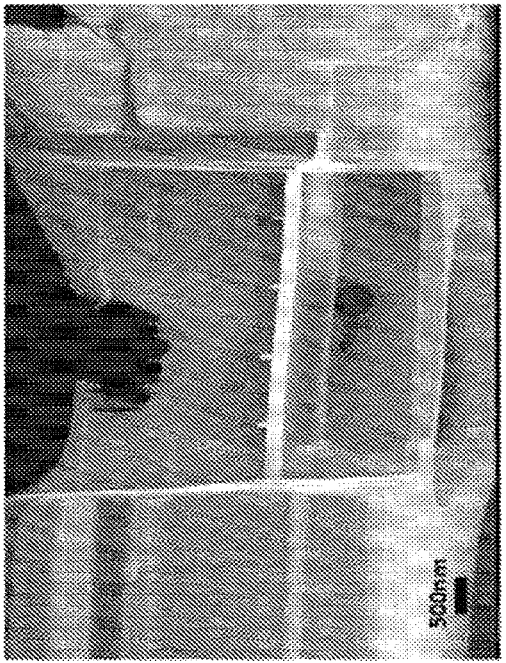
FIG. 15A
FIG. 15B
FIG. 16A
FIG. 16B

Nanoparticle based 3-D structures

THREE-DIMENSIONAL CRYSTALLINE, HOMOGENEOUS, AND HYBRID NANOSTRUCTURES FABRICATED BY ELECTRIC FIELD DIRECTED ASSEMBLY OF NANOELEMENTS

CROSS REFERENCE TO RELATED APPLICATIONS

This application is a divisional application of US National Phase application Ser. No. 14/410,961, filed Dec. 23, 2014, which claims priority of PCT/US2013/048948, filed Jul. 1, 2013 which claims the benefit of provisional application No. 61/666,181 filed Jun. 29, 2012, all of which are hereby incorporated herein by their entirety.

STATEMENT REGARDING FEDERALLY SPONSORED RESEARCH OR DEVELOPMENT

The invention was developed with financial support from Grant No. 0832785 from the National Science Foundation. The U.S. Government has certain rights in the invention.

BACKGROUND

The precise assembly of nanoscale materials in a desired location and orientation on surfaces makes it possible to fabricate various types of novel structures and devices (Baughman et al., *Science*, vol. 297, pp. 787-792, 2002; Daniel and Astruc *Chem. Rev.*, vol. 104, pp. 293-346, 2004; Huang et al., *Adv. Mater.*, vol. 21, pp. 4880-4910, 2009). Nanoparticles are model nanoscale building blocks due to their zero-dimensional geometry and unique size-dependent properties (Murray et al., *Annu. Rev. Mater. Sci.*, vol. 30, pp. 545-610, 2000). For example, functionalized gold nanoparticles can be used to fabricate sensitive biosensors (Liu and Lu, *J Amer. Chem. Soc.*, vol. 125, pp. 6642-6643, 2003). Closely packed metallic nanoparticle arrays show significant electromagnetic field enhancement (Yan et al., *Amer. Chem. Soc, (ACS) Nano*, vol. 3, pp. 1190-1202, 2009), and silica nanoparticles in predefined arrays enable novel optical devices (Colodrero et al., *Langmuir*, vol. 24, pp. 44304434, 2008). Bottom-up nanoparticle-directed assembly processes can be used to fabricate these nanoscale structures. For example, 1-D organization of individual metallic nanoparticles has been used to fabricate 1-D metal nanowires (Bhatt, *Langmuir*, vol. 20, pp. 467476, 2004). These structures show unique electrical and optical properties (Hermanson et al., *Science*, vol. 294, pp. 1082-1085, 2001; Maier et al., *Nat. Mater.*, vol. 2, pp. 229-232, 2003), and provide solutions for the technological and fundamental challenges faced by the conventional top-down fabrication processes in the sub-100 nm regime ((Lu and Lieber, *Nat. Mater.*, vol. 6, pp. 841-850, 2007).

Techniques have been developed to integrate nanoparticles directly onto surfaces for various applications (Cui et al., *Nano Lett.*, vol. 4, pp. 1093-1098, 2004; Cha et al., *Langmuir*, vol. 25, pp. 1 137 5-1 1382, 2009; Maury et al., *Adv. Mater.*, vol. 17, pp. 2718-2723, 2005; Xiong et al., *Appl. Phys. Lett.*, vol. 89, pp. 193108-1-193108-3, 2006), and dielectrophoresis (DEP) (Pohl, H. A. Dielectrophoresis. Cambridge, Mass.: Cambridge Univ. Press, 1978) has been used to manipulate nanoparticles onto electronic devices. Nanoscale interconnects have been fabricated using interparticle chain formation (Bhatt and Velev, *Langmuir*, vol. 20, pp. 467476, 2004). Electrical characterization of produced in-plane (2-D) (Colodrero et al., *Langmuir*, vol. 24, pp. 44304434, 2008) and intraplane (3-D) (Khanduja et al., *Appl. Phys. Lett.*, vol. 90, pp. 0831 05-1-0831 05-3, 2007) interconnects has been achieved. In these assembly processes, the two electrodes required for applying an electric field are usually on the same substrate or very close to each other (order of microns), making the fabrication techniques unsuitable for specific applications such as interconnects in complementary metal-oxide-semiconductor (CMOS) based devices (*International Technology Roadmap For Semiconductors* 2007 Edition Interconnecf. ITRS, 2007, Available: http://www.itrs.net/Links/2007 ITRS/Home 2007 .hhm) and various types of electromagnetic-field-enhancement sensors).

A recent study demonstrates the fabrication of gold nanorods in a porous alumina template using an AC electric field between two electrodes (Lee et al., *Sens. Actuators B*, vol. 136, pp. 320-325, 2009). However, the process provided no control over the length of the nanorods, impeding the potential use of the rods in sensors and CMOS interconnect applications.

Carbon nanotubes are considered as a potential candidate material for interconnect applications in gigascale systems (Naeemi et al., 2007, *Electron. Devices IEEE Trans.* 54: 26-37; Nihei et al., 2005, *Proc. IEEE Int. Interconnect Tech. Conf.*, pp. 234-36. Piscataway: IEEE; Vajtai et al., 2003, *Nanotechnol. IEEE Trans.* 2:355-61; Nieuwoudt and Massoud, 2006, *Nanotechnol. IEEE Trans.* 5:758-65) due to their resistance to electromigration and larger mean free path compared to that of metals. For vertical and lateral interconnects researchers have used high temperature chemical vapor deposition methods to grow carbon nanotubes on pre-patterned substrates. However, these high temperature processes are not compatible with CMOS technology (Maury et al., *Adv. Mater.*, vol. 17, pp. 2718-2723, 2005; Xiong et al., *Appl. Phys. Lett.*, vol. 89, pp. 193108-1-193108-3, 2006). For lateral interconnects researchers have used post-growth assembly techniques such as dielectrophoresis in which only an AC field or an electrical field gradient is used. For local vertical interconnects, the methods that have been carried out are not highly scalable.

Previously available directed assembly techniques have not demonstrated the ability to make solid homogeneous or hybrid crystalline nanostructures with nanoscale precision, and also do not enable assembly of larger diameter (e.g., 200 nm or above) nanostructures with nanoscale precision, or the assembly of nonconducting nanoparticles. Thus, there remains a need to develop methods for rapid and precise assembly and fusion of nanoparticles for producing homogenous and hybrid crystalline 3-D nanostructures using externally applied electric field.

SUMMARY OF THE INVENTION

Methods for fabricating nanostructures by electric field directed assembly of nanoelements, and nanostructures fabricated by nanoelement assembly are provided herein.

As used herein a "nanostructure" refers to a structured material object having one or more outside dimensions, or all of its outside dimensions in the range from 1-999 nm, or less than 500 nm, or less than 400 nm, or less than 300 nm. As used herein, a "nanopillar" is an approximately cylindrical nanostructure. The "diameter" of a nanostructure refers generally to the maximum width of a the structure in cross-section, even if the cross-section is not circular.

An embodiment of the invention is a method of fabricating a hybrid nanostructure by electric field directed assembly of nanoelements. The method includes the steps of: (a)

providing a nanosubstrate including a base layer, a conductive layer deposited onto the base layer, and an insulating layer deposited onto the conductive layer, the insulating layer comprising a via, the via forming a void in the insulating layer and defining a pathway through the insulating layer that exposes the conductive layer; (b) contacting the nanosubstrate with an aqueous suspension of first nanoelements; (c) applying an electric field between the conducting layer and an electrode in the suspension for a period of time sufficient for migration of first nanoelements from the suspension into the via and their assembly in the via, wherein the electric field consists of the sum of a DC offset voltage and an AC voltage; and (d) repeating, after the assembly, the contacting and the applying steps, using an aqueous suspension of second nanoelements different from the first nanoelements, thereby obtaining a hybrid nanostructure.

In related embodiments, the first and second nanoelements differ in electrical conductivity. In other embodiments the first and/or second nanoelements are electrically conducting, semi-conducting, or insulating. For example, the first nanoelements are conducting and the second nanoelements are semi-conducting or insulating. Alternatively, the first nanoelements are semi-conducting and the second nanoelements are conducting or insulating. In another embodiment, the first nanoelements are insulating and the second nanoelements are conducting or semi-conducting.

In various related embodiments, the first and second nanoelements are conducting, and the first and second nanoelements are not the same. In other related embodiments, the first and second nanoelements are insulating, and the first and second nanoelements are not the same. In yet other related embodiments, the first and second nanoelements are semiconducting, and the first and second nanoelements are not the same.

A related embodiment is a nanoantenna comprising an array of hybrid nanostructures fabricated according to an above method of the invention. In related embodiments, the first and second nanoelements differ in electrical conductivity. In other related embodiments, the first and/or second nanoelements are electrically conducting, semi-conducting, or insulating. Related embodiments include those in which the first nanoelements are conducting and the second nanoelements are semi-conducting or insulating. According to other related embodiments, the first nanoelements are semi-conducting and the second nanoelements are conducting or insulating. In yet other related embodiments, the first nanoelements are insulating and the second nanoelements are conducting or semi-conducting. Related embodiments include nanoantenna such that: the first and second nanoelements are conducting, and the first and second nanoelements are not the same; or the first and second nanoelements are insulating, and the first and second nanoelements are not the same; or the first and second nanoelements are semiconducting, and the first and second nanoelements are not the same.

According to other embodiments, the electric field used to assemble either semi-conducting or insulating nanoelements is greater than the electric field used to assemble conducting nanoelements.

In related embodiments of the method, the applied electric field attains a magnitude of at least about 1.5 MV/m, or at least about 1.75 MV/m, or at least about 2 MV/m, or at least about 2.25 MV/m, or at least about 2.5 MV/m within the via. In other related embodiments, a higher dielectrophoretic force is applied on the second nanoelements than on the first nanoelements.

According to other related embodiments, a higher concentration is used for the second nanoelements than for the first nanoelements.

In various embodiments, the electric field produces a dielectrophoretic force that acts on the nanoelements, and a greater dielectrophoretic force is used to assemble either semi-conducting or insulating nanoelements than the dielectrophoretic force used to assembly conducting nanoelements.

In related embodiments, the nanosubstrate comprises a plurality of vias, and a plurality of hybrid nanostructures are formed.

According to an aspect of the invention the time for migration and assembly is adjusted to obtain a desired height or configuration of the nanostructure.

Related embodiments include nanostructure possessing geometry selected from the group consisting of nanopillars, nanoboxes and nanorings.

In various embodiments, the first and/or second nanoelements are selected from the group consisting of nanotubes, nanoparticles, and nanowires. For example, the first and/or second nanoelements are nanoparticles and the nanoparticles are selected from the group consisting of conducting, semiconducting and insulating nanoparticles. In related embodiments, the nanoelements are nanotubes and the nanotubes are selected from the group consisting of single-walled metallic nanotubes, single-walled carbon nanotubes, semiconducting single walled carbon nanotubes, and multi-walled carbon-nanotubes. In other embodiments the nanoparticles are insulating nanoparticles including a polymer. For example, the polymer is polystyrene latex (PSL), polystyrene (PS), poly(methyl methacrylate) PMMA, poly(lactic-co-glycolic acid) (PLGA), polycaprolactone (PCL), polyethylene glycol (PEG) and functionalized PEG lipids such as DSPE-PEG.

In related embodiments, the nanoparticles are semiconducting nanoparticles including silicon (Si), gallium arsenide (GaAs), zinc oxide (ZnO), cadmium selenide (CdSe), cadmium selenide-zinc sulfide (CdSe—ZnS), cadmium telluride (Cd—Te), cadmium sulfide (CdS), lead selenide (PbSe), lead telluride (PbTe), and lead sulfide (PbS).

According to another embodiment of the invention, the method further includes fusing the first and/or second nanoelements to form a solid mass by either heating the assembled nanoelements or by applying a large DC electric potential.

In related embodiments the AC voltage is about 12 volts peak to peak ($v_{pp}$). In other related embodiments the AC frequency is about 10-50 kilohertz. In yet other embodiments the DC offset voltage is about 2 volts and the steady-state current is about 50 µA.

Another embodiment of the invention is a method of fabricating a nanostructure having a diameter at least about 200 nm by electric field directed assembly of nanoparticles, the method including the steps of: providing a nanosubstrate including a base layer, a conductive layer deposited onto the base layer, and an insulating layer deposited onto the conductive layer, the insulating layer including a via having a diameter of at least about 200 nm, the via forming a void in the insulating layer and defining a pathway through the insulating layer that exposes the conductive layer; contacting the nanosubstrate with an aqueous suspension of the nanoparticles, such that the nanoparticles have a diameter of about 20-100 nm; applying an electric field between the conducting layer and an electrode in the suspension for a period of time sufficient for migration of nanoparticles from the suspension into the via and their assembly in the via, such that the electric field consists of the sum of a DC offset voltage and an AC voltage thereby producing an incomplete nanostructure; and fusing the assembled nanoparticles by heating the incomplete nanostructure by applying an external heat source or applying a DC voltage between the conducting layer and the electrode, thereby obtaining the nanostructure. In various embodiments the range of DC voltage used is about 5-30 V. For example, the DC voltage is about 30 V. For example, the temperature is about 250° C.

In related embodiments, the nanosubstrate includes a plurality of vias, and a plurality of nanostructures is formed.

In various embodiments, the nanoparticles are gold nanoparticles. In other related embodiments the AC voltage is about 12 $V_{pp}$, and the DC offset voltage is about 2V.

According to certain embodiments of the invention, the period of time for migration and assembly is adjusted to obtain a desired height or configuration of the nanostructure.

Related embodiments of the invention of a method of fabricating a nanostructure having a diameter at least about 200 nm by electric field directed assembly of nanoparticles include those in which the nanoparticles are conducting, semiconducting, or insulating nanoparticles. In other related embodiments the nanoparticles are insulating nanoparticles and the period of time for migration and assembly is in the range of about 30-180 seconds.

Embodiments of the invention includes a hybrid nanostructure having a first portion and a second portion, the first and second portions differing in electrical conductivity. In related embodiments, one of said first and second portions includes a conducting material and the other includes a semiconducting or insulating material. In related embodiments, the hybrid nanostructure is such that one of said first and second portions comprises a semiconducting material and the other comprises a conducting or insulating material. According to other embodiments, one of said first and second portions comprises an insulating material and the other comprises a conducting or semiconducting material. Further, the embodiments includes nanostructures having a geometry selected from the group consisting of a nanopillar, a nanoring, and a nanobox. In various embodiments of the invention the size of the nanostructure is at least about 200 nm.

Yet another embodiment of the invention is a nanostructure array, including a plurality of nanostructures arranged in an array. For example, each nanostructure has a geometry selected from the group consisting of a nanopillar, a nanoring, and a nanobox. For example, each nanostructure is a nanopillar comprising a conducting material. For example, the nanopillar includes gold and is polycrystalline. In related embodiments, the nanopillars further display an electrical resistivity equivalent to electroplated gold and supports plasmon resonance.

Embodiments of the invention includes a hybrid nanostructure comprising a plurality of nanoelements, produced by electric field directed assembly of the nanoelements including the steps of: providing a nanosubstrate including a base layer, a conductive layer deposited onto the base layer, and an insulating layer deposited onto the conductive layer, the insulating layer including a via, the via forming a void in the insulating layer and defining a pathway through the insulating layer that exposes the conductive layer; contacting the nanosubstrate with an aqueous suspension of first nanoelements; applying an electric field between the conducting layer and an electrode in the suspension for a period of time for migration and assembly of first nanoelements from the suspension into the via, such that the electric field consists of the sum of a DC offset voltage and an AC voltage; and repeating, after the assembly, the contacting and the applying steps, using an aqueous suspension of second nanoelements, thereby obtaining a hybrid nanostructure.

In related embodiments, the period of time for migration and assembly is adjusted to obtain a desired height or configuration of the nanostructure.

In various embodiments the nanostructure possesses a geometry selected from the group consisting of nanopillars, nanoboxes and nanorings.

According to related embodiments of the invention, the first and/or second nanoelements are selected from the group consisting of nanotubes, nanoparticles, and nanowires. For example, the nanoelements are nanoparticles, and the nanoparticles are selected from the group consisting of conducting, semiconducting and insulating nanoparticles. In related embodiments, the nanoelements are nanotubes and the nanotubes are selected from the group consisting of single-walled metallic nanotubes, single-walled carbon nanotubes, semiconducting single walled carbon nanotubes, and multi-walled carbon-nanotubes.

Yet another embodiment of the invention is a nanostructure having a cross-sectional size of at least about 200 nm, fabricated by electric field directed assembly of nanoparticles, comprising the steps of: providing a nanosubstrate including a base layer, a conductive layer deposited onto the base layer, and an insulating layer deposited onto the conductive layer, the insulating layer including a via having a cross-sectional size of at least about 200 nm, the via forming a void in the insulating layer and defining a pathway through the insulating layer that exposes the conductive layer; contacting the nanosubstrate with an aqueous suspension of the nanoparticles, such that the nanoparticles have a diameter of about 20-100 nm; applying an electric field between the conducting layer and an electrode in the suspension for a period of time sufficient for migration of nanoelements from the suspension into the via and for assembly in the via, such that the electric field consists of the sum of a DC offset voltage and an AC voltage, thereby producing an incomplete nanostructure; and fusing the assembled nanoparticles by heating the incomplete nanostructure using an external heat source or applying a DC voltage, thereby obtaining the nanostructure.

In related embodiments of the invention the nanosubstrate includes a plurality of vias, and a plurality of nanostructures are formed.

Embodiments of the invention includes a method of converting an incomplete nanostructure formed by electric field directed assembly of nanoelements into a complete nanostructure, the incomplete nanostructure including unfused nanoelements, the method including: heating the incomplete nanostructure; whereby the unfused nanoelements are fused to form the complete nanostructure. In related embodiments, the incomplete nanostructure is heated to about 250° C. In other related embodiments, the method further includes applying a DC voltage across the incomplete nanostructure. For example, the DC voltage is about 30V.

In another embodiment, the invention is a method of converting an incomplete nanostructure formed by electric field directed assembly of nanoelements into a complete nanostructure, the incomplete nanostructure comprising unfused nanoelements, the method including: applying a DC voltage across the incomplete nanostructure; whereby the unfused nanoelements are fused to form the complete nanostructure. For example, the DC voltage is about 30V. In related embodiments, the method further comprises heating the incomplete nanostructure. For example, the incomplete nanostructure is heated to about 250° C.

Another embodiment of the invention is a method of increasing the rate, extent, or completeness of formation of a nanostructure by electric field directed assembly of nanoelements, the method including a step selected from the group consisting of: increasing the electric field used for assembly; decreasing the frequency of an AC component of the electric field used for assembly; increasing a dielectrophoretic force acting on the nanoelements; increasing an electrophoretic force acting on the nanoelements; increasing a nanoelement concentration used for assembly; decreasing a dimension of a via into which the nanoelements are assembled; decreasing a density of vias into which the nanoelements are assembled; and increasing a dimension of the nanoelements.

Further, an embodiment of the invention is a method of fabricating a homogeneous electrically insulating nanostructure by electric field directed assembly of nanoelements, the method including the steps of: providing a nanosubstrate comprising a base layer, a conductive layer deposited onto the base layer, and an insulating layer deposited onto the conductive layer, the insulating layer comprising a via, the via forming a void in the insulating layer and defining a pathway through the insulating layer that exposes the conductive layer; contacting the nanosubstrate with an aqueous suspension of electrically insulating nanoelements; and applying an electric field between the conducting layer and an electrode in the suspension for a period of time sufficient for migration of the nanoelements from the suspension into the via and their assembly in the via, such that the electric field consists of the sum of a DC offset voltage and an AC voltage; thereby obtaining a homogeneous electrically insulating nanostructure. A related embodiment of the invention is a homogeneous electrically insulating nanostructure obtainable by the method.

In other related embodiments, the electrically insulating nanoelements includes an inorganic oxide or an organic polymer. According to yet other related embodiments, the electrically insulating nanoelements are selected from selected from silica, alumina, titania, polystyrene, polystyrene latex, poly(methyl methacrylate, poly(lactic-co-glycolic acid), polycaprolactone, polyethylene glycol (PEG), and functionalized PEG lipids.

BRIEF DESCRIPTION OF THE DRAWINGS

FIG. 1 panel A shows migration and assembly of nanoparticles from an aqueous suspension of NPs into vias located within a layer of patterned dielectric or insulator material deposited on a conducting surface. The conducting surface functions as an electrode. A counter electrode is placed at a distance of about 5 mm from the conducting surface and an electric field is applied between the two electrodes. FIG. 1 panel B shows nanopillars formed by fusion of Type A nanoparticles following their assembly in the vias. FIG. 1 panel C shows the Type A nanostructures after removal of the dielectric material that formed the vias. FIGS. 1D-E show production of hybrid nanostructures using sequential directed assembly of different types of NPs. In this process, nanopillars B are assembled from NP B and are layered above nanopillars A, assembled from NP A. FIG. 1 panel D shows an array of nanopillars A that have been overlayered with nanopillars B. FIG. 1 panel E shows an array of hybrid 3-D nanostructures obtained upon removal of the insulator layer, each nanostructure having nanopillar B layered over nanopillar A.

FIG. 2 panel A is a SEM micrograph of a complete nanopillar formed in a 50 nm wide via through assembly and fusion of 5 nm gold NPs under an electric field of 12 $V_{pp}$ AC voltage with a frequency of 50 kHz applied for 90 seconds. FIG. 2 panel B is a SEM micrograph of a complete nanopillar formed in a 100 nm wide via through assembly and fusion of 5 nm gold NPs under the same conditions of applied electric as in FIG. 2 panel A. FIG. 2 panel C is a SEM micrograph of an incomplete nanopillar formed in a 200 nm wide via through assembly and fusion of 5 nm gold NPs under the same conditions of applied electric field as in FIG. 2 panel A. FIG. 2 panel D is a cross-sectional view of a 50 nm wide via showing simulated static electric field contours. In FIG. 2 panels D-F, the darker regions within a via have greater electric field intensity, and bars in the upper left corner represent magnitude of electric field intensities. FIG. 2 panel E is a cross-sectional view of a 100 nm wide via showing simulated static electric field contours. The intensity of the electric field is lower compared to that in the 50 nm wide via shown in panel D. FIG. 2 panel F is a cross-sectional view of a 200 nm wide via showing simulated static electric field contours. The intensity of the electric field is much lower compared to that in the 50 nm wide via shown in panel D. FIG. 2 panel G presents a set of curves showing variation in the electric field intensity inside the center of a via having a defined diameter, as a function of the aspect ratio of the via. FIG. 2 panel H presents a set of curves showing variation in the electric field intensity inside a via, having the specified diameters, as a function of spacing between adjacent vias.

FIG. 3 panel A is a low magnification SEM micrograph of a gold nanopillar array. A close-up view of a region of the array is shown to the right. FIG. 3 panel B is a SEM micrograph (upper half) of a gold nanopillar with an aspect ratio of 1. The lower half is an AFM image of the nanopillar. FIG. 3 panel C is a SEM micrograph (upper half) of a gold nanopillar with an aspect ratio of 3. The lower half is an AFM image of the nanopillar. FIG. 3 panel D is a SEM micrograph (upper half) of a gold nanopillar with an aspect ratio of 6. The lower half is an AFM image of the nanopillar. FIG. 3 panel E is a SEM micrograph of a nanopillar made of copper. FIG. 3 panel F is a SEM micrograph of a nanopillar made of fluorescent polystyrene latex (PSL). FIG. 3 panel G is a SEM micrograph of a nanopillar made of fluorescent silica. FIG. 3 panel H is a SEM micrograph of a hybrid nanopillar made of gold layered over with fluorescent PSL. The inset shows a fluorescence image of an array of the hybrid nanopillars. FIG. 3 panel I is a SEM micrograph of a hybrid nanopillar made of gold layered over with fluorescent silica. The inset shows a fluorescence image of an array having the hybrid nanopillars. FIG. 3 panel J is a SEM micrograph of a hybrid nanopillar made of a gold surface layered over with a fluorescent PSL nanopillar layer, which is further layered over with a gold nanopillar layer. A fluorescence image of an array having these hybrid nanopillars is shown in the inset.

FIG. 3 panel K is a set of images which includes: a high-angle SEM image of a 3-D nanobox (lower left), a high-angle SEM image of a 3-D nanoring (lower right), a top-down SEM image of a nanobox (upper left), and a top-down SEM image of a nanoring (upper right).

FIG. 4 panel A is a bright field TEM micrograph (left) of a nanopillar made using electric field directed assembly of nanoparticles. An enlarged view is presented to the right. The inset shows a diffraction pattern of the pillar. FIG. 4 panel B is a high resolution TEM image that shows the existence of two grains within the 30 nm×30 nm area of a single nanopillar. Arrows indicate two different lattice directions, one corresponding to each grain. FIG. 4 panel C is a graph showing resistance measurements of ten nanopillars from two chips (I and II) fabricated by electric field directed assembly of nanoparticles, and that often nanopillars from two chips (I' and II') produced using electroplating. The inset to the right shows a high-angle SEM micrograph of gold nanopillars in the insulating layer (PMMA) during the electrical characterization. The panel in the upper right is a SEM image of a nanopillar array, and the inset shows a probe positioned near a nanopillar in the array.

FIG. 5 panels A-E are a SEM micrograph and graphs showing intensity enhancement of incident light by a nanopillar, refractive index sensitivity, and shifts in surface plasmonic resonance due to accumulation of biomass. FIG. 5 panel A is a SEM micrograph of a nanopillar fabricated using electrical field directed assembly. FIG. 5 panel B is a graph showing near-field intensity enhancement distribution of incident light calculated at the top surface of the nanopillar. The X and Y axes represent distances in perpendicular directions from the center of the top surface of the nanopillar. The intensity enhancement of incident light is proportional to the brightness of the field. FIG. 5 panel C is a graph showing near-field intensity enhancement distribution of incident light calculated through the cross section of the nanopillar. The X axis represents distance from the center of a cross sectional plane of the nanopillar. The Y axis represents distance from the base of the nanopillar. Zero represents the bottom of the gold nanopillar where the nanopillar meets the gold electrode. The intensity enhancement of incident light is proportional to the brightness of the field. FIG. 5 panel D is a graph showing variation in reflection (Y axis) as a function of wavelength (X axis). The plasmonic resonance shows a strong shift as the refractive index (n) of the bulk solution in the interface with the nanopillar is changed from air to deionized water (n=1.333), acetone (n=1.356), or isopropyl alcohol (n=1.377). FIG. 5 panel E shows the variation in reflection (Y axis) as a function of wavelength (X axis) in air versus in the presence of a monolayer of Protein A/G (A/G) or a bilayer of Protein A/G bound to immunoglobulin (A/G-IgG). A robust shift in plasmonic resonance was observed with accumulation of biomass on the sensor platform. The inset at right depicts antigen-antibody complexes bound to a nanopillar.

FIG. 6 panel A shows electric field magnitude contours near and far from three vias for an applied voltage of 12 $V_{pp}$. The field intensities were similar for the three vias (diameter of each via is 50 nm); scale: highest, 2.526×10$^6$ V/m; lowest, 1.095×10$^5$ V/m. FIG. 6 panel B shows contours of electric potential near a via surface; scale: highest, 8.417V; lowest, 8.001V. FIG. 6 panel C shows that electric field magnitude arises from the potential drop shown in panel B. Simulation time: 0.1 second.

FIG. 9 panel A shows the result of assembly at an applied voltage of 20 $V_{pp}$, and a frequency of 50 kHz. The arrows highlight some of the regions in the via array that featured particle agglomeration. Inset shows a high-angle SEM image of an assembly area indicating high assembly rate in the vias. FIG. 9 panel B shows the result of assembly at an applied voltage of 6 $V_{pp}$, and a frequency of 50 kHz. FIG. 9 panel C shows the result of assembly performed at a voltage of 12 $V_{pp}$, and a frequency of 100 kHz. FIG. 9 panel D shows the result of assembly performed at a voltage of 12 $V_{pp}$, and frequency of 10 kHz. Inset shows a higher-magnification SEM image of the assembly area after PMMA removal, revealing particle over-deposition on the gold surface.

FIG. 11 panel A shows nanopillar height of 30 nm with an assembly time of 15 seconds. FIG. 11 panel B shows nanopillar height of 85 nm with an assembly time of 45 seconds. FIG. 11 panel C shows nanopillar height of 110 nm with an assembly time of 60 seconds. FIG. 11 panels D shows a nanopillar with a mushroom-like flat-cap geometry that resulted when the assembly time was increased to 180 seconds using a via depth of 150 nm.

FIG. 12 panel A is a SEM micrograph (upper half) and a fluorescence image (lower half) of a homogeneous gold nanopillar. FIG. 12 panel B is a SEM micrograph (upper half) and a fluorescence image (lower half) a gold-fluorescent silica hybrid nanopillar. FIG. 12 panel C is a SEM micrograph (upper half) and a fluorescence image (lower half) a gold nanopillar. FIG. 12 panel D is a SEM micrograph (upper half) and a fluorescence image (lower half) a gold-fluorescent PSL hybrid nanopillar.

FIG. 15 panels A-B are diagrams and SEM images of square and circular patterned nanostructures manufactured using dielectrophoretic NP assembly. FIG. 15 panel A shows a top-down view of electric field simulations for a square pattern. Inset shows a cross-sectional view from a portion of the pattern. The darker regions within the via has greater electric field intensity. Bars in the upper left corner represent magnitude of electric field intensities. FIG. 15 panel B shows top-down (upper) and tilted (lower) SEM images of 3-D square (left) and circular patterns (right).

FIG. 16 shows SEM micrographs of a lamella obtained after performing focused ion beam (FIB) thinning under low (panel A) and high (panel B) magnification.

FIG. 18 panel A shows a nanostructure obtained by electroplating for 90 seconds. FIG. 18 panel B shows an array of nanostructures obtained by electroplating for 240 seconds. Button mushroom-like geometries (inset) were obtained after the electroplating process. FIG. 18 panel C shows a nanostructure obtained by directed assembly for 90 seconds. FIG. 18 panel D shows an array of nanostructures obtained by directed assembly for 240 seconds. Flat-cap mushroom-like geometry (inset) was obtained after the directed assembly process.

FIG. 19 panel A shows a high-angle SEM image of gold nanopillars in PMMA vias. The assembly time was adjusted so that the nanopillar was slightly higher than the PMMA layer to achieve good contact with the nanopillars, as shown in the inset. FIG. 19 panel B is a SEM image of a tungsten probe gently contacting a 150-nm-thick PMMA surface. A second probe was positioned on the gold layer beneath the PMMA. FIG. 19 panel C is a graph of electrical current plotted as a function of the applied voltage for the probe/PMMA configuration in panel B. The PMMA broke down when the applied voltage was greater than 1.5 V (which is much larger than the voltages applied during electrical characterization of the nanopillars).

FIG. 20 panel A shows a configuration in which the probe was placed near a 50-nm-diameter NP-based gold nanopillar, but without making contact. No current is observed in this configuration. FIG. 20 panel B shows a configuration in which the probe barely touched the top section of the pillar surface. The resistance was high because of the loose contact between the nanopillar and the probe. FIG. 20 panel C shows the same configuration shown in panel B after the electrical characteristics had been measured. The probe has penetrated into the gold nanopillar, resulting in low resistance. The values of resistance were three orders of magnitude lower than those observed in the configuration in panel B. FIG. 20 panel D shows a NP-based nanopillar fabricated using longer assembly time. The resistance value was further improved by increasing the contact area. FIG. 20 panel E shows an electroplated nanopillar fabricated using a longer assembly time. The probe was positioned on the pillar as shown in the inset. The resistance was very low because of the large contact area.

FIG. 23 panel A shows simulation of electric field magnitude inside a 200 nm diameter, 400 nm high via. Bars in the upper left corner represent magnitude of electric field intensities. FIG. 23 panel B shows a tilted SEM image of a nanopillar array after 50 nm gold NPs were assembled in the vias having the geometry shown in panel A. FIG. 23 panel C shows a tilted SEM image of the nanopillar array of panel B following heat treatment.

DETAILED DESCRIPTION OF THE INVENTION

Directed assembly of nanoparticles (NPs) has been shown to be a promising approach for building functional nanomaterials and nanostructures for many applications such as electronics (Hermanson, Science 294, 1082-1086, 2001), optics (Liberman et al., Adv. Mater. 22, 4298-4302, 2010), and biosensing (Zayats et al., J. Am. Chem. Soc. 125, 16006, 2003). NPs have been assembled into one, two and three-dimensional nanostructures by utilizing electric (Hermanson, et al., Science 294, 1082-1086 2001; Zayats et al., J. Am. Chem. Soc. 125, 16006, 2003; Lee et al., Sens. Actuators B 136, 320-325 (2009); Lee et al. Nano Lett. 11, 119-124, 2011) magnetic (Erb et al., Nature 457, 999-1002, 2009) and fluidic forces (Tobias et al., Nature Nanotech. 2, 570-576, 2007).

However, fabrication of solid, crystalline, homogenous or hybrid, well-defined nanostructures with nanoscale precision has not been demonstrated, largely due to the difficulties in controlling the assembly and fusion of different types of NPs. NPs can differ in composition, functionalization, size and the media in which NPs are suspended. Depending on these parameters, the forces driving the assembly and fusion of NPs differ from particle to particle affecting the nanostructure formation process. For example, larger size NPs have a higher melting temperature compared to smaller ones (Ko et al., Nano Lett. 7, 1869-1877, 2007) making them difficult to fuse into solid structures. Similarly, depending on the properties of the suspension medium, NPs possess different surface conditions such as surface charge and energy, which can also affect forces driving the NPs to surfaces (Min et al., Nature Mater. 7, 527-538, 2008).

Described herein are methods to precisely control the assembly of various types of nanoparticles for the fabrication of 3-D homogenous nanostructures made of metals, oxides, polymers, or hybrid nanostructures made of combinations of different materials, each in a separate layer, including metal-polymer, metal-oxide and metal-polymer-metal heterostructures. The methods involve directing colloidal NPs, using dielectrophoresis (DEP) (Pohl, H. A., Dielectrophoresis, Cambridge Univ. Press, Cambridge, Mass. 1978) toward a template. The template is a substrate having a conductive film coated by any insulator ir dielectric material, e.g. poly(methyl methacrylate) (PMMA), that features nanoscale patterns such as vias, as shown in FIG. 1A, from which the insulator has been removed.

Figure 6A:
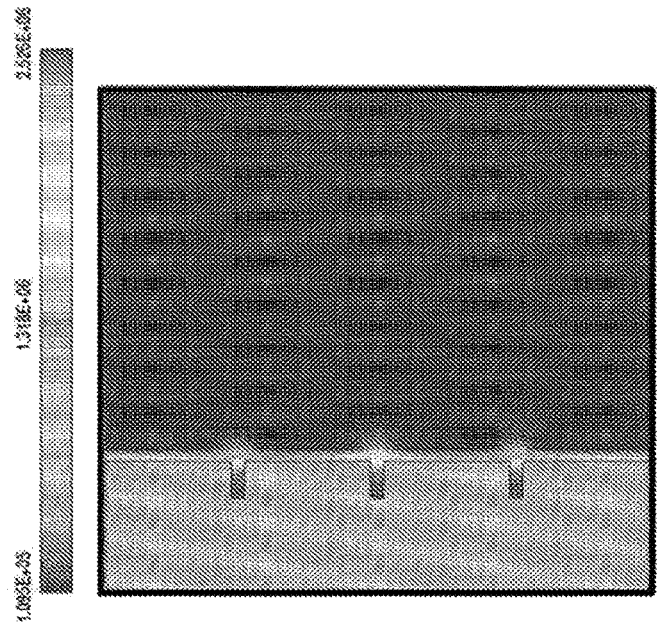
FIG. 6 panels A-C are diagrams showing contours of electric field magnitude and potential.

To perform the methods an AC electric field is applied between the template, through the exposed conductive film in the vias, and a counter electrode positioned opposite the template (e.g., approximately 5 mm removed from the template) in the NP suspension. The electric field creates a dielectrophoretic force on the NPs, causing them to move toward the vias where the magnitude of electric field is highest (FIG. 6). The NPs under the effect of the dielectrophoretic force, also experience a pearl-chaining force (Xiong et al., *Appl. Phys. Lett.* 91, 063101-1-063101-3, 2007), which plays an important role in assembling the NPs into the vias. The chaining force arises from the interaction of induced dipoles between the NPs. This interaction plays an important role in attaching NPs to the already-assembled NPs at the bottom surface of the vias. In addition, due to the ionic atmosphere, the surface charge of the particles creates an additional induced dipole moment (Bhatt et al., *Langmuir* 20, 467-476 2004). As the NPs assemble, the applied electric field induces their fusion, forming arrays of solid nanostructures (FIG. 1B). The fusion of small colloidal chains into structures such as wires under an applied electric field arises from localized joule heating, induced by the applied AC voltage at the NP junctions (Barsotti et al, *Small* 3, 488-499 (2007).

Figure 1:
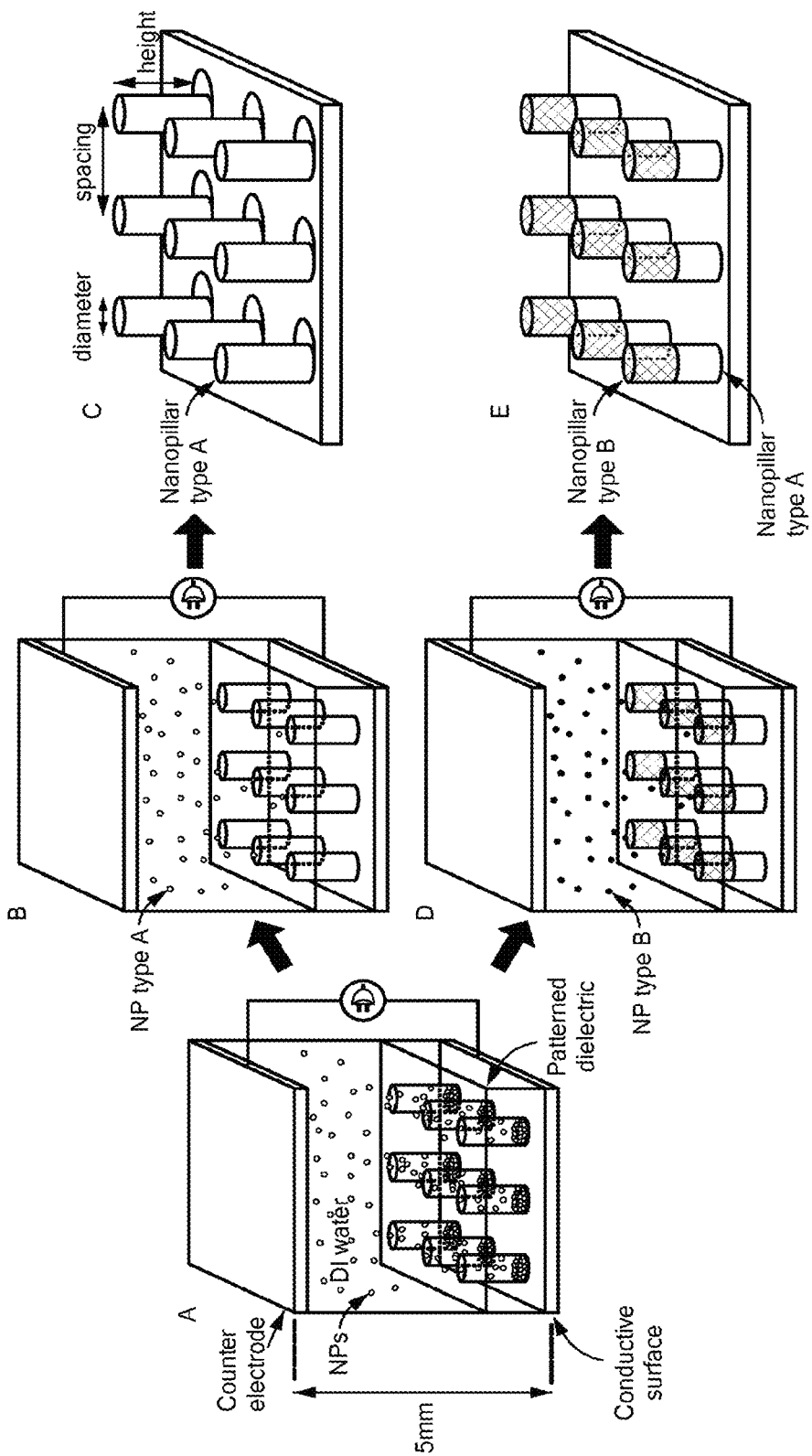
FIG. 1 panels A-E are schematic diagrams showing fabrication of 3-D nanostructures through electric field directed assembly of nanoparticles (NPs).

Following the assembly and fusion process, the insulator layer can be removed (optionally, as needed), to obtain free-standing 3-D nanostructures such as nanopillars, as shown in FIG. 1C. Sequential assembly of different types of NPs can also be carried out so as to fabricate hybrid nanopillars (FIGS. 1, A, D and E).

FIG. 2 shows the effect of template geometry (i.e., geometry of the vias) on nanopillar formation. Assembly and fusion of 5 nm gold NPs in 50 nm and 100 nm diameter vias under the application of 12 $V_{pp}$ AC voltage with a frequency of 50 kHz for 90 seconds is demonstrated in FIGS. 2 A and B. Since gold NPs (or any conductive NPs, such as metallic NPs) are highly polarizable, they are attracted toward the vias, where the electric field intensity is high, under a DEP force of $4.51 \times 10^{-14}$ N.

The DEP force acting on a spherical particle is given by, $$F_{DEP} = 2\pi \varepsilon_m Re[K(w)] a^3 \nabla |E|^2 \quad (1)$$

where $\varepsilon_m$ is the dielectric constant of medium, a is the particle radius, w is the angular frequency, and $\nabla |E|^2$ is the gradient of the electric field (Jones, T. B., Electromechanics of Particles, Cambridge University Press, Cambridge, 1995). The direction of the force is determined by the sign of the real part of the Clausius-Mossotti factor, $Re[K(w)]$, shown in equation $$Re[K(w)] = \frac{\varepsilon_p - \varepsilon_m}{\varepsilon_p + 2\varepsilon_m} + \frac{3(\varepsilon_m \sigma_p - \varepsilon_p \sigma_m)}{\tau_{MW}(\sigma_p + 2\sigma_m)^2(1 + \omega^2 \tau_{MW}^2)}, \quad (2)$$

where $\varepsilon_p$ is the dielectric constant of the particle and $\sigma_p$ and $\sigma_m$ is are the conductivities of the particle and medium, respectively. $\tau_{MW}$ is the Maxwell-Wagner charge relaxation time that indicates decay of a dipolar distribution of charge on the surface of a spherical particle, and is given by $$\tau_{MW} = \frac{\varepsilon_p + 2\varepsilon_m}{\sigma_p + 2\sigma_m} \quad (3)$$

If the sign of the real part of the Clausius-Mossotti factor is greater than zero, i.e., $Re[K(w)]>0$, the process is called "positive dielectrophoresis" and the particles are attracted to regions where the field intensity is high. For $Re[K(w)]<0$, the process is called "negative dielectrophoresis" and the particles are repelled from regions of high field intensity. Metallic and other highly polarizable particles yield $Re[K(w)] \leq 1$ in aqueous suspensions; these particles are always attracted toward regions of high field intensity (Gierhart et al. *Langmuir*, 23, 12450-12456, 2007; Velev and Bhatt, *Soft Matter*, 2, 738-750, 2006).

To estimate the value of $\nabla |E_{rms}|^2$ near the via, values of $E_{rms}$ obtained from the simulation were used. Considering only the change in electric field in the y direction, shown in FIG. 1C, the magnitude of the electric field close to the via surface is given approximately by $$\vec{E}_{rms} \approx \frac{V_{rms}}{y} \hat{y} \quad (4)$$

where $V_{rms}$ is the rms AC voltage applied to the vias, y is the distance from the bottom of the via, and $\hat{y}$ is a unit vector pointing in the y direction. From this equation the gradient of the electric field squared is calculated, $$\vec{\nabla}(E_{rms}^2) \approx -2\left(\frac{V_{rms}^2}{y^3}\right) \hat{y} \quad (5)$$

Combining equations (4) and (5), $$\vec{\nabla}(E_{rms}^2) \approx -2\left(\frac{\vec{E}_{rms}^2}{y}\right) \hat{y} \quad (6)$$

From the simulation results, the electric field magnitude was calculated to be $2.50 \times 10^6$ V/m at p1 (80 nm from the bottom of the via) and $2.35 \times 10^5$ V/m at p2 (230 nm from the bottom of the via). The electric field gradient between these points was estimated by ($\vec{\nabla}(E_{rms}^2)$) to be $8.26 \times 10^{19}$ V²/m³ using equation (6). By using this value in equation (1), the DEP force on the 5 nm gold nanoparticles (NPs) was calculated to be to be $4.51 \times 10^{-14}$ N.

Figure 6B:
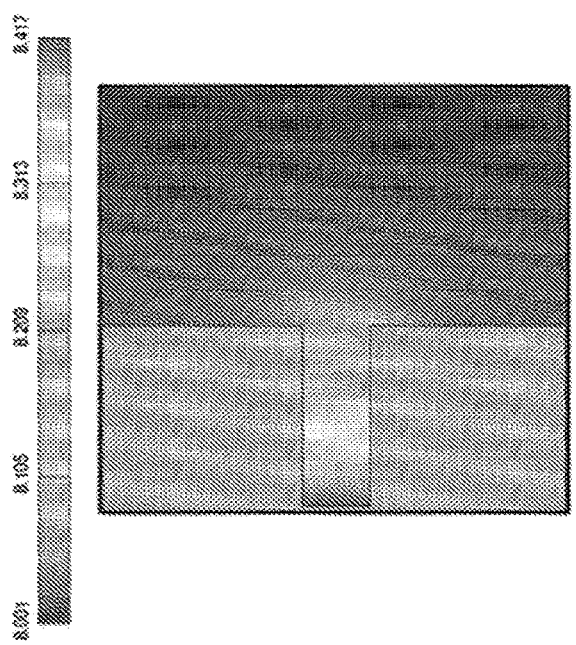
Figure 6C:
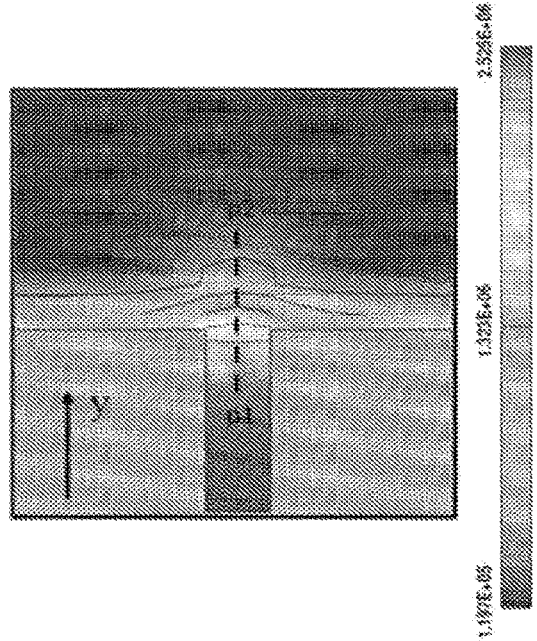

Electric field simulations of 50 nm diameter and 150 nm deep vias under an applied voltage of 12 $V_{pp}$ are shown in FIG. 6. The rms voltages used were obtained by multiplying the applied voltage by a factor of 0.707. FIG. 6B shows contours of electric potential inside the via surface; scale: red, 8.417V; dark blue, 8.001V. The applied rms potential of 8.48 V decreased sharply from the bottom of the via towards the top. The electric field magnitude resulting from the rms potential is shown in FIG. 6B. The electric field decreased rapidly (p1=$2.50 \times 10^6$ V/m; p2=$2.35 \times 10^5$ V/m) within 100 nm above the top of the via, resulting in a high field gradient in this region.

The actual DEP force experienced by a particle is expected to be greater than the calculated value because the surface charge of the particle would also interact with the AC electric field, creating an additional induced dipole moment in the ionic atmosphere (Bhatt and Velev, *Langmuir* 20, 467-476, 2004). The motion of the particles during the dielectrophoresis is also influenced by the Brownian force and other forces such as drag force and electrohydrodynamic forces (Bhatt et al., *Langmuir* 21, 6603-6612, 2005). The fusion of small single colloidal chains into wires under an applied electric field has been reported previously Bernard et al., *Nanotechnology* 18, 235202, 2007); it arises mainly from localized joule heating, induced by the applied AC voltage, at the NP junctions (Tsong et al., *Phys. Rev B* 44, 13703-13710, 1991).

It was observed that filling vias with larger diameter (about 200 nm or more), using the same experimental conditions as used to fill sub 100 nm diameter vias, resulted in partial NP assembly in the via and an incomplete nanopillar formation (FIG. 2C). The incomplete nanopillar formation is a function of the electric field intensity and distribution in the vias. To fully understand this phenomenon a 3-D computational fluid dynamics simulation was used to model the electric field near the via. The simulation results showed that the intensity of the electric field in the vias varies depending on geometrical parameters such as diameter, aspect ratio and spacing. FIGS. 2D-F display static electric field contours in a via for three different via geometries. For a given height and via spacing the decrease in electric field intensity in larger-diameter vias results from a geometry-induced edge effect, namely the amplification of the electric field at the edges of the via (Bhatt et al., *Langmuir* 21, 6603-6612, 2005). The electric field strength of any via is always higher at the edges compared to the center. This effect is not noticeable in small vias because the edges are closer to each other. However, as a via's diameter becomes sufficiently large, the center part of the via is not affected by the amplification of the electric field at the edges, leading to lower field intensities at the center. Therefore, NPs are exposed to smaller DEP forces at the center of a large via, resulting in only partial particle assembly and incomplete fusion at the edges.

The DEP force near large diameter vias was estimated by simulation of electric field magnitudes. For a via that is 200 nm in diameter and 150 nm deep, the electric field magnitude was calculated to be to be $1.56 \times 10^6$ V/m at p1 (80 nm from the bottom of the via) and $5.58 \times 10^5$ V/m at p2 (230 nm from the bottom of the via). Under these conditions, using equation (1), the DEP force on 5 nm gold NPs was calculated to be $1.54 \times 10^{-14}$ N.

Simulation results further showed that the magnitude of the DEP force on a 5 nm particle that is at a distance of 80 nm from the bottom of a 200 nm diameter via is $1.54 \times 10^{-14}$ N, which is 3 times smaller than the force at the same distance from a 50 nm diameter via. The simulation results thus explain the incomplete nanopillar assembly shown in FIG. 2C.

Figure 2G:
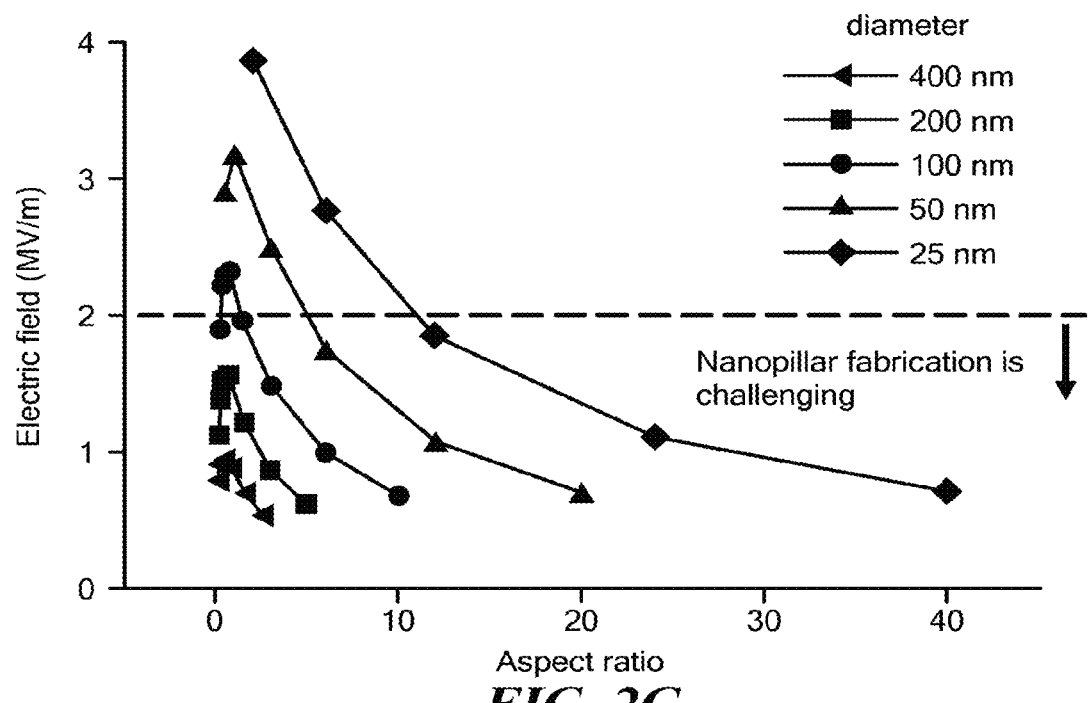
FIG. 2 shows SEM micrographs, diagrams of cross-sectional views of vias, and graphs correlating simulated electric field intensity inside a via with aspect ratio of the via or with the spacing between the via and adjacent vias to show the effect of via geometry and inter via spacing on nanostructure formation. The vias in panels A-F have a height of 150 nm.
Figure 2H:
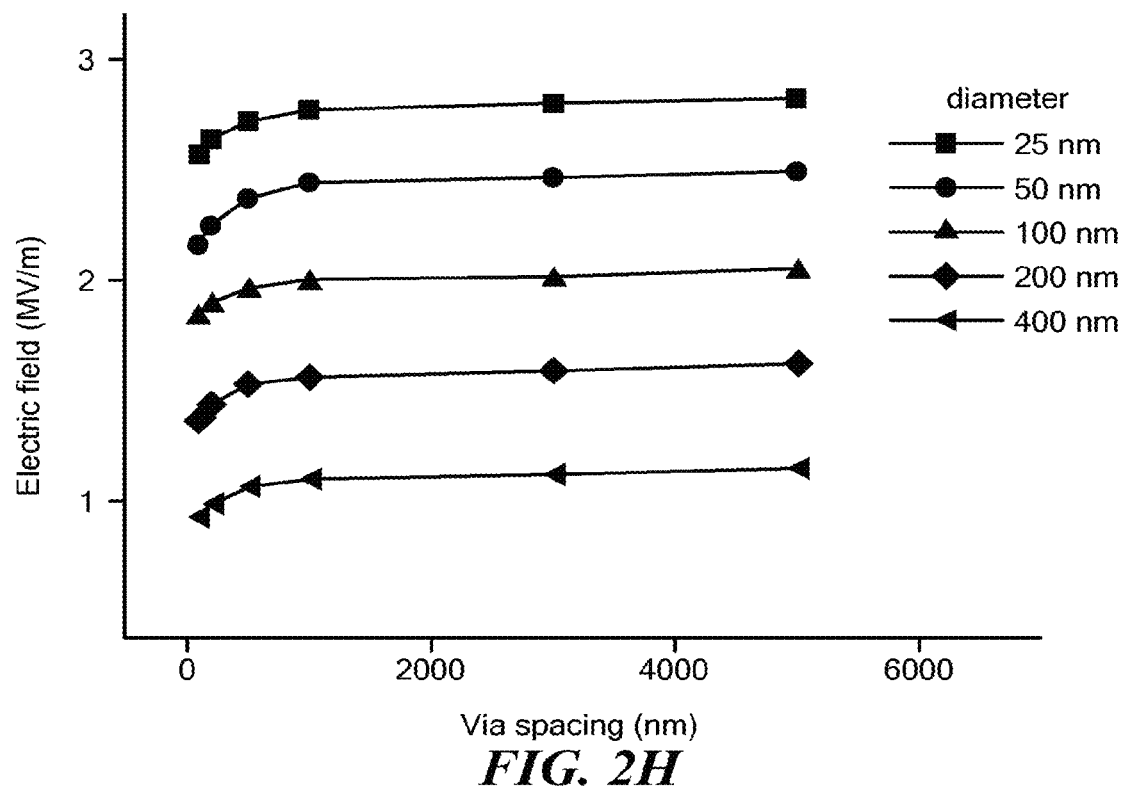
Figure 7C:
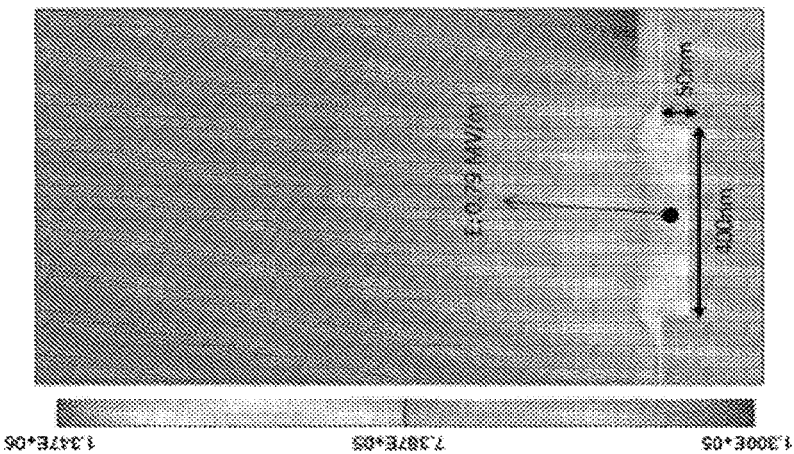
FIG. 7 panels A-C show electric field simulations in 400 nm diameter vias of different aspect ratios under an applied voltage of 12 $V_{pp}$. The aspect ratios of the vias were 0.75 (panel A), 0.375 (panel B), and 0.125 (panel C). The scale on the left of each panel correlates with the magnitude of electric field intensity inside the via shown.
Figure 7B:
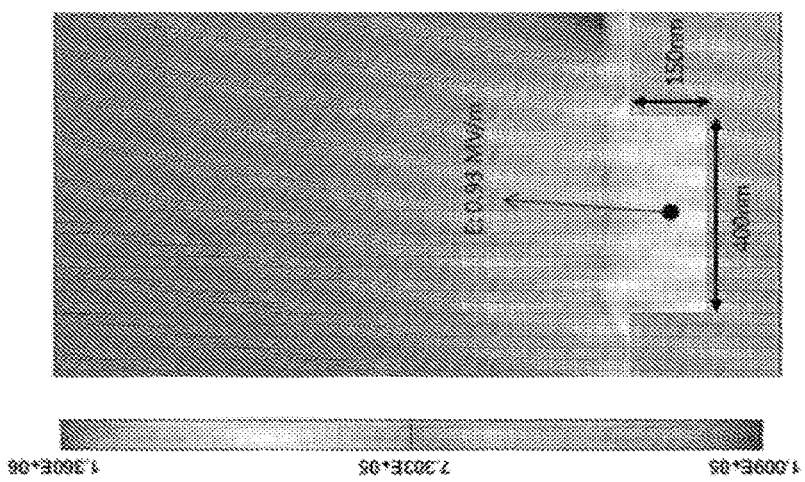
Figure 7A:
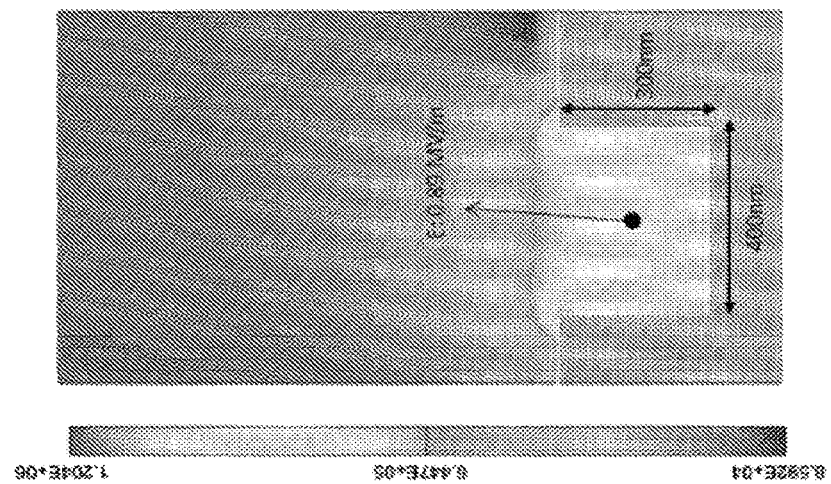

The electric field intensity changes also as a function of the aspect ratio of the vias (FIG. 2G). Diameter remaining constant, as the aspect ratio of a via is decreased, the electric field intensity increases because the via has a thinner insulator since it is shorter. However, at very small aspect ratios, the edge of the insulating layer (PMMA) did not produce sufficient electric fields relative to those of the higher aspect ratio structures because the insulating layer was very thin. As a result, the geometrical edge effect was less significant, resulting in a low electric field in the via (FIG. 7). The simulations also revealed that, for a given diameter and the same number of vias, the electric field intensity in the closely spaced vias was small compared to ones separated by a larger distance. (FIG. 2H). When the vias were close to each other, the effect of the insulating layer between them was very small. Therefore, the electric field contours near these vias interacted with each other, resembling the case of a single large via with a low electric field (FIG. 8). For via spacing greater than 500 nm, the electric field interactions between the vias decreased significantly, resulting in higher field intensities in the vias.

Figure 8B:
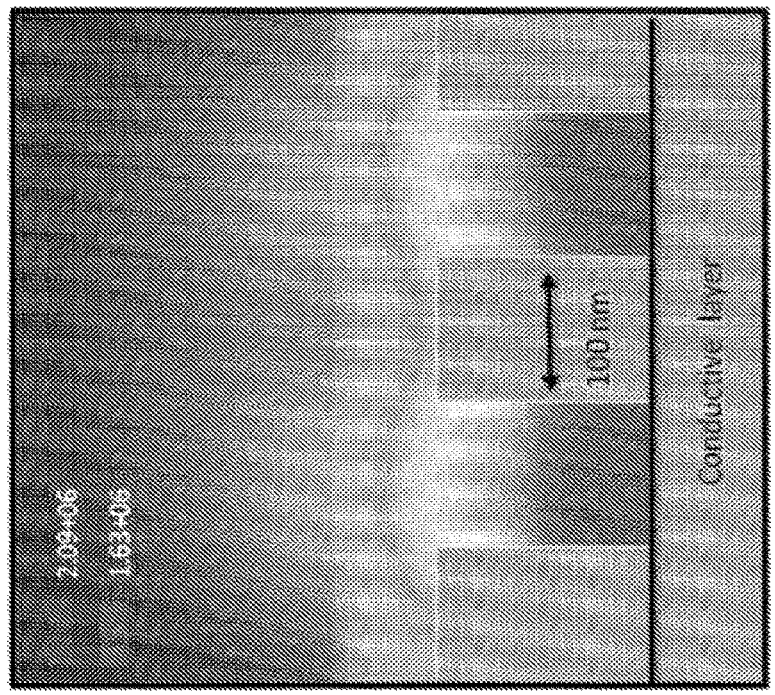
FIG. 8 panels A-D show electric field simulations showing electric field magnitude as function of spacing in vias that are 100 nm in diameter and 150 nm high. In each panel the bars at the upper left corner represent the electric field intensity magnitudes. The darker regions within a via have greater electric field intensity. The vias are separated by 50 nm (panel A), 100 nm (panel B), 200 nm (panel C) and 500 nm (panel D).
Figure 8A:
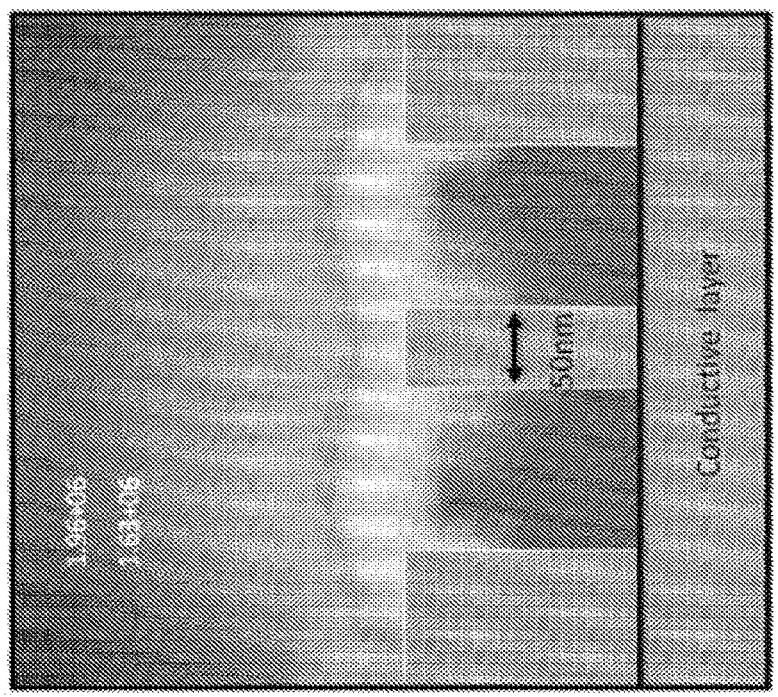
Figure 8D:
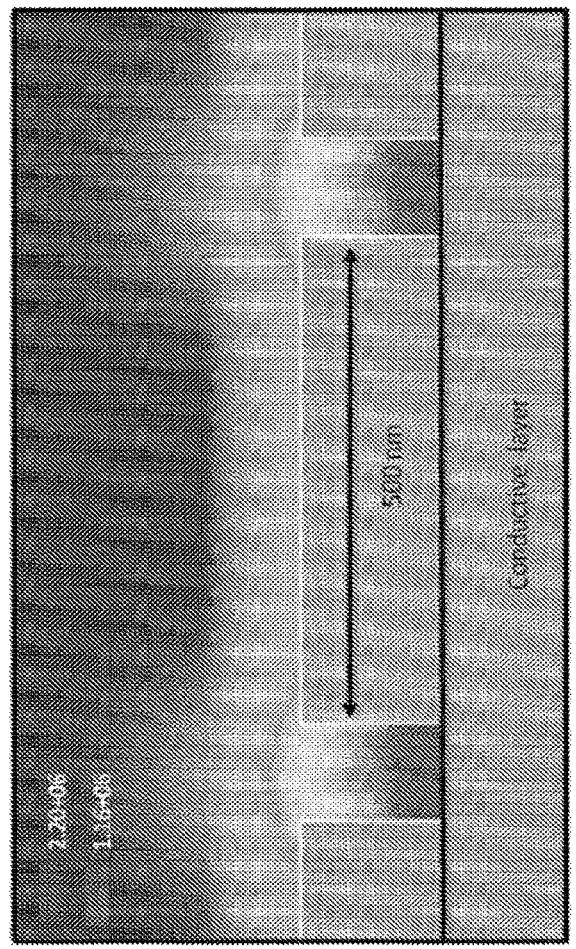
Figure 8C:
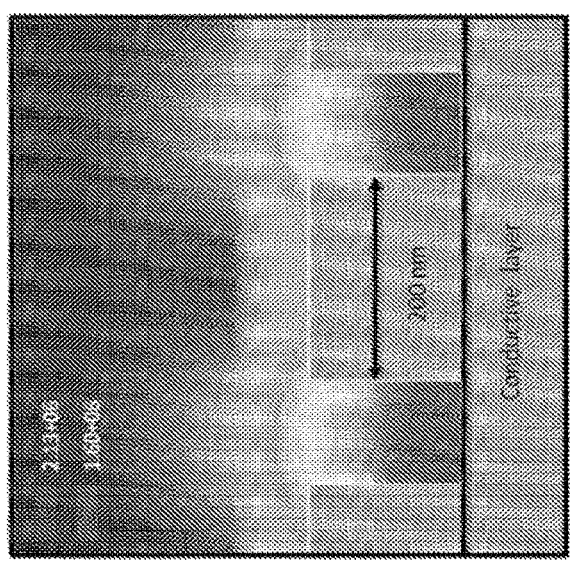

The electric field intensity is influenced also by the aspect ratio and the spacing between the vias. As shown in FIG. 7, the electric field in the middle of a via initially increased upon decreasing the aspect ratio. Further reduction of the aspect ratio resulted, however, in a decreased electric field, due to reduced geometrical edge effect. In addition, the electric field in the middle of a via increases upon increasing the spacing between the vias. As shown in FIG. 8A, when the dielectric between the vias is thin, the electric field contours interact with each other, resulting in low electric field in the vias. For the case of 50 nm spacing, the magnitude of the electric field in a 200 nm diameter via was close in magnitude to that in a 200 nm diameter via that is separated from other vias by a distance of 500 nm or more.

Figure 9A:
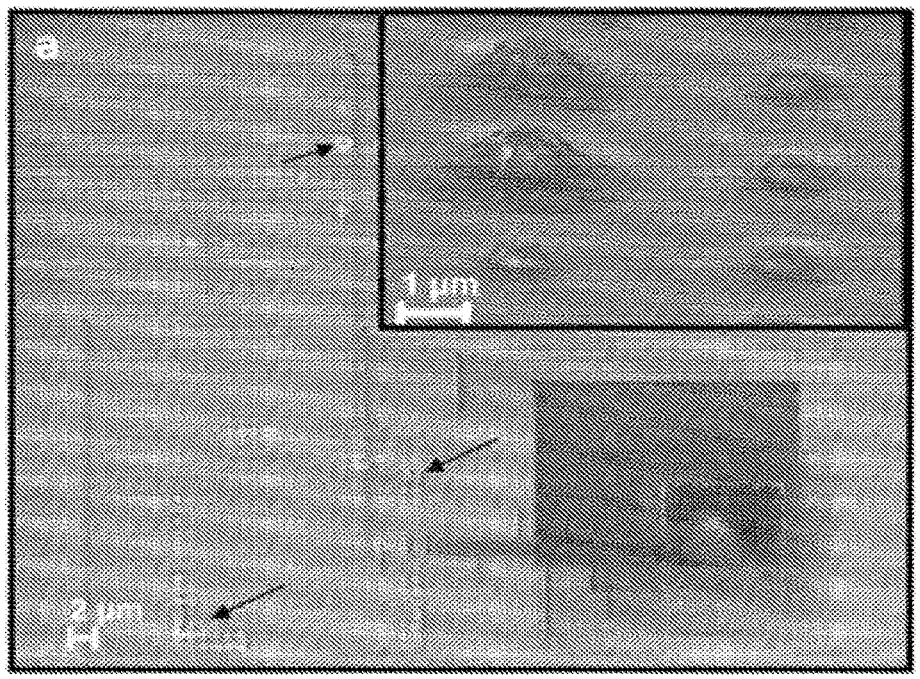
FIG. 9 panels A-D are electron micrographs showing results of nanostructure assembly processes performed at different applied voltages for a duration of 90 seconds.
Figure 9B:
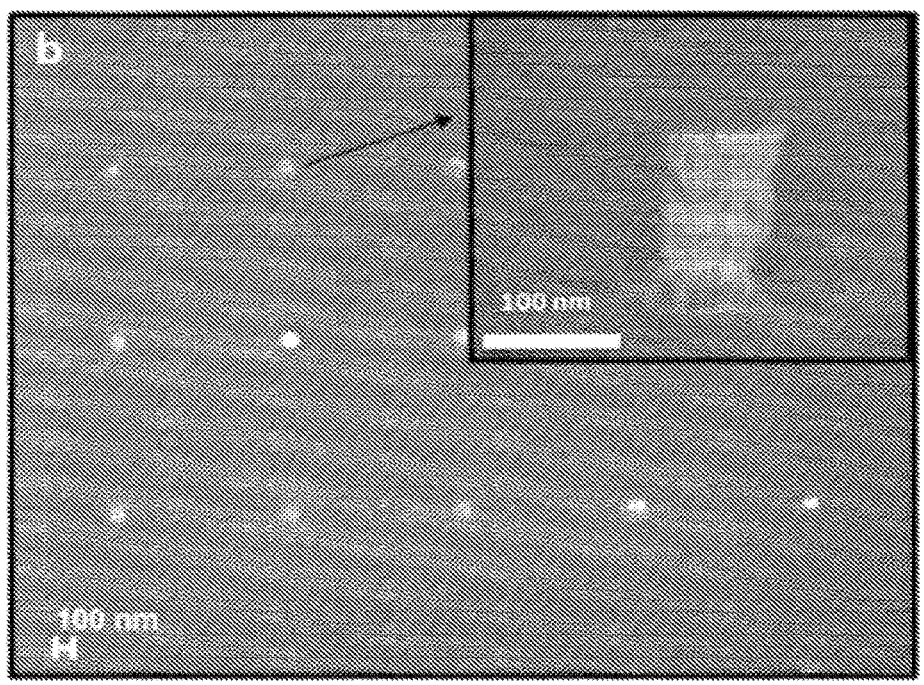

Amplitude and frequency of the applied voltage plays a key role in obtaining successful nanopillar formation for different via geometries. It was observed that 50 nm diameter pillars are typically obtained with an applied voltage of 12 $V_{pp}$ and a frequency of 50 kHz, for 90 seconds. Lower voltages (~6 $V_{pp}$) reduces DEP, and chaining forces decrease, resulting in partially assembled and partially fused particles in the vias (FIG. 9B). Application of very high voltages (~20 $V_{pp}$) significantly increased the assembly rate but could result in over assembly of the particles and agglomeration on the PMMA surface (FIG. 9A).

Figure 9C:
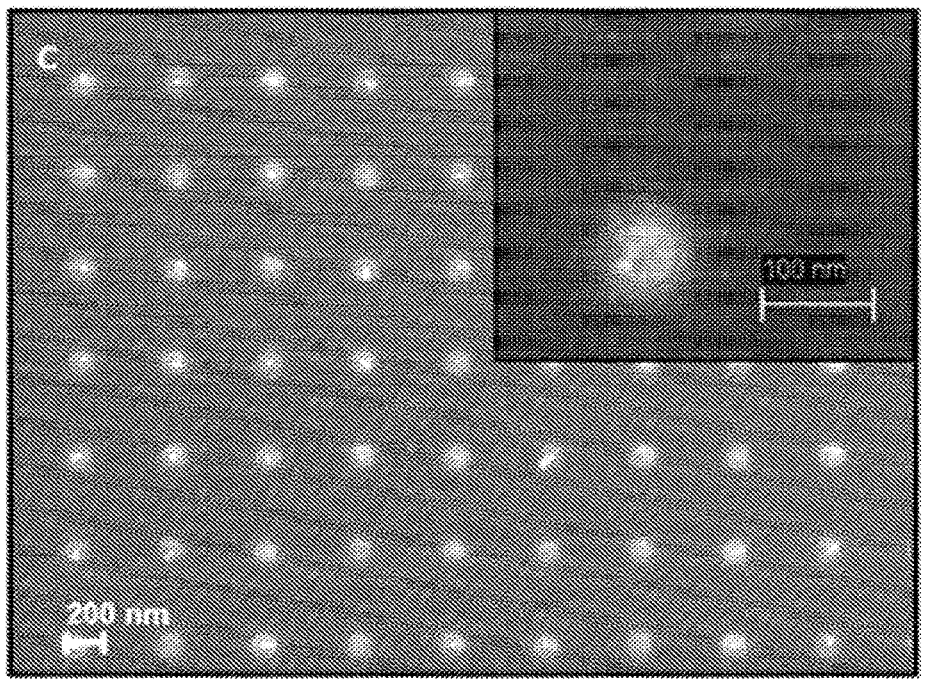
Figure 9D:
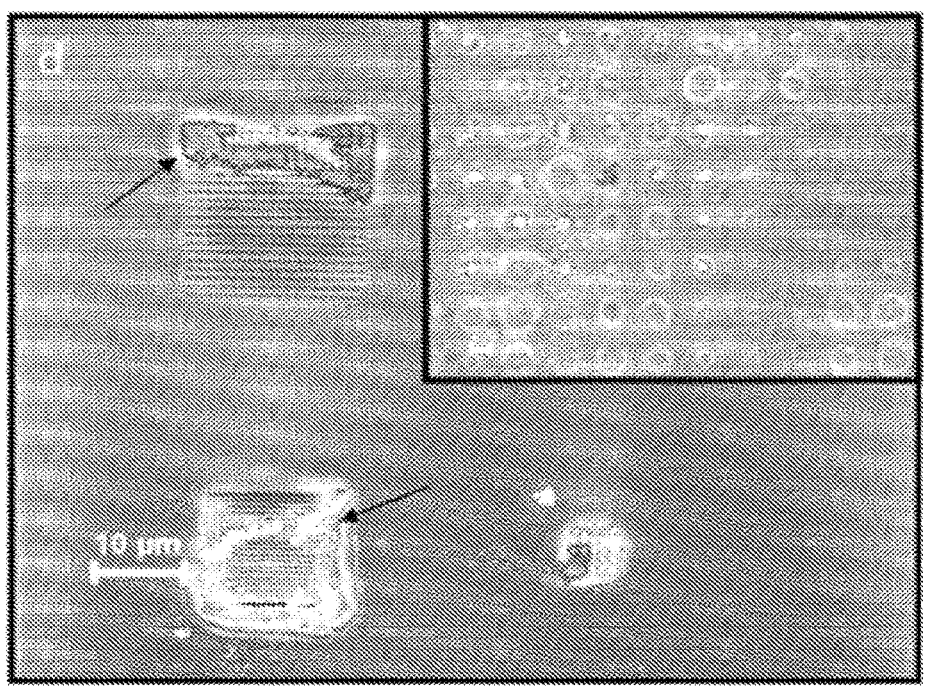

NP assembly in the vias could be controlled also by varying the frequency of the applied field. At higher frequencies (~100 kHz), the counterions on the particles could not follow the rapidly oscillating electric field, which decreased the particle-electric field interaction (Hermanson et al., *Science* 294, 1082-1086 (2001) and the assembly rate (FIG. 9C). At low frequencies (~10 kHz), the assembly rate became very high, also resulting in undesirable particle over assembly and agglomeration in localized regions mostly near the edges of the via array (FIG. 9D).

Therefore, fabrication of large diameter (between 50-200 nm) nanostructure arrays requires voltages to be slightly higher than 12 $V_{pp}$, for example, about 14-16 $V_{pp}$ (see FIG. 2F showing poor assembly at 12 $V_{pp}$).

Further, with a feature diameter larger than 200 nm, the electric field near vias becomes too low for nanopillar formation using only AC voltage. For successful particle assembly and chaining to occur in a via it is necessary that the DEP force be above a certain threshold, in addition to there being a sufficient particle concentration near the vias. For very large diameters (i.e., larger than 200 nm), the electric field was higher at the edges of the vias, causing NPs to form chains only at these locations. Since the DEP force was effective only close to via patterns (i.e., a few hundred nm from a via; Morgan, H. & Green, N. G. *AC Electrokinetics: colloids and nanoparticles* Research Studies Press Ltd. Baldock, Hertfordshire, England, 2003), NPs far from the via (i.e., further distant than a few hundred nm out into the NP suspension) do not contribute to particle chaining, leading to incomplete assembly in the vias. To overcome the incomplete assembly a constant DC offset voltage can be applied in addition to the AC voltage. The DC offset voltage creates an additional electrophoretic (EP) force on the NPs to drive the nanoparticles closer to the vias, thereby effectively increasing the concentration of the particles in the vicinity of the vias. The magnitude of electrophoretic force on 5 nm gold NPs under a DC voltage of 2V is calculated to be $1.78\times10^{-12}$ N, which is almost 2 orders of magnitude higher than the DEP force.

The DEP force on 5 nm gold NPs near a 200 nm diameter, 150 nm deep via is $1.54\times10^{-14}$ N, which is 3 times lower than the force near a 50 nm diameter via with a same depth. In this case, AC voltage alone was not sufficient to fill these vias. Applying an electrophoretic force on the NPs using a DC offset voltage resulted in assembly of the NPs in these vias. Electrophoretic directed assembly of nanoparticles into nanotrenches is governed by the transport of charged particles under externally applied uniform electric field. The induced charge on the particles depends on the particle zeta potential according to Debye-Hückel approximation of the Derjaguin-Landau-Verwey-Overbeek theory, $$q = 4\pi R \varepsilon_r \varepsilon_0 (1+\kappa R)\xi \quad (7)$$

where R is the radius of a colloidal particle, $\varepsilon_r$ is permittivity of suspension, $\varepsilon_0$ is permittivity of vacuum, $\kappa$ is inverse Debye length, and $\xi$ is the zeta potential on the particles. Debye length is calculated by, $$\kappa^{-1} = \sqrt{\frac{\varepsilon_r \varepsilon_0 k_B T}{2 N_A e^2 I}} \quad (8)$$

where I is the ionic strength of the electrolyte, $k_B$ is the Boltzmann constant, T is the absolute temperature in kelvins, $N_A$ is the Avogadro number, e is the elementary charge.

The zeta potential of 5 nm gold NPs was measured to be 48 mV in the particle suspension with a conductivity of 100 μS/cm. At these conditions, the charge on these particles is calculated to be $3.18\times10^{-18}$ C. The electrophoretic force then can be calculated using, $$F_{EP} = q*E \quad (9)$$

where E is the static electric field intensity at a particular distance from the vias. The electrophoretic force, due to a 2 V DC offset, on the particles located 230 nm away from the bottom of the vias was calculated to be $1.78\times10^{-12}$ N.

Figure 10:
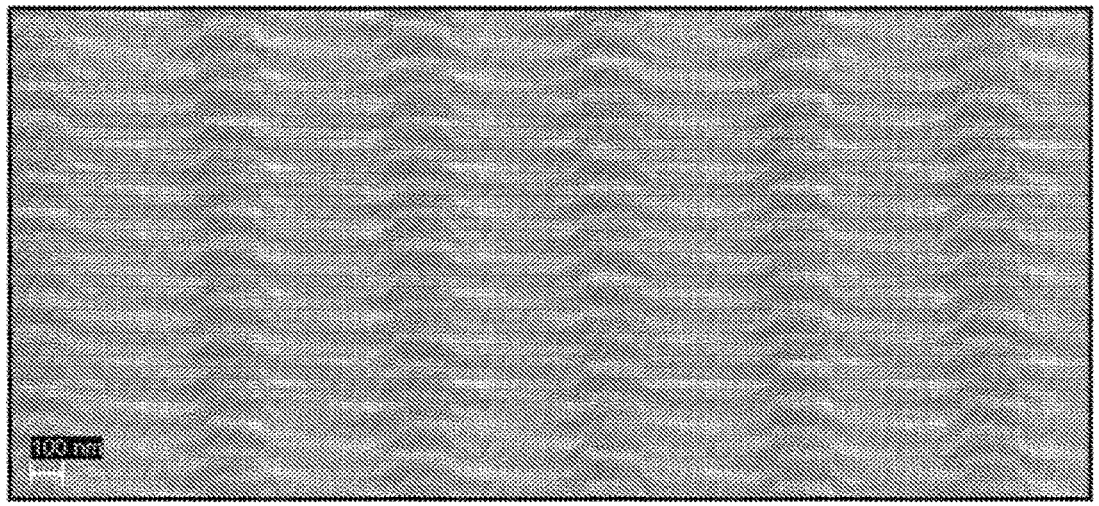
FIG. 10 is a SEM image of a nanopillar array with nanopillars of 150 nm height and 200 nm diameter, separated by 500 nm.

The additional DC offset voltage resulted in a uniform nanopillar formation in 200 nm diameter vias (FIG. 10).

FIG. 10 shows successful formation of 200 nm diameter, 150 nm deep vias using $12V_{pp}$ voltage with a 2V DC offset at 50 kHz frequency. The assembly time was 90 seconds.

Nanopillar arrays, including those having nanopillars with diameter as small as 25 nm, and made of different material types, were fabricated (FIG. 3 A-D). Specific assembly parameters are needed for fabrication of nanopillars of a particular dimension and made of a particular material. These parameters are summarized in Table 1.

TABLE 1

Summary of the parameters affecting the 3-D nanostructure fabrication process.

| 3-D nanostructure type | Parameter | Range | |
|---|---|---|---|
| | | Via diameter <200 nm | Via diameter ≥200 nm |
| Conductor (Au, Cu, W, Al, etc.) | Voltage | 12-16 $V_{pp}$ | 16-20 $V_{pp}$ |
| | Frequency | 30-70 kHz | 30-70 kHz |
| | DC voltage | — | 2 V |
| | Assembly time | 30-90 s | 90-600 s |
| | Particle size | ≤10 nm | >50 nm |
| | Particle concentration | ~$10^{13}$ ml$^{-1}$ | $10^{13}$-$10^{14}$ ml$^{-1}$ |
| | Post heat treatment | — | ~250° C. |
| Insulator/ semiconductor (SiO$_2$, PSt, Si, CdSe, etc.) | Voltage | 12-16 $V_{pp}$ | 16-20 $V_{pp}$ |
| | Frequency | 30-70 kHz | 30-70 kHz |
| | DC voltage | — | 2 V |
| | Assembly time | 30-90 s | 90-600 s |
| | Particle size | ≤30 nm | >50 nm |
| | Particle concentration | $10^{13}$-$10^{14}$ ml$^{-1}$ | $10^{13}$-$10^{14}$ ml$^{-1}$ |
| | Post heat treatment | polymers (—) oxides (>250° C.) semiconductors (>250° C.) | polymers (>250° C.) oxides (>400° C.) semiconductors (>250° C.) |
| Hybrid Type | | Range (all diameters) | |
| Hybrid | Insulator/semiconductor on a conductor structure | same for fabricating insulating/semiconducting | |
| | Conductor on an insulator/ semiconductor structure | 12-16 $V_{pp}$, 30 kHz, 2 V DC, 120-180 s, $10^{14}$-$10^{15}$ ml$^{-1}$ for particles >10 nm ~250° C. post heat treatment is needed | |

Figure 3A:
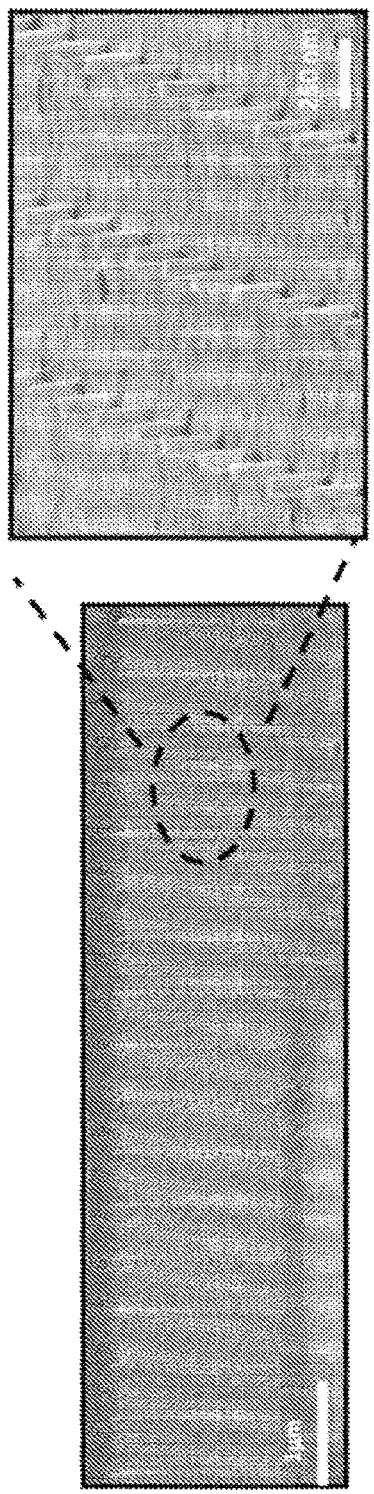
FIG. 3 panels A-K show SEM micrographs and atomic force microscopy images (AFM) of nanostructures fabricated using electrical field directed assembly.
Figure 3G:
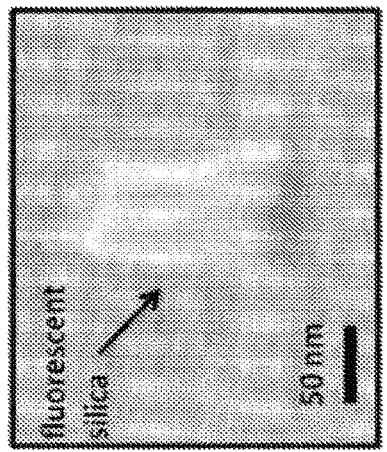
Figure 3J:
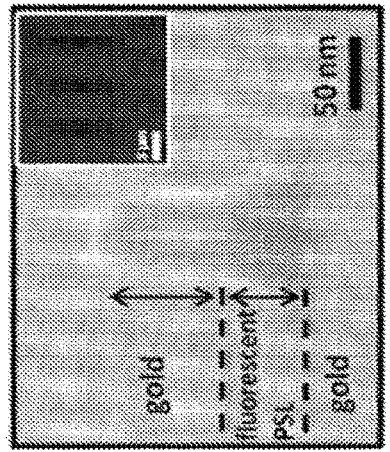
Figure 3F:
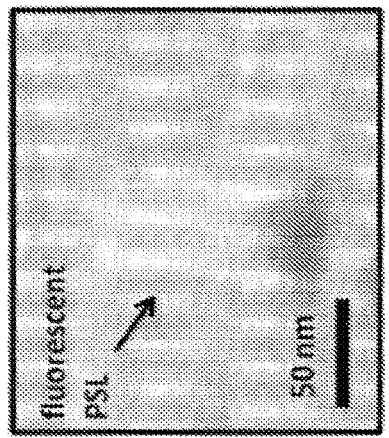

Desired pillar density on a template with nanopillars of identical pillar dimensions was achieved by adjusting the spacing between the vias (FIG. 3A). High-magnification SEM images (FIGS. 3 B-D) show that the aspect ratios of the pillars could be adjusted by controlling the diameter and depth of the vias. The corresponding atomic force microscopy images (FIGS. 3B-D lower half) indicate that all fabricated nanopillars have smooth side walls. In addition to gold, nanopillars made of copper or other metals can be fabricated on a gold or another conductive surface using similar assembly parameters used for fabrication of the gold nanopillars (FIG. 3E).

The directed assembly approach described here is compatible with conductors, and also with other types of inorganic or organic insulating NPs such as polymers and oxides (e.g, silica, alumina, titania). FIG. 3F shows a SEM image of a 50 nm diameter polystyrene-latex (PSL) nanopillar fabricated by directly assembling 22 nm fluorescent PSL particles into the vias. Although PSL particles have lower bulk polarizability than the medium, they experience positive DEP at tens of kHz, because the conductance of the ionic layer near the particle surface becomes more dominant compared to intrinsic conductance of the particle (Ermolina et al. *J Colloid Interface Sci.* 285, 419-428, 2005). The ionic layer creates an additional dipole moment, contributing to the DEP force. Therefore, solution properties such as pH and ionic conductivity play an important role in the assembly of these particles.

For an insulating particle such as PSL, bulk conductivity, $\sigma_b \cong b$. Therefore, both conductivity and dielectric constant of the particle becomes lower than medium ($\sigma_p < \sigma_m$ and $\varepsilon_p < \varepsilon_m$). In this case, equation (2) yields $Re[K(w)] = -0.5$. Since this value is below 0, one can expect negative dielectrophoresis. However, results obtained using methods herein showed positive dielectrohoresis under these conditions. Although insulating particles have low intrinsic conductivity, surface conductance component produced by the movement of counterions dominates at low frequencies (Jones, T. B., Electromechanics of Particles, Cambridge University Press, Cambridge, 1995; et al., *Langmuir,* 23, 12450-12456, 2007).

The total conductivity of a solid sphere particle is given by $$\sigma_p = \sigma_b + \frac{2K_s}{R} \qquad (10)$$

where $\sigma_b$ is the bulk conductivity and $$\frac{2K_s}{R}$$

is the surface conductivity. $K_s$ is a general surface conductance (typically 1 nS for latex particles 1) and R is the particle radius. The magnitude of $$\frac{2K_s}{R}$$

was calculated to be $1.82 \times 10^{-1}$ S/m for 22 nm PSL particles. This value is higher than the conductivity of the solution, which is $1 \times 10^{-2}$ S/m. Hence, new $Re[K(w)]$ is calculated to be 0.851, resulting in positive dielectrophoresis. Under these conditions, the DEP force on the 22 nm PSL particles was calculated to be $3.25 \times 10^{-12}$ S/m.

The zeta potential of 22 nm fluorescent PSL particles was measured to be about −53 mV at pH 11. At this pH, the calculated DEP force was $3.25 \times 10^{-12}$ N. Due to this large DEP force, the PSL particles assembled into vias under AC voltage without requiring a DC offset. Similar to metallic particles, the PSL particles also were fused in the via due to the localized joule heating. The fusion process did not impair the fluorescence properties of particles, and the resulting nanopillars continued to be fluorescent (FIG. 12).

Fabrication of silica nanopillars (FIG. 3G) required modification of the assembly process described above. Due to increased melting temperature associated with larger size, and other intrinsic properties, silica NPs did not entirely fuse in the vias. However, either heat treatment or application of a large DC electric potential following the assembly process can be utilized to form fused nanopillars.

Figure 11A:
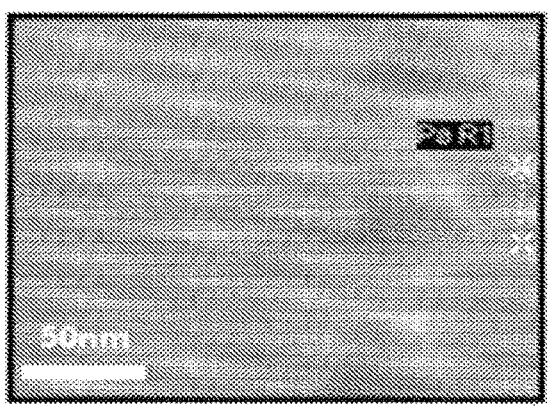
FIG. 11 is a set of SEM micrographs of nanopillars assembled by varying the time of assembly of NP to control nanopillar height.
Figure 11B:
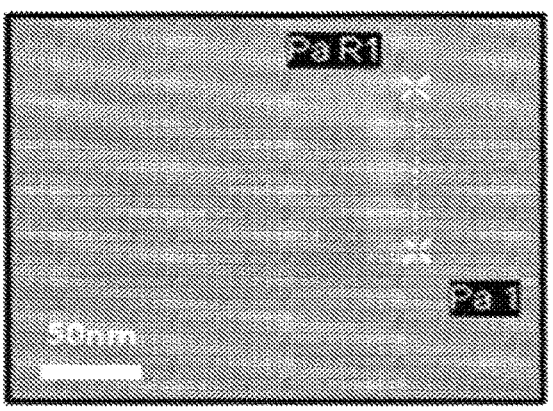
Figure 11C:
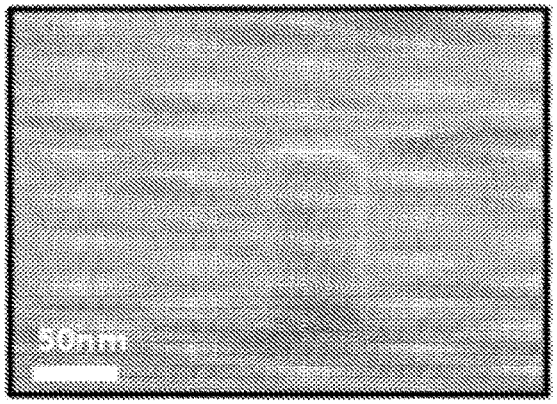
Figure 11D:
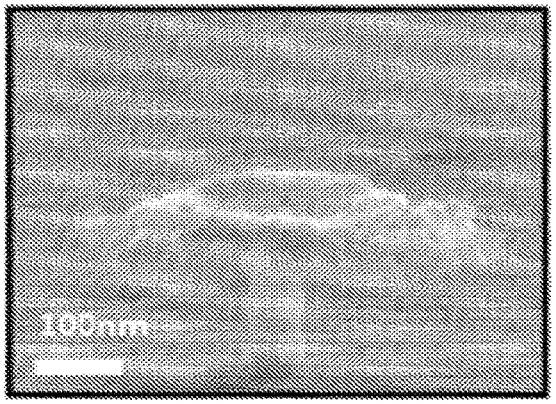

NP assembly also was controlled by altering the assembly time. The assembly process was timed to achieve a preferred nanopillar height in the via (FIG. 11A-C). When the assembly process was continued after the vias had become completely full, the NP chains developed over the via surface, resulting in a flat-cap mushroom-like geometry (FIG. 11D). The ability to adjust the nanopillar height through variation in assembly time is important for applications where fabrication of structures with a very high aspect ratio (e.g., 1-D nanopillar arrays) is desired (Xia et al., *Adv. Mater.* 15, 353-389, 2003).

Figure 3I:
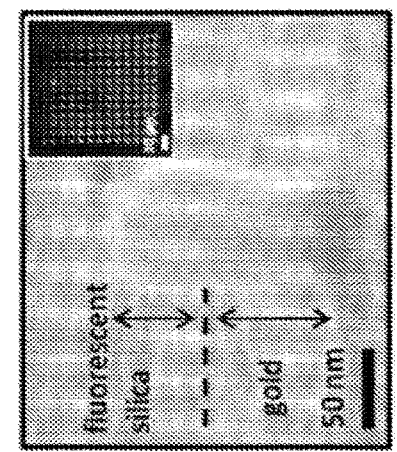
Figure 3E:
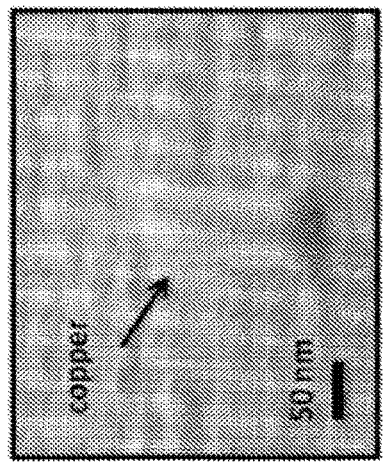
Figure 3H:
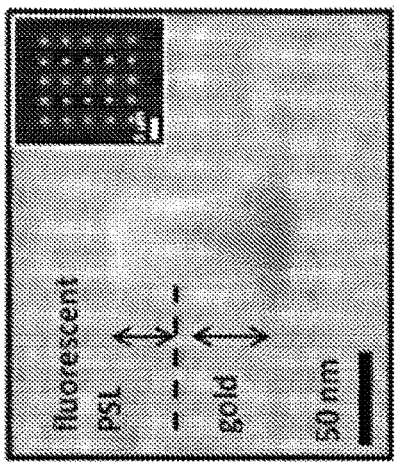
Figure 3K:
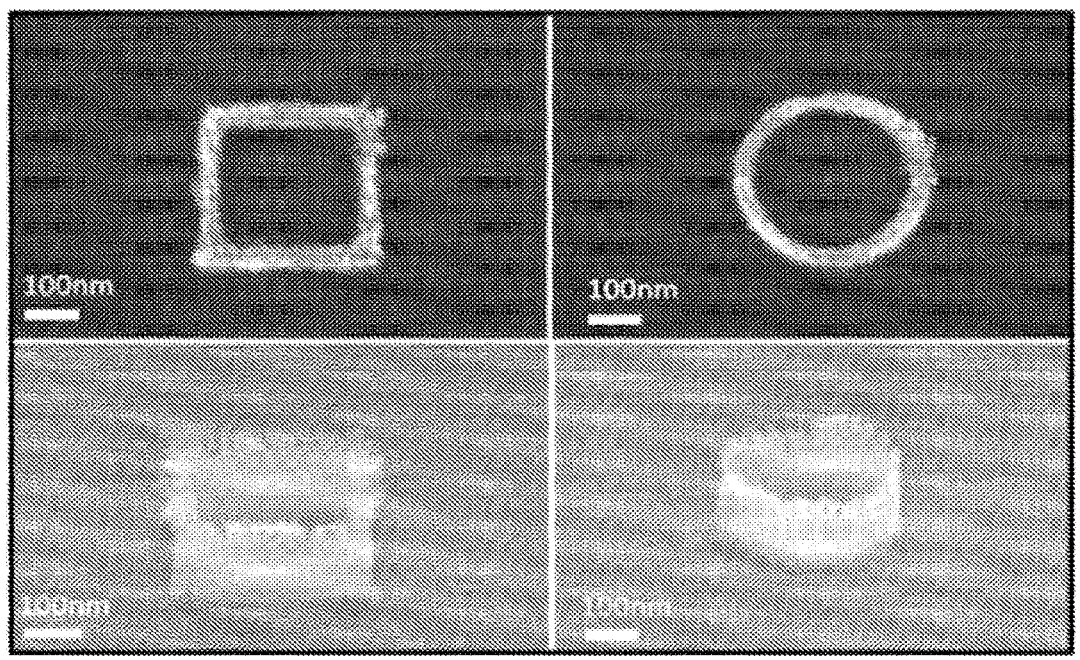

Methods described above were used to fabricate nanoscale hybrid structures, viz., gold-fluorescent PSL (FIG. 3H) and gold-fluorescent silica layered nanopillars (FIG. 3I). Fabrication of the hybrid structures required precise control of nanopillar height within the via. To achieve a desired nanopillar height the assembly rate of gold NPs was estimated by varying the assembly time (other parameters were kept constant at $12V_{pp}$ and 50 kHz). The height of nanopillars increased with time in a linear manner at a rate of 2 nm/second (FIG. 11). A preferred height for the gold segment of hybrid nanopillar was obtained by adjusting the assembly time. Following the formation of gold segment fluorescent PSL or silica NPs were assembled and fused into the remaining part of the via. The resulting hybrid nanostructure is clearly shown by the fluorescent microscopy images in the insets of FIGS. 3H and I, and FIG. 12. The above nanostructures were created using a conductive base, and utilizing electric field directed assembly to assemble polymer or silica particles on top of gold nanopillars.

Figure 12B:
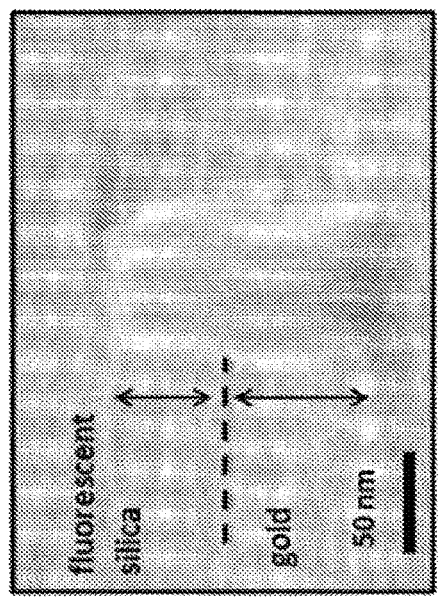
FIG. 12 panels A-D are a set of SEM micrographs and fluorescence images of homogeneous and hybrid nanopillars. The exposure time for each of the fluorescence images was 2 min.
Figure 12B:
Figure 12B:
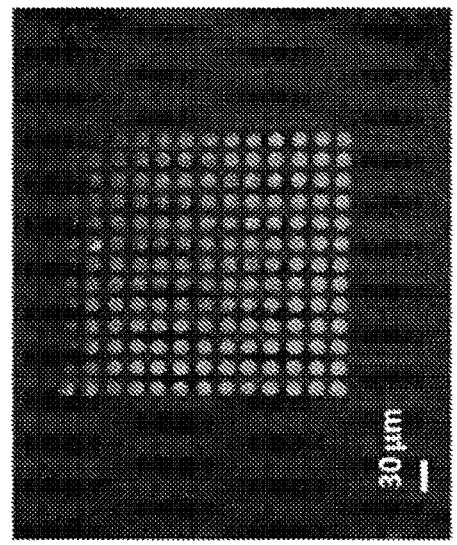
Figure 12A:
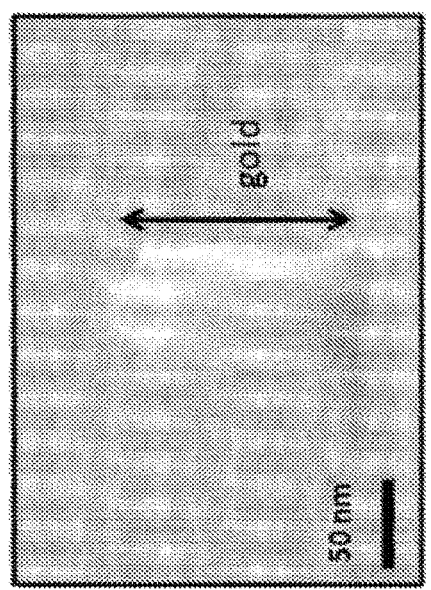
Figure 12A:
Figure 12A:
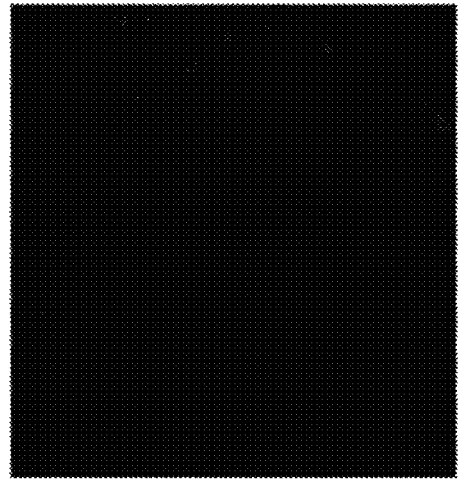
Figure 12D:
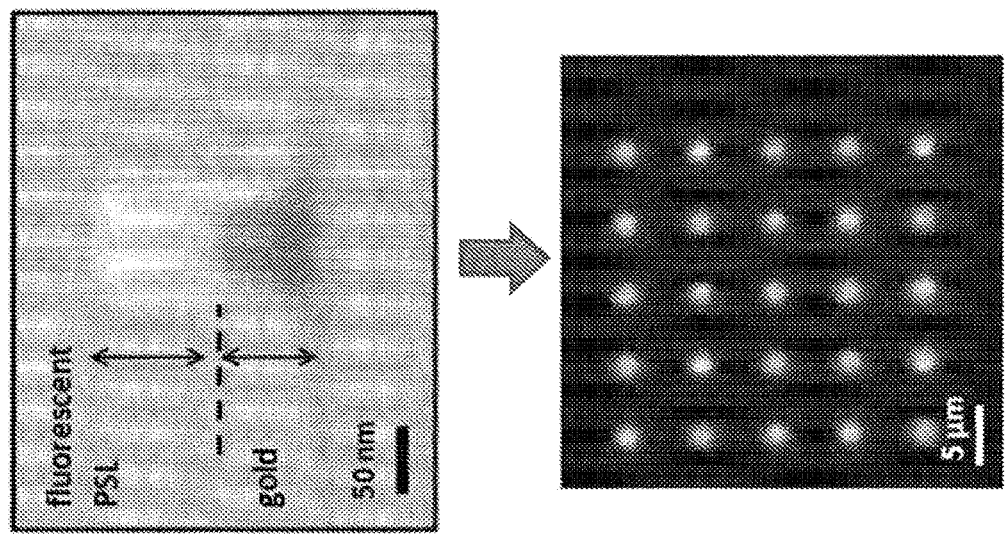
Figure 12C:
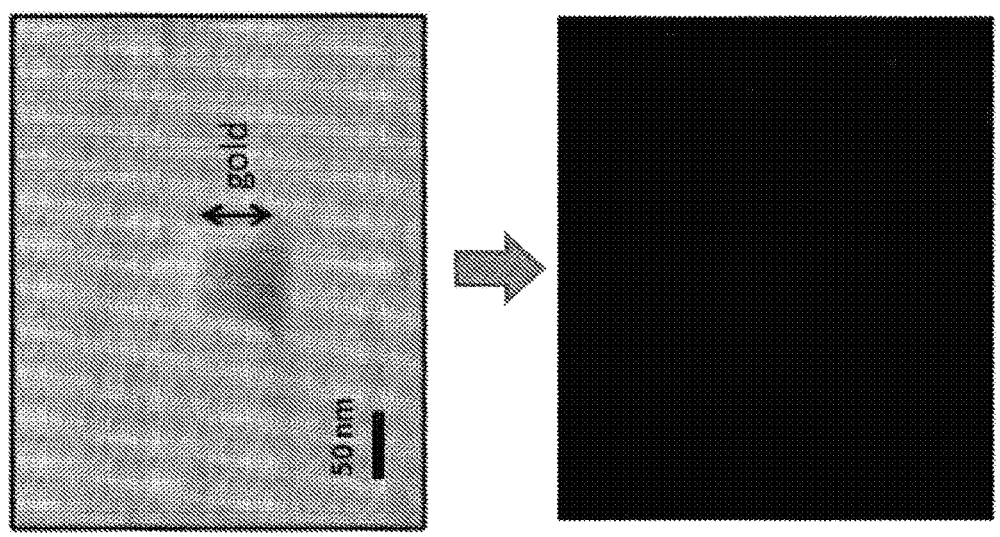

The electric field directed assembly approach described here is useful to also assemble metals on top of an insulator or a semiconductor to obtain multi-segmented 3-D structures, which are useful in many applications such as optics (Wadell et al., *Nano Lett.* 12, 4784-4790, 2012), electronics (Wu et al., *Nature* 430, 61-65, 2004), energy (Fan et al., *Nat. Mater.* 8, 648-653, 2009) and biomedicine (Salem et al. *Nature Mater.* 2, 668-671, 2003). Hybrid nanopillar formation was observed by SEM and optical microscopy. FIGS. 12A and C shows SEM images of gold nanopillars before the fabrication of hybrid nanopillars. The bare gold nanopillars did not show any fluorescence signal under the optical microscopy. FIGS. 12B and D show the SEM images of hybrid nanopillars after the assembly of fluorescent silica and fluorescent PSL NPs respectively. The gold portion of these hybrid nanopillars was fabricated using the same experimental parameters as in FIGS. 12A and C. Optical images showed green and red signal from the via arrays for gold-fluorescent silica and gold-fluorescent PSL nanostructures respectively.

5 nm gold NPs were assembled and fused simultaneously on top of the fabricated dielectric fluorescent PSL nanopillars with no post heat treatment (FIG. 3J). Simulated electric field in the vias that already have gold nanopillars were compared to those that have PSL nanopillars as the first segment (FIG. 13). The resulting electric field intensity was significantly lower in the via that has PSL nanopillar since PSL is a dielectric material. Therefore, gold NPs were exposed to extremely low DEP (almost 5 orders magnitude lower) and EP (more than 3 orders of magnitude lower) forces compared to forces on PSL NPs assembling on gold nanopillars. Because of the lower DEP and EP forces, the uniform fabrication of hybrid nanopillar with PSL nanopillar as the first segment and gold nanopillar as the second segment, high NP concentrations (2 times higher concentration compared to if the gold NPs were assembled first) were used. For vias with diameter less than 200 nm, typically the concentration used was $10^{13}$ particles/ml, and for vias with diameter greater than 200 nm, the typical concentration was in the range of $10^{13}$-$10^{14}$ particles/ml. Following the gold NP assembly, the fluorescence signal from the PSL nanopillars decreased significantly, indicating the formation of gold segments on top of the PSL nanopillar (FIG. 3J inset and FIG. 14).

Figure 13A:
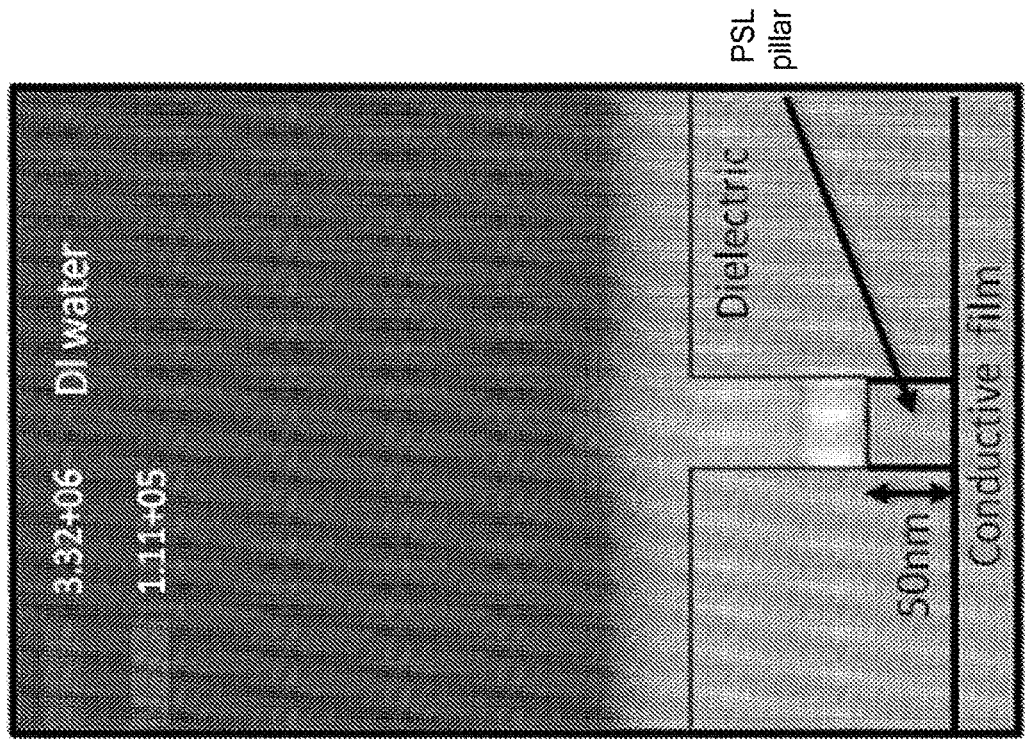
FIG. 13 panels A-B are diagrams showing simulations of electric field magnitude inside two 50 nm diameter, 150 nm high vias after the first segment of the hybrid nanopillars was formed. Electric field intensity in the via after formation of a gold nanopillar is shown in panel A, and after formation of a PSL nanopillar is shown in panel B. In each panel the bars at the upper left corner represent the magnitude of electric field intensities.
Figure 13B:
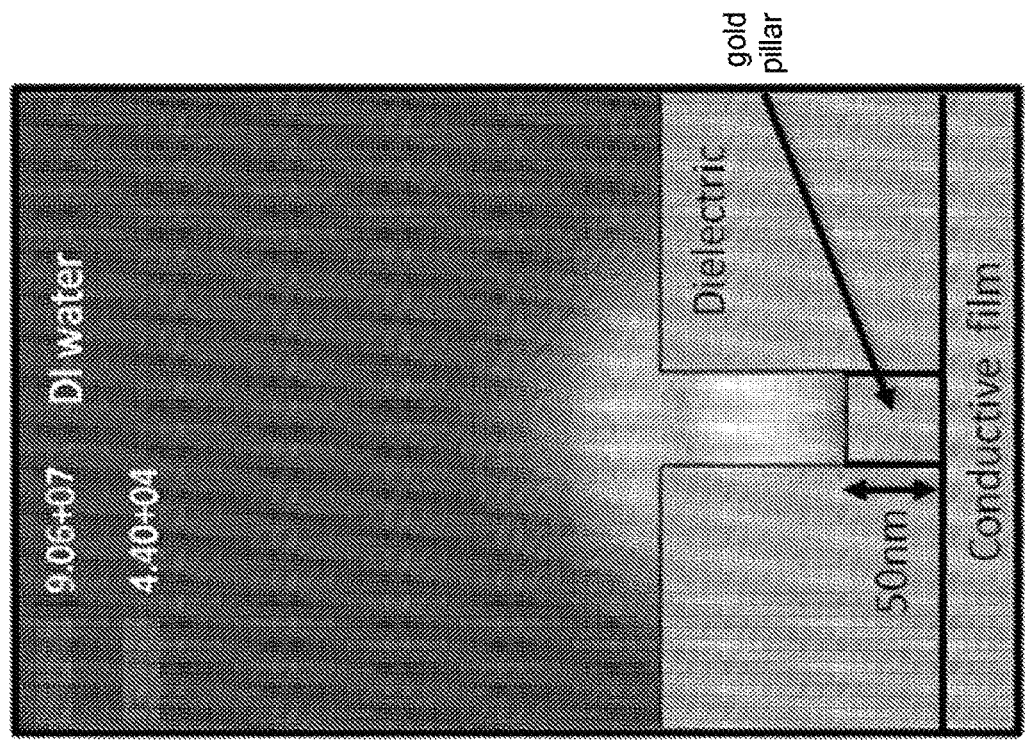
Figure 14B:
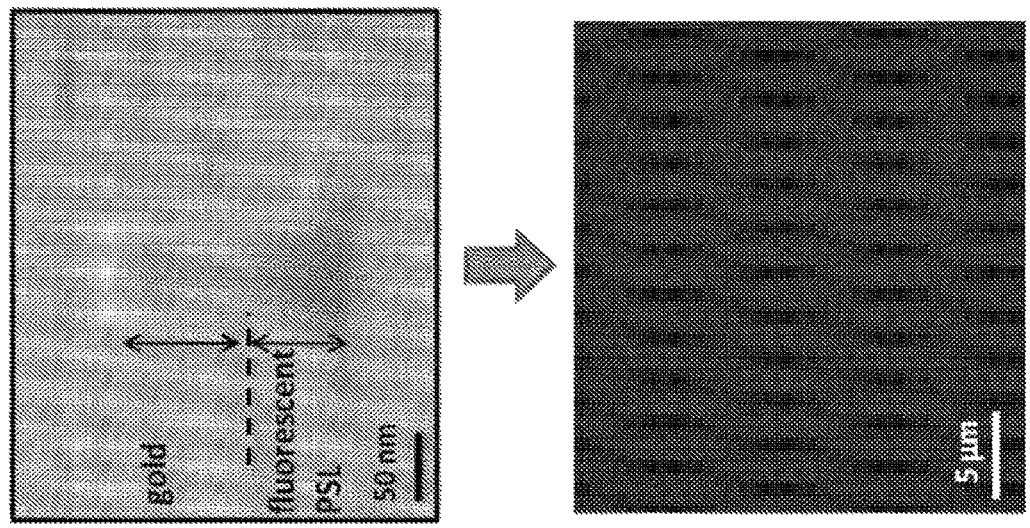
FIG. 14 panels A-B are SEM micrographs (upper panels) and fluorescence images (lower panels) of fluorescent PSL (panel A), and fluorescent PSL-gold (panel B) 3-D heterostructures. The exposure time for each fluorescence image was 2 min.
Figure 14A:
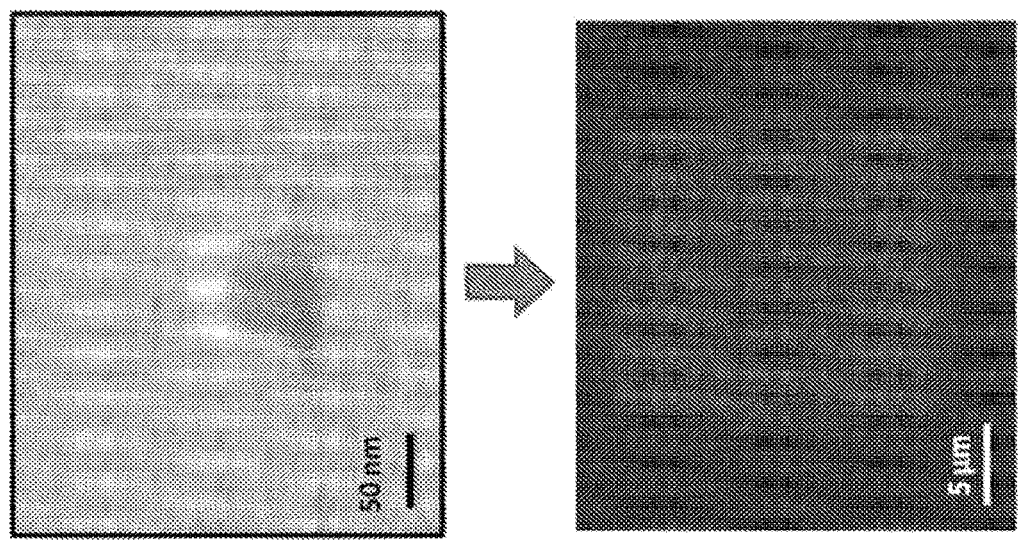

Electric field simulations of gold and PSL nanopillars within the first 50 nm of the via are shown in FIGS. 13A and B respectively. It was observed that the via with PSL nanopillars showed significantly lower electric field intensity compared to the via with gold nanopillars. As a PSL particle approaches the via having a gold nanopillar (FIG. 13A) it is exposed to a DEP force of $5.91 \times 10^{-11}$ N. On the other hand, the DEP force on a 5 nm gold particles approaching the via having a PSL nanopillar (FIG. 13B) was estimated to be $5.26 \times 10^{-16}$ N. In addition, calculations showed that the EP force on 5 nm gold nanoparticles at a distance of 230 nm from the bottom of the via in the case of a PSL nanopillar (FIG. 13 B) was $4.78 \times 10^{-13}$ N, which is more than 3 orders of magnitude lower compared to EP force on PSL particles in the case of a gold nanopillar (EP force of $9.0 \times 10^{-10}$ N; FIG. 13A).

Complex 3-D nanostructures having a cross-sectional profile of a hollow geometric figure (e.g., a circle, ellipse, square, rectangles, triangles, and the like), such as nanorings and nanoboxes, with a wall thickness as small as 25 nm, can be fabricated using modifications of the electric field directed assembly approach described above (FIG. 3K). The nanobox geometries have a larger exposed area and lower electric field than those of the 50 nm diameter via geometries shown in FIG. 1 and FIG. 15. To fabricate these structures, a higher voltage (16 $V_{pp}$) and a lower frequency (30 kHz) were applied for 90 seconds, compared to the voltage (12 $V_{pp}$) and frequency (50 kHz) used respectively to assemble 5 nm gold particles. Ring shaped nanostructures are useful for spintronics applications, such as magnetoresistive random access memory (MRAM) (Chappert et al., *Nature Mater.* 6, 813-823, 2007). The ring and box shape nanostructures were fabricated without using complex or multiple fabrication steps.

Figure 4A:
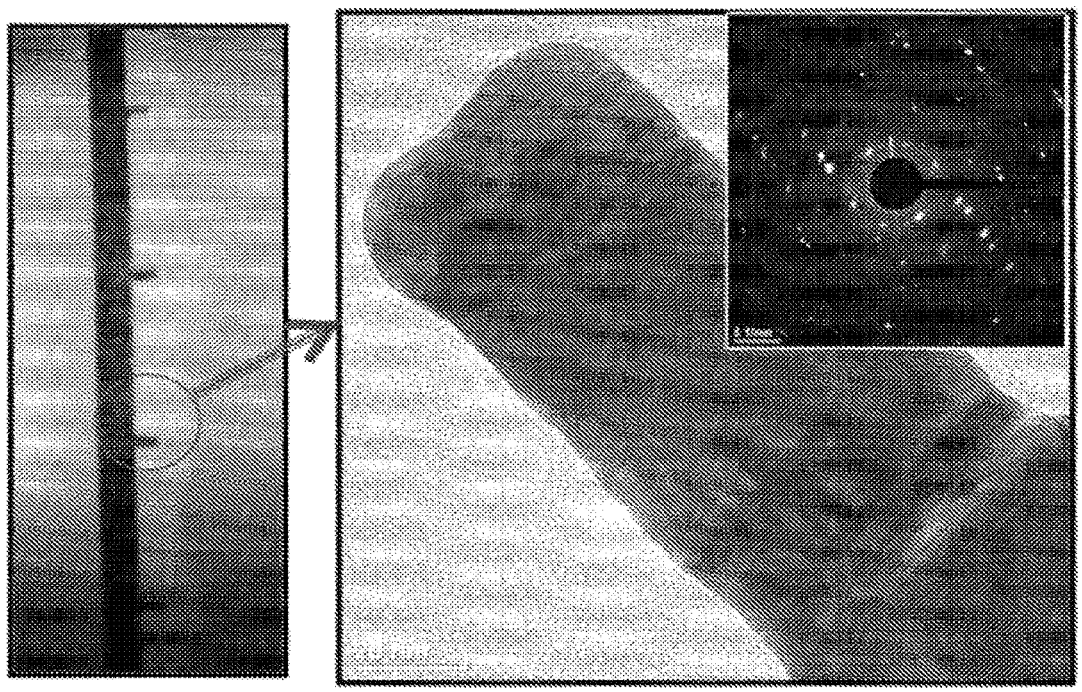
FIG. 4 panels A-C are transmission electron microscopy (TEM) micrographs and a graph comparing resistance measurements of nanopillars fabricated using electrical field directed assembly of nanoparticles to that produced using electroplating.
Figure 4B:
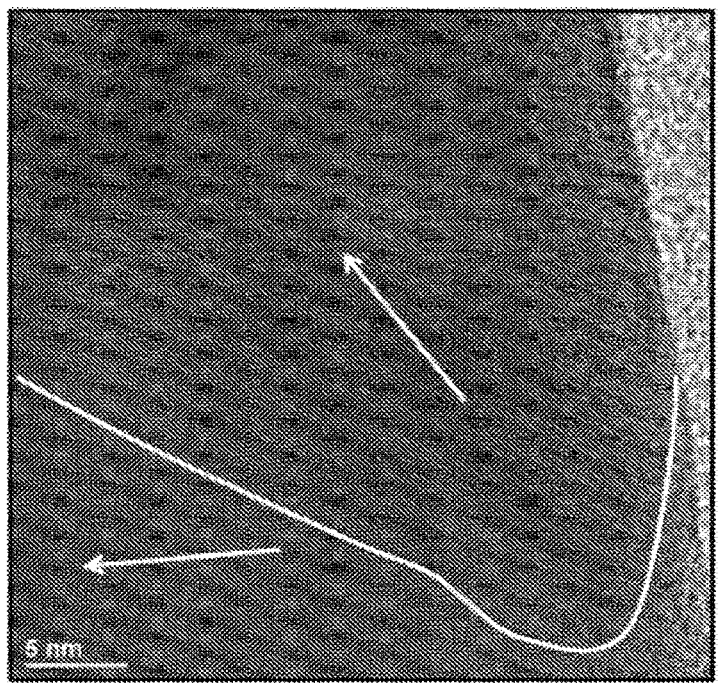
Figure 17:
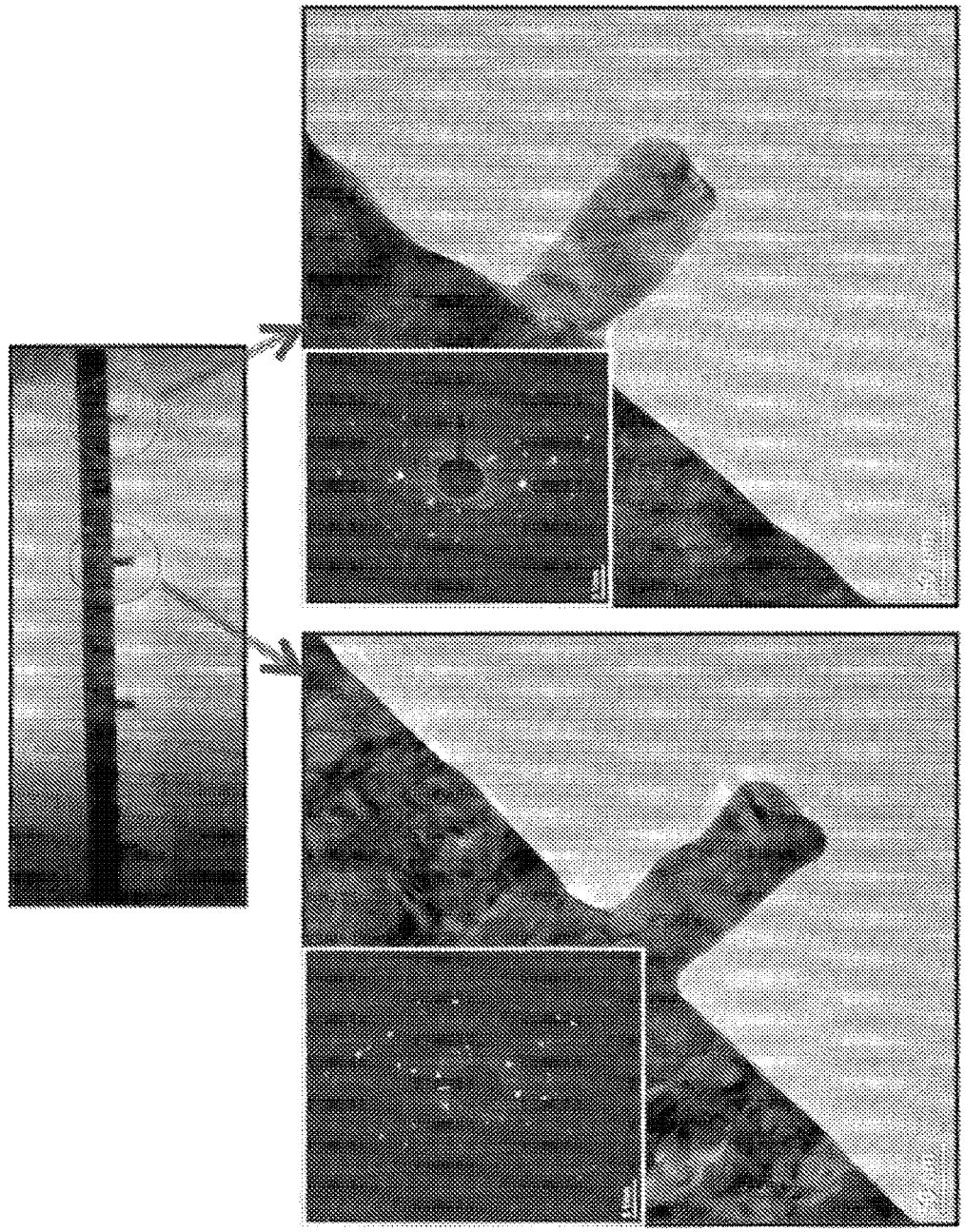
FIG. 17 shows bright-field TEM images and corresponding electron diffraction patterns (insets) of two different nanopillars, revealing the polycrystalline nature of the structures.

Material characteristics of the gold nanopillars manufactured using the electric field directed assembly approach described above were determined using transmission electron microscopy (TEM). Gold nanopillars were placed on a copper TEM grid using a conventional lamella lift-out process (FIG. 16). The bright-field images in FIGS. 16A and B, and the small-area electron diffraction (SAED) pattern in the insets indicate that the gold NPs were completely fused during the assembly process, transforming them into polycrystalline nanopillars lacking air voids or gaps (FIG. 17). The bright-field image in FIG. 4A also indicates that the gold NPs were completely fused during the assembly process, transforming them into homogeneous nanopillars without any voids or gaps. The SAED pattern obtained from the entire nanopillar shown in the inset to FIG. 4A revealed the polycrystalline nature of the nanopillars. Notably, only two grains, each having its lattice oriented in one direction, were observed over the 30 nm×30 nm area of the nanopillar (FIG. 4B). Since the nominal diameter of an individual NP used was 5 nm, it was inferred that large number of NPs fused into a single grain. The formation of a single-crystalline material might have resulted from the recrystallization of multiple NPs during the fusion process (Tang et al. *Science* 297, 237-240, 2002). Based on the observations it is envisioned here that it is possible to manufacture single-crystalline nanopillars through further tuning of the assembly parameters.

Electrical characteristics of the nanostructures produced using the methods described above show that the nanostructures are useful as nanoelectronics. The electrical characteristics of the nanostructures were compared with those of 3-D nanopillars fabricated by a conventional electroplating process using an SEM-based in situ Zyvex S-100 nanomanipulator (FIGS. 18-21).

Electroplated nanopillars were produced by applying a DC voltage between the template and the counter electrode through a gold electrolyte solution. The gold layer under the PMMA served as a seed layer during the electroplating process. Because of electrochemical reactions at the metal-electrolyte interface, the gold atoms nucleated on the seed layer and grew vertically in the vias. As in the directed NP assembly, the dimensions of the electroplated nanopillars were controlled by the diameter and height of the vias. For a constant current density Faraday's formula was used to determine the electroplating rate (metal height per minute).

The electroplating rate was estimated using Faraday's law, with deposition stopped when the desired pillar height was achieved. The plating rate is given by $$R = \frac{D*A}{nF\rho} \quad (11)$$

where R is the plating rate (cm/sec), A is the molecular weight of then metal (g/mol), n is the valence of the dissolved metal in solution (equivalents/mol), F is Faraday's constant (C/equivalent), $\rho$ is the density of the metal (g/cm$^3$), and D is the current density (A/cm$^2$).

Figure 18A:
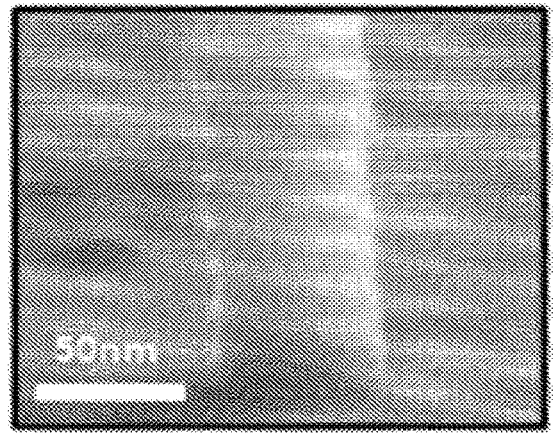
FIG. 18 panels A-D are SEM micrographs of 3-D gold nanopillars obtained with two different processes, electroplating and electric field-directed nanoparticle assembly.
Figure 18B:
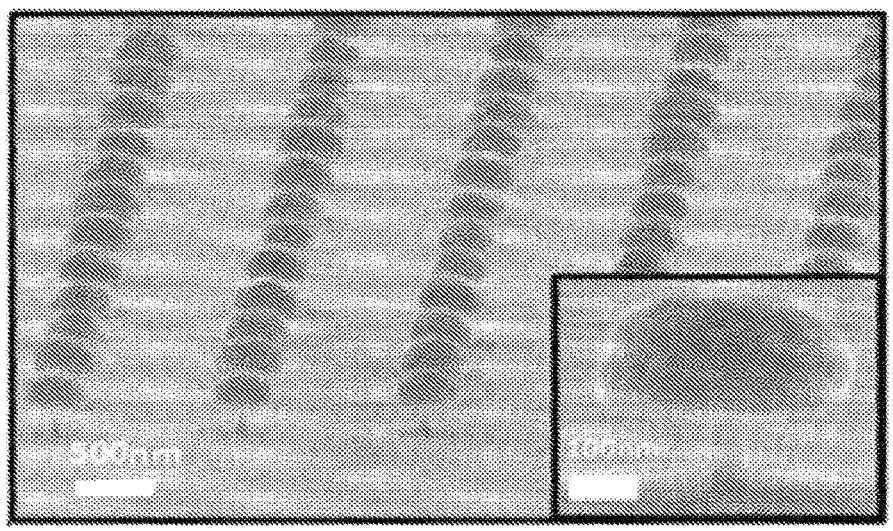
Figure 18C:
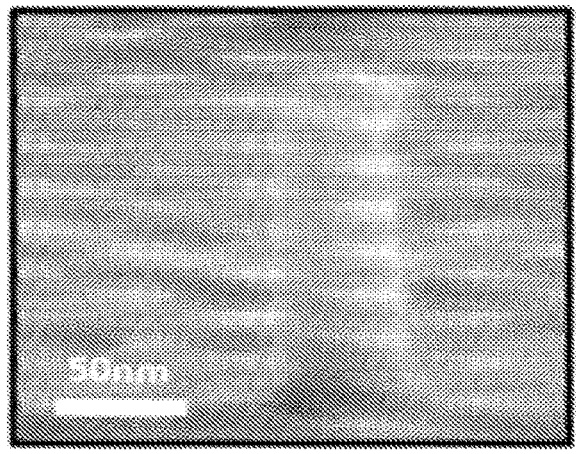
Figure 18D:
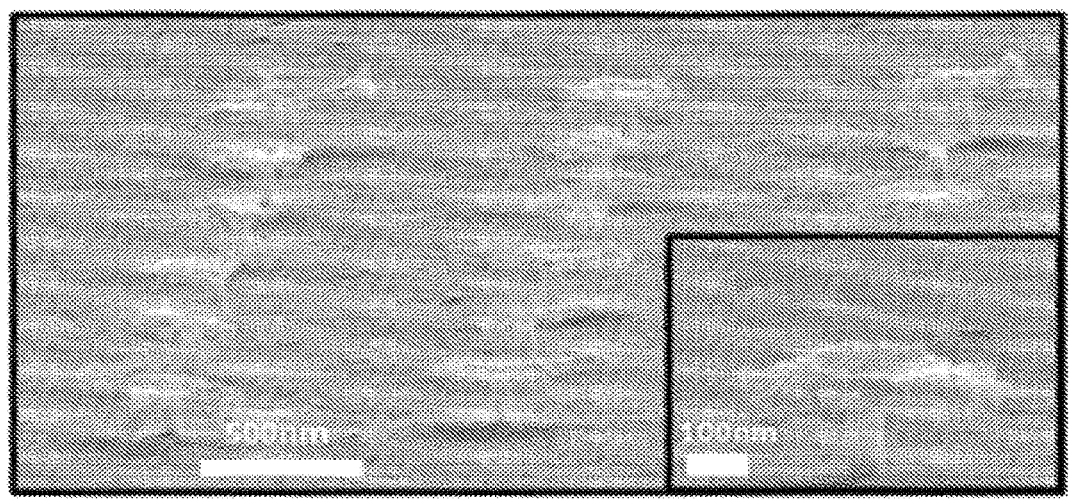

The electroplating rate of gold at a current density of 2.5 mA/cm$^2$ was estimated to be 79.3 nm/min. Results showed that electroplating of the gold solution produced approximately 150 nm high nanopillars in the via, thus verifying the calculated electroplating rate. FIGS. 18A and C show that the nanopillar formation rate for the directed assembly process was similar to that for the electroplating method. The plating process was stopped as desired metal height in the vias was reached. When plating was continued after the vias had become completely full, gold deposition occurred over the PMMA surface, forming button mushroom-like nanostructures (FIG. 18B), which are different than those from the NP assembly process (FIG. 18 D).

Figure 4C:
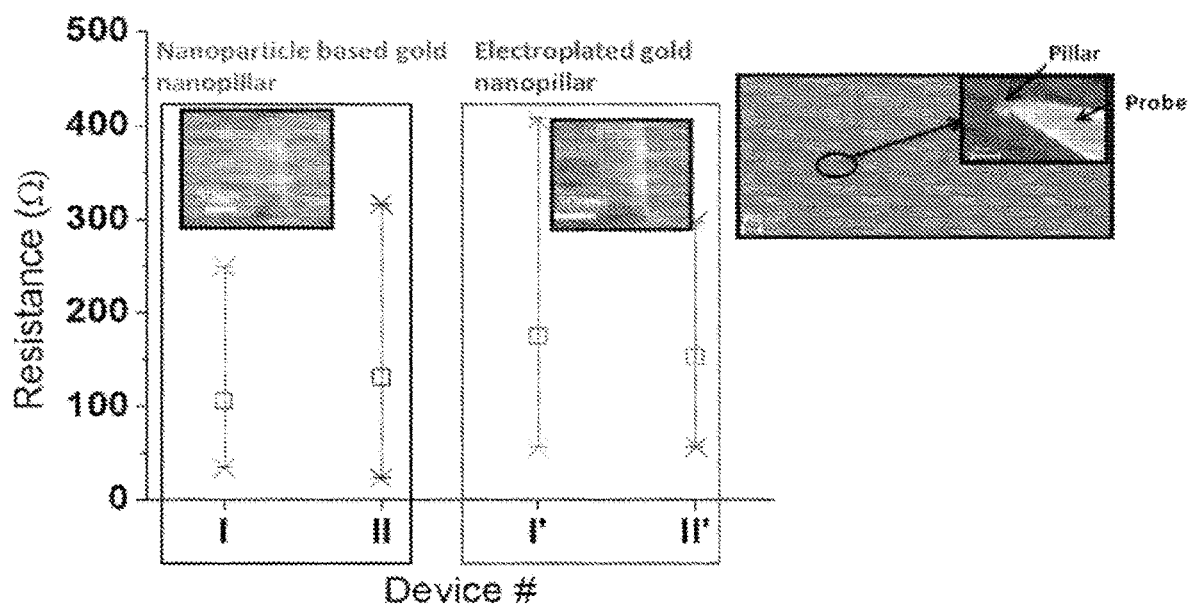
Figure 21A:
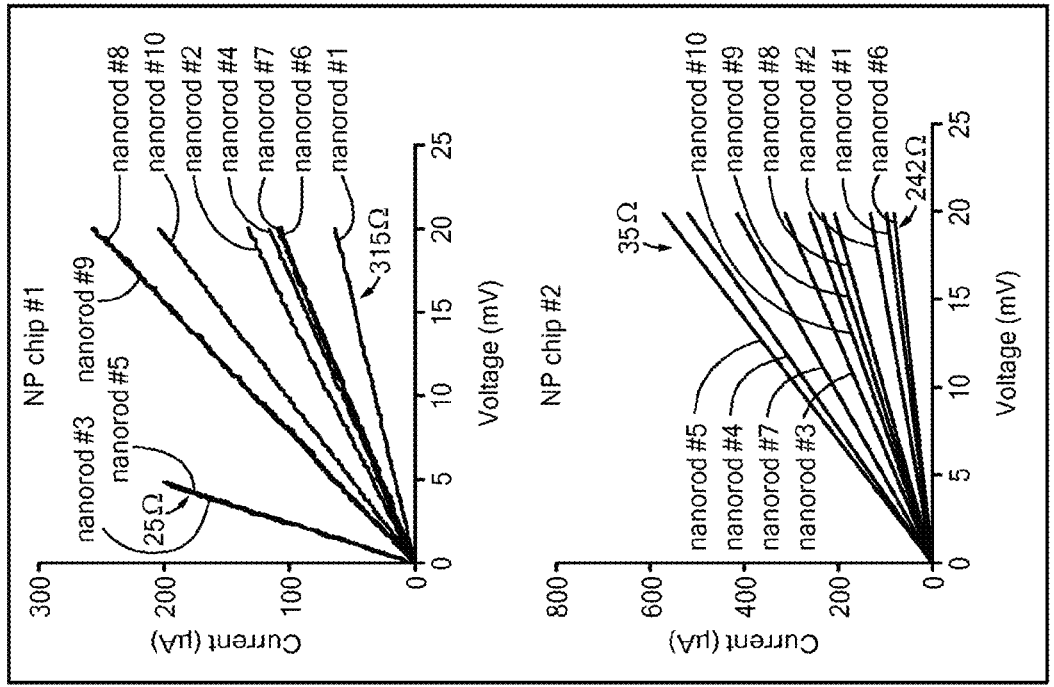
FIG. 21 is a set of graphs showing current measured as a function of voltage for sets of NP-based gold nanopillars (NP; panel A) and electroplated gold nanopillars (EP; panel B). Nanopillars on two different chips were measured for each type.
Figure 21B:
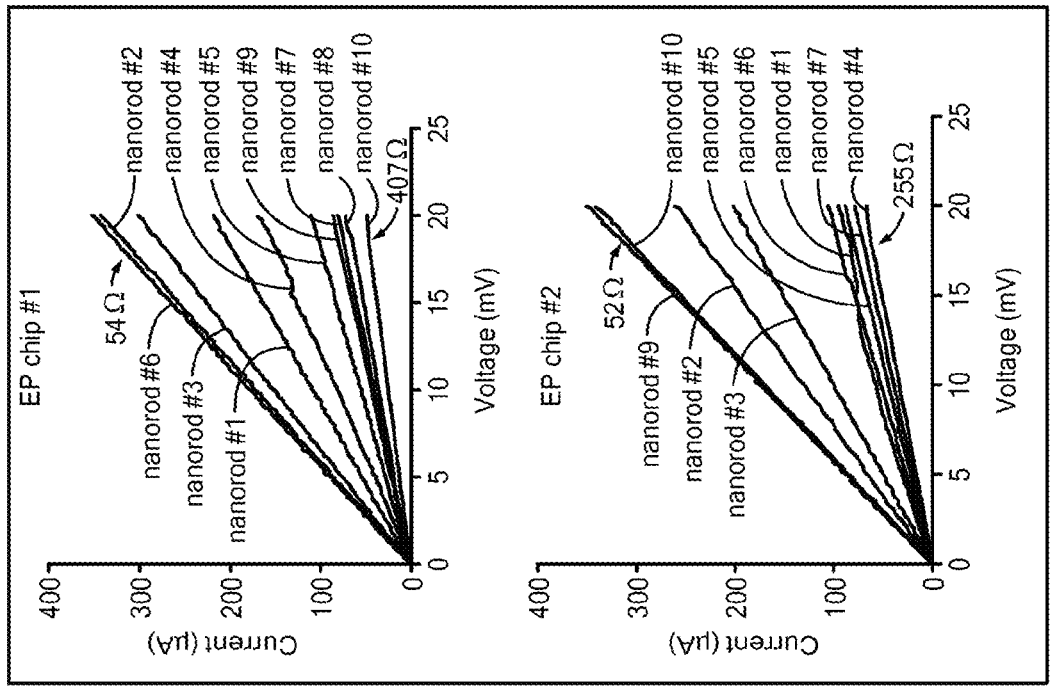

Both the NP-based and electroplated gold nanopillars yielded comparable resistance (FIG. 4C). Based on the resistance measurements, the lowest resistivity (calculated) for 20 different NP-based pillars was $1.96 \times 10^{-7} \Omega \cdot m$, which is only an order of magnitude higher than the bulk resistivity of gold ($2.44 \times 10^{-8} \Omega \cdot m$; FIG. 21). The lowest resistivity value is lower compared to some of the previously obtained values of resistivity for gold nanowires having similar dimensions (Chen et al., *Nanotechnology* 16, 1112-1115, 2005).

Further, flexibility in choice of material makes the method described above superior to electroplating. Because the formation of the nanopillars in this process is governed by physical assembly followed by fusion of NPs on the surface, and not by the chemical nucleation as in electroplating, the method offers the advantage that any conducting, semiconducting, or insulating materials can be directly fabricated on surfaces without requiring an intermediate seed layer or chemical additives. It is envisioned that this advantage together with the scalability of the process described here, would make possible development of seedless copper interconnect technology (Park et al., *J. Electrochem. Soc.* 157, D609-D613, 2010) and fabrication of very-small-diameter (<16 nm) interconnects (Reid et al. *Solid State Technol.* 53, 14-17, 2010), which currently pose challenges in CMOS (complementary metal-oxide-semiconductor) based manufacturing.

Nanostructure fabrication methods described above can be used to fabricate high quality plasmonic nanostructures for optical device applications. In a plasmonic nanostructure, surface plasmons localize, enhancing light at a metal/dielectric interface and leading to strong light/matter interactions (Aydin et al. *Nature Commun.* 2, 1-7, 2011). Advances in plasmonics require the ability to pattern high quality metals and hybrid materials at nanoscale dimensions. In recent years several new fabrication approaches have been proposed to exploit plasmons for a wide range of applications (Lu, *Science* 337, 450-453, 2012; Boltasseva, *J Opt. A: Pure Appl. Opt.* 11, 114001, 2009). Biosensing is one application of plasmonics (Khademhosseinieh et al., *Appl. Phys. Lett.* 97, 221107, 2010; Yanik, *Nano Letters*, 10 (12), 4962-4969 2010). Biosensing platforms utilize plasmonic resonances that show variations due to change in the refractive index of their surrounding medium. To achieve a reliable biosensor with low limit of detection, narrower resonances and high overlap between optical fields of the plasmonic mode and the interacting biomolecules are needed. A plasmonic metamaterial structure based on randomly positioned nanopillar arrays was recently shown to be suitable for ultrasensitive biosensing by Kabashin et al., *Nat. Mater.* 8, 867-871, 2009. A periodic nanopillar system was analyzed numerically to further improve biosensing performance (Cetin et al., *Appl. Phys. Lett.* 98, 111110, 2011). As shown in FIG. 5A, the optimized nanopillars of the present invention have radius and height of about 100 nm and 400 nm, respectively. Nanostructures with such high aspect ratio are challenging to make using lift-off based electron-beam lithography techniques.

FIGS. 5 B and C show near-field intensity enhancement ($|E|^2/|E_{in}|^2$) distribution at the top surface and through cross section, respectively. Numerical calculations were performed, which indicated that nanopillar arrays enhanced the incident light intensity up to 10,000 times. Further, these enhanced local fields extend deep into the medium, making them easily accessible to monitor changes in their surrounding medium, and strongly amplifying the sensitivity of nanopillar based plasmonic nanosensors to determine local refractive index changes.

Figure 23A:
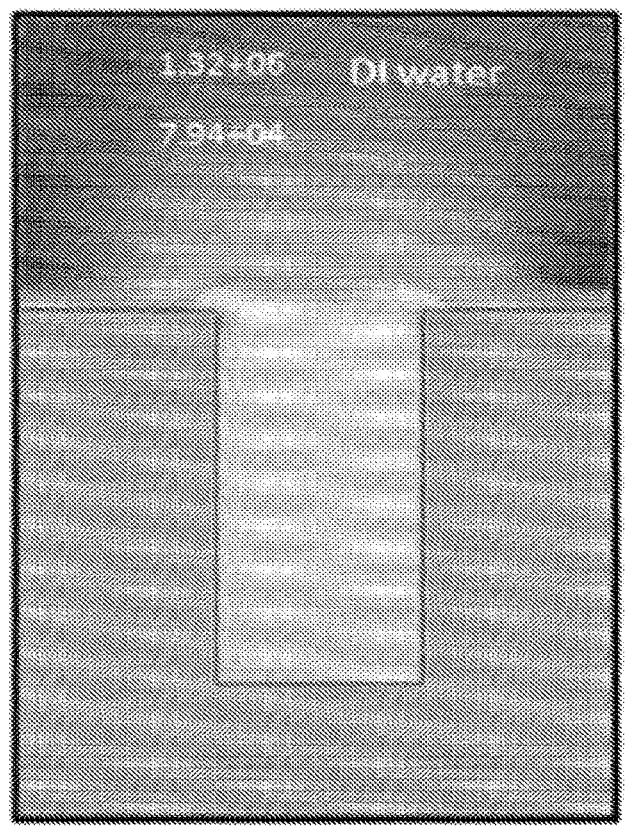
FIG. 23 panels A-C show simulation of electric field magnitude and SEM micrographs of nanopillars.
Figure 23B:
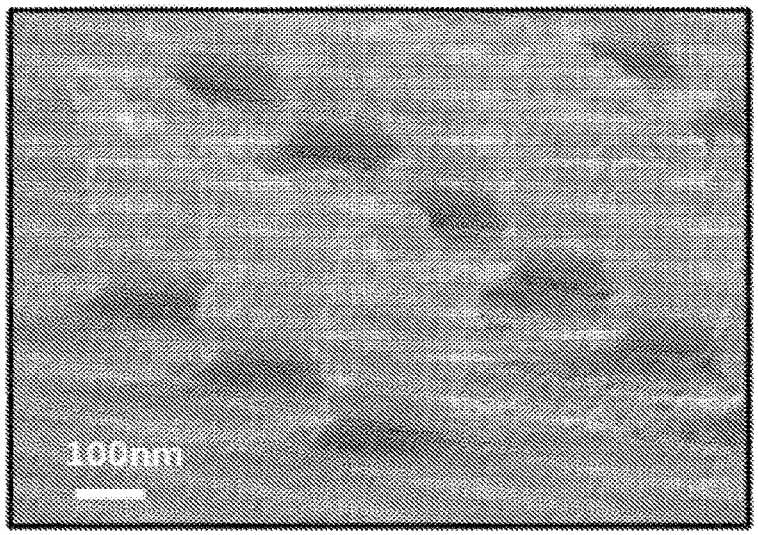
Figure 23C:
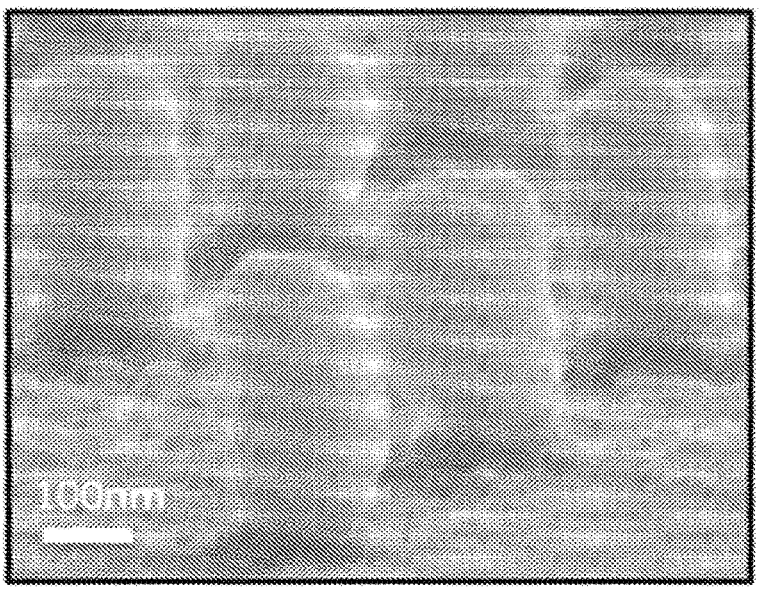

An example of a well-defined periodic nanopillar array prepared using the fabrication method of the present invention is as follows. It was observed that, for the fabrication of large diameter and deep structures over a large area (over 0.2 mm$^2$ area), further modification of the assembly conditions were necessary due to very low electric field in the vias. Instead of 5 nm gold particles, 50 nm particles were used. Larger particles experienced larger DEP forces, which increased the assembly rate in the vias. Further, a DC offset in addition to the AC electric field during the assembly process was used. As a result, the force on the particles was increased, and a uniform particle assembly was obtained over the via array (Yilmaz, C. et al., *IEEE Trans Nanotechnol.* 9, 653-658, 2010). Further, the assembly time was increased to 10 min. Moreover, it was observed that large particles were not fused during the assembly. Therefore, heat treatment at 250° C. on a hot plate was employed to fuse the large particles. FIG. 23 shows that the electric field intensity inside a 200 nm diameter and 400 nm high via, which produces a very large exposed area, is very low. It was observed that although the 50 nm NPs filled the vias, they did not fuse completely. However, particles were fused by applying heat from an external heat source following the assembly process. Compared to the melting temperature of bulk materials, the NPs start to melt at much lower temperatures (Ko et al. *Nano Lett.* 7, 1869-1877, 2007). FIG. 23C shows the fused gold NPs after heat treatment at 250° C. on a hot plate. The unfused NPs can also be fused by applying a large DC voltage (ca. 30V) between the template and the counter electrode following assembly.

The nanostructures obtained using methods described herein demonstrated high optical quality, supporting strong plasmonic resonances with line-widths as narrow as 13 nm. The resonance was observed to shift strongly with different refractive indices of bulk solutions including DI-water $n_{DI}$=1.333, acetone $n_{acetone}$=1.356 and IPA $n_{IPA}$=1.377. As shown in FIG. 5D, a refractive index sensitivity as large as 571 nm/RIU was observed. Due to spectrally narrow resonances the experimental figure of merit achieved was as large as 44.

Nanopillar structures were also found suitable for surface-based biosensing as demonstrated by the detection of monolayers of Protein A/G (a fusion of Protein A and Protein G having the immunoglobulin binding domains of both), and bilayers of immunoglobulin (IgG) bound to Protein A/G. As shown in FIG. 5E, due to accumulation of biomass on the sensor platform, the plasmonic resonance was observed to shift robustly by 4 nm and 14 nm after addition of Protein A/G and IgG, respectively.

EXAMPLES

Example 1. Particle and Template Preparation

Aqueous gold NPs (nominal diameter: 5 nm) were purchased from British Biocell International. Aqueous copper NP suspension (nominal diameter: 10 nm) was purchased from Meliorium Technologies (Rochester, N.Y.). Aqueous fluorescent polystyrene-latex (PSL) NP suspension (Fluoro-Max Red, nominal diameter: 22 nm) was purchased from Thermo Scientific (Waltham, Mass.). Aqueous polystyrene fluorescent silica NP suspension (fluorescent-green, nominal diameter: 30 nm) was purchased from Kisker-biotech (Steinfurt, Germany). The template depicted in FIG. 1 was prepared by sputtering Cr/Au (2 nm/120 nm) onto a SiO$_2$/Si (470 nm/380 m) wafer followed by dicing the wafer into 12 mm×12 mm chips. The Cr/Au chips were cleaned with piranha solution (H$_2$SO$_4$/H$_2$O$_2$, 2:1) and spin-coated with PMMA. Nanoscale patterns were fabricated using conventional electron beam lithography and developed subsequently with methyl isobutyl ketone and isopropyl alcohol (MIBK/IPA, 1:3).

Example 2. Nanoparticle-Based Nanopillar Manufacturing

The template prepared as described in Example 1 and a counter electrode (Cr/Au sputtered gold) were connected to a function/arbitrary waveform generator (Agilent 33220A) and submerged into a NP suspension. Following the application of a sinusoidal AC electric field with or without a DC offset, the template and the planar counter electrode were removed from the suspension using a dip coater (KSV NIMA) at a controlled speed (85 mm/min). Finally, the PMMA layer on the template was removed using acetone for metallic and silica nanopillars, or ethanol for PSL nanopillars.

Example 3. Nanopillar Electroplating Process

Techni-Gold 25 ES RTU (ready-to-use) solution was purchased from Technic, Inc. (Pawtucket, R.I.). The solution included sulfuric acid, ethylenediamine, sodium gold sulfite and sodium sulfite. The temperature of the solution was held at 60° C. The patterned template and a counter electrode were submerged into the electroplating solution. In contrast to the directed assembly, a platinized titanium mesh was used as the counter electrode. The solution was heated at a set temperature of 60° C., while stirring with a magnetic stirrer at a set rate of 75 rpm. A DC voltage was applied between the template and the counter electrode using a Keithley 2400 source meter. The magnitude of the applied voltage and duration of deposition were altered to control the electroplating rate.

Example 4. Electrical Characterization

Electrical properties of the nanopillars produced according to Example 2 were measured using an in situ NanoManipulator, Zyvex S-100 (Richardson, Tex.). Three tungsten probes with a 20-nm-diameter tip were used to form electrical contact. The manipulator probes were connected to an Agilent 4156C source measure unit (Fort Worth, Tex.). Initially, two of the probes were contacted to the bottom gold layer to measure resistance of the thin film. Once good contact was achieved between the two probes and the gold layer (resistance: ca. 10Ω), a third probe was applied to a nanopillar. The resistance of the nanopillar was measured by activating one of the probes on the gold layer and the probe on the nanopillar.

Example 5. TEM Sample Preparation and Characterization

High-resolution TEM and selected-area diffraction were employed to characterize the manufactured nanopillars. A Zeiss Auriga focused ion beam/scanning electron microscopy (FIB-SEM) workstation was employed for preparation of high-resolution TEM samples. To prepare a TEM specimen from a bulk wafer presenting the fabricated nanopillars, an array of nanopillars was coated with a carbon protection layer having a thickness of up to 1.5 µm. The carbon protection layer was formed using electron beam-assisted deposition for approximately the first 100 nm followed by ion beam-assisted deposition up to 1.5 µm. A lamella that contained the chosen array was cut out by focused ion beam (FIB) milling. The lamella was then lifted out in situ and welded onto an Omniprobe Mo TEM grid using an Omniprobe Autoprobe 300 (Ted Pella, Inc., Redding Calif.) mounted on the roof of the FIB/SEM chamber. Once affixed to the TEM grid, the lamella was further thinned down to approximately 100 nm using a 30-keV Ga ion beam. Final polishing and cleaning was performed using a 2-keV ion beam to minimize the ion beam damage to the nanopillars, resulting in lamellae having a final thickness of approximately 50-60 nm.

High-resolution TEM imaging and diffraction were performed using a 200-kV Zeiss Libra 200 field emission energy-filtering transmission electron microscope (FEG EF-TEM; Carl Zeiss Microscopy, Thornwood, N.Y.). All brightfield TEM images were acquired at 200 keV. SAED was achieved using a 10-µm condenser aperture, selectively illuminating the area of interest on the specimen.

Example 6. Fluorescence Images

A Nikon Optiphot 200 fluorescence microscope with a Micropublisher 5.0 cooled RTV camera was utilized to acquire optical images. Two different filters B2-A and G2-A (Nikon Inc.) were used for fluorescent silica and fluorescent PSL particles, respectively.

Example 7. Electric Field Simulation

The magnitudes of the electrical potential and electric field counters near the patterns were simulated using commercial 3-D finite-volume modeling software (FLOW-3D). In the simulations, the root-mean-square (RMS) value of the utilized voltage was applied to the gold layer beneath the vias. The calculated local electric field near the via was used to determine the electric field gradient, which was then used to calculate the DEP force on the particles.

Example 8. FDTD Simulations

Three-dimensional finite-difference time-domain (3D-FDTD) simulations were carried out to numerically analyze the far- and near-field responses of the NP system. The permittivity of gold was taken from the Handbook of Optical Constant of Solids; E. D. Palik, ed. Academic Press, Orlando, Fla. 1985. In FDTD simulations, periodic boundary conditions were applied along the x- and y-directions and Perfectly Matched Layer (PML) boundary condition was applied along the direction of the illumination source, z. The mesh size was chosen to be 2 nm along the x-, y- and z-directions.

Example 9. Detection of Protein Bound to Nanopillar Surface

Nanopillars produced using methods described in Example 2 were used for detection of bound protein by surface plasmon resonance. Nanopillars were immersed in ethanol for 30 minutes to remove any organic contamination on the surface. A protein monolayer was formed by applying Protein A/G, a recombinant fusion protein that consists of binding domains of both Protein A and Protein G, on the nanopillar chip surface. A 1 mg/ml solution of Protein A/G was used, and incubation was carried out for 1 hour. Protein A/G attaches to the gold surface of the nanopillar by physisorption. After incubation nanopillars were rinsed with PBS (phosphate buffered saline) to remove unbound protein.

A protein bilayer was formed by applying a 1 mg/ml solution of immunoglobulin G (IgG) on the chip surface bound to protein A/G, and incubating for 1 hour. IgG was immobilized on protein A/G monolayer due to the high affinity of protein A/G to the Fc regions of IgG. Unbound IgG was removed by rinsing washing with PBS.

A resonance shift of 4 nm was observed due to accumulation of biomass on the sensor platform due to the binding of protein A/G to the platform (FIG. 5 E). Further, a resonance shift of 14 nm was observed due to binding of IgG to Protein A/G bound to the nanopillars (FIG. 5 E).

Example 10. Spectral Measurements

Spectral measurements were performed using a Nikon Eclipse-Ti microscope coupled to a SpectraPro 500i spectrometer. Normally incident light was used to excite surface plasmons on nanopillars. Reflected data were then normalized using a thick gold standard.

Example 11. Electrical Characterization of Nanopillars

Figure 19A:
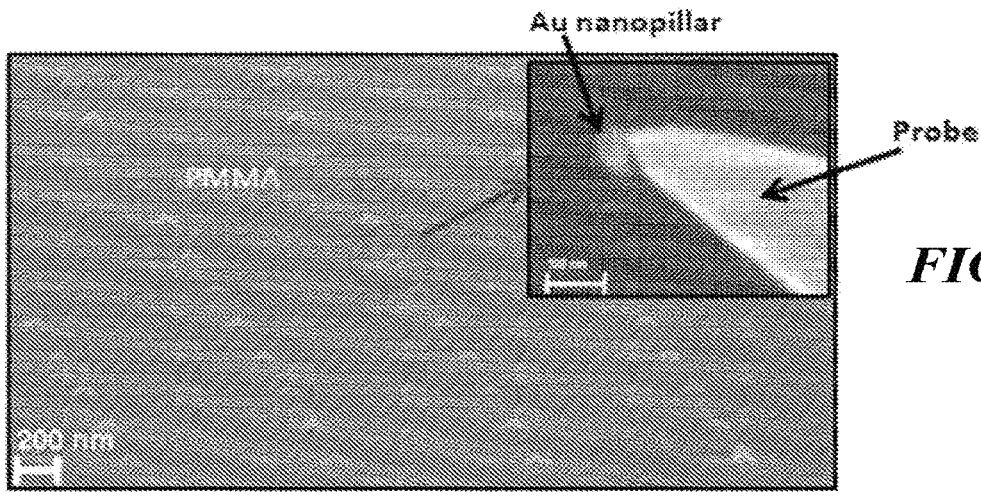
FIG. 19 panels A-C are SEM images of gold nanopillars, and a graph correlating electric current with applied voltage.
Figure 19B:
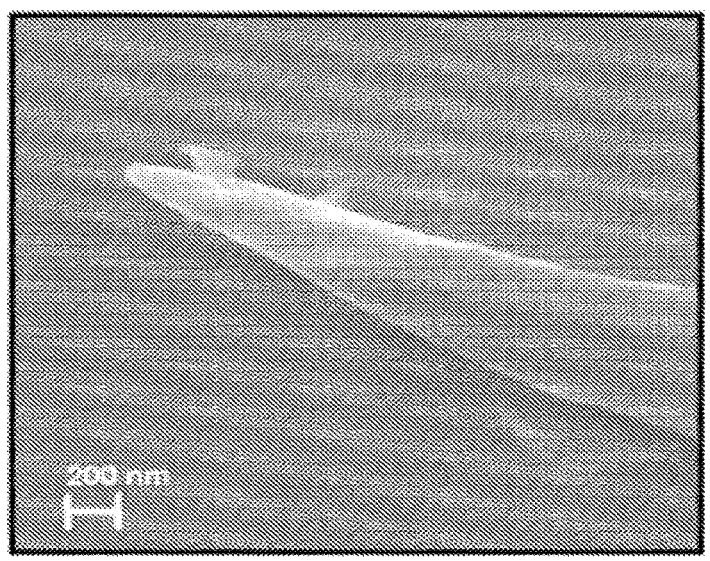
Figure 19C:
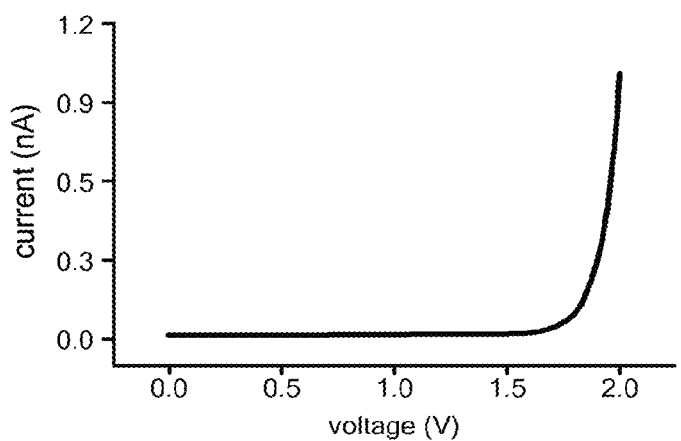
Figure 20A:
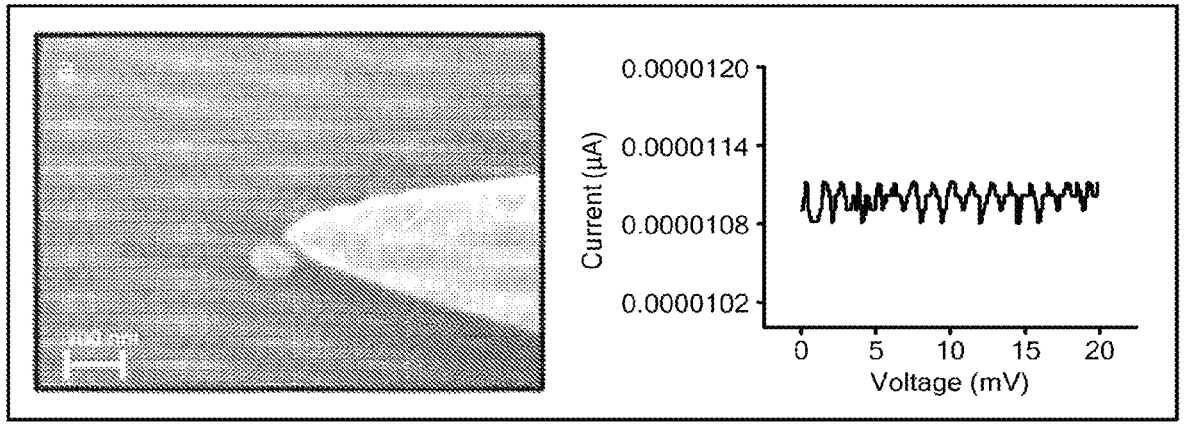
FIG. 20 panels A-E are a set of SEM images of nanopillars and probes, and graphs of electric current measured as a function of voltage.
Figure 20B:
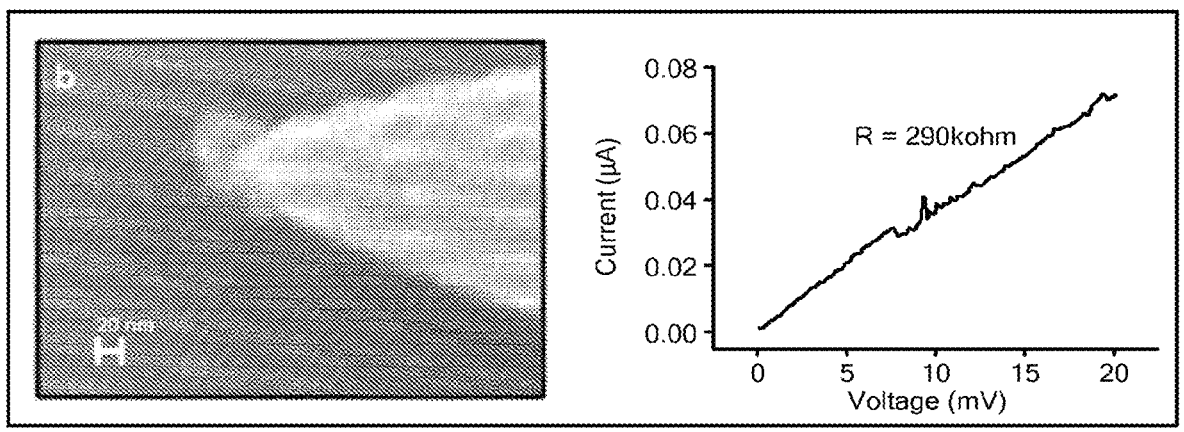
Figure 20C:
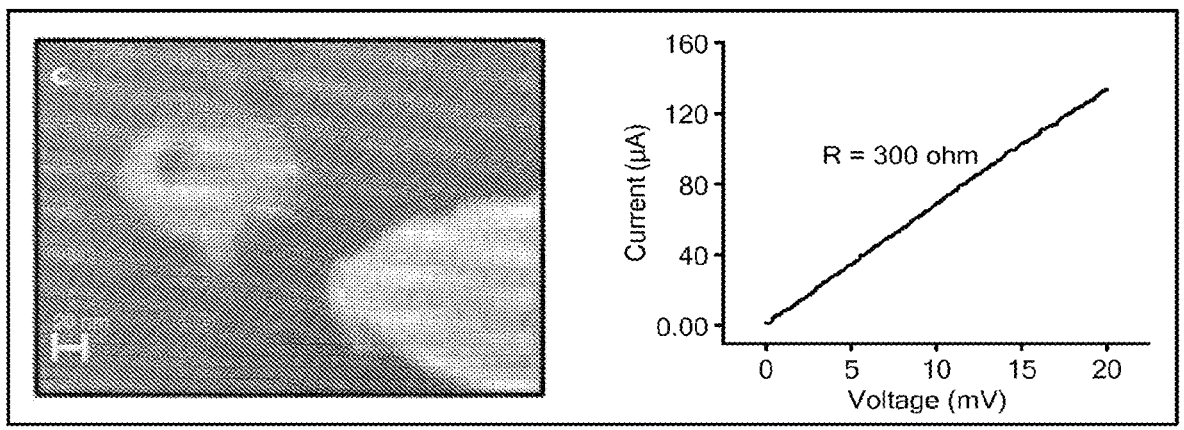
Figure 20D:
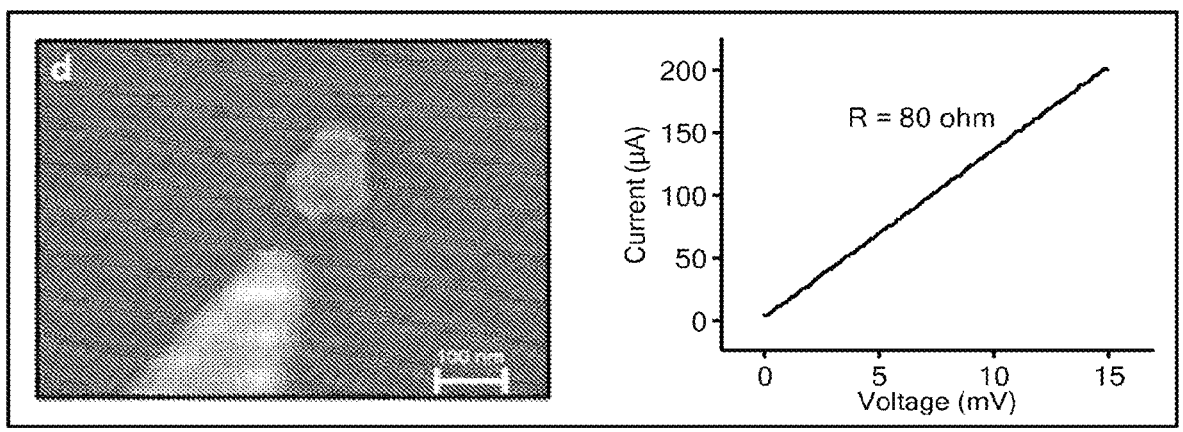
Figure 20E:
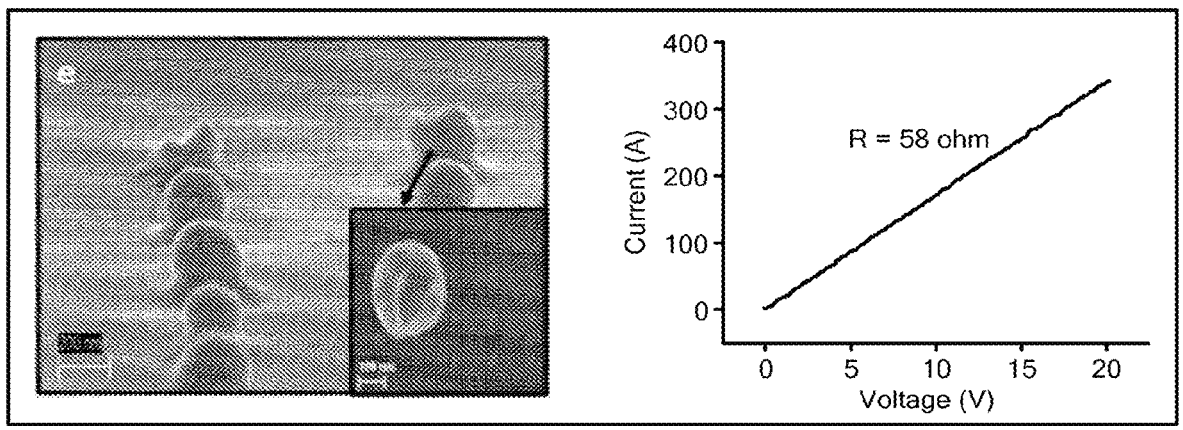

A SEM-based in situ nanomanipulator (Zyvex S-100) was used to compare the electrical characteristics of the electroplated and NP-based nanopillars. The electrical measurements were performed using two tungsten probes having a tip diameter of 20 nm; one of the probes contacted the nanopillars while the other contacted the thin gold layer under the PMMA (FIG. 19 A). The pillars broke readily when the measurements were performed after the PMMA layer had been removed. Therefore, the PMMA layer was not removed during the I-V measurements, i.e. encapsulated nanopillars were monitored. The PMMA layer also served as a dielectric barrier during the measurements, preventing any possible current leakage between the probe and the underlying gold surface (FIGS. 19 B and C).

The quality of the contact between the probe and the nanopillar was an important parameter affecting the reliability of the measurements. Achieving optimal contact (slight penetration into pillars) between the probe and a 50-nm-diameter nanopillar was observed to be difficult with a small pillar diameter. Large variations in resistance (from tens of ohms to hundreds of kiloohms) was observed for small size nanopillars depending on the quality of the contact (FIG. 20 A-C). The over-deposited nanostructures shown in FIGS. 20 D and E consistently produced lower values of resistance (hundreds of ohms or lower), indicating that a larger contact area, due to probe penetration, improved the reliability of the measurements.

The measurement was carried out for two chips each having several hundred nanopillars. From each chip ten nanopillars were randomly chosen and tested (FIG. 20). The resistance of bottom gold surface was measured as 10Ω using two probes. Similar resistance value was obtained when we changed the distance between the probes was changed. Hence, the obtained resistance of 10Ω was assumed to be due to the contact between the probe and the metal. Therefore, the amount of 10Ω was subtracted from the measured resistance while calculating the resistivity of nanopillars.

Based on the measurements, the lowest resistivity (calculated) for 20 different NP-based pillars was $1.96 \times 10^{-7} \Omega \cdot m$. This value is lower compared to some of the previously obtained values of resistivity for gold nanowires having similar dimensions (Chen, et al. *Nanotechnology* 16, 1112-1115, 2005; Calleja, M. *Appl. Phys. Lett.* 79, 2471-2473, 2001). The results obtained are particularly significant in view of reports that the resistivity of gold at nanoscale dimensions is higher than its bulk resistivity (Maissel, L. I., in *Handbook of Thin Film Technology*, edited by L. I. Maissel and R. Gland, McGraw-Hill, New York, reissue 1983). Increased metal resistivity in nanoscale structures might also be due to electron scattering from grain boundaries and interfaces.

Figure 22:
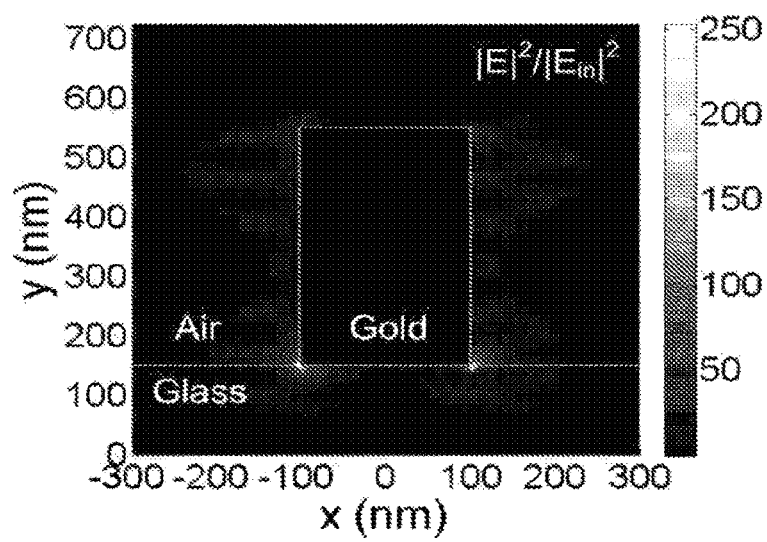
FIG. 22 shows a simulation of near-field intensity enhancement with a gold nanopillar standing on the dielectric substrate, glass. A value of $(|E|^2/|E_{in}|^2)$ of only as high as 250 was achieved. The scale to the right shows magnitude of fold enhancement of near-field intensity, and correlates with the fold enhancement shown in the FIG. The corresponding parameters are Diameter=200 nm, Height=400 nm and Pitch=600 nm, where pitch is the distance between the centers of the two adjacent vias.

Example 12. Comparison of the NP System Fabricated on a Metal and Dielectric Substrate Numerical simulations were performed to estimate near-field intensity enhancement ($|E|^2/|E_{in}|^2$) distribution at the top surface and through the cross-section for an unpolarized light source normal to the plane of nanopillars (FIG. 4 C). The simulations indicated that the nanopillar antenna arrays can enhance the intensity of the incident light up to 10.000 times. This value is much larger than that achieved with the NP system of identical dimensions fabricated on a dielectric substrate. FIG. 22 shows that a platform consisting of nanopillars fabricated on a glass substrate yields near-field intensity enhancement only as large as 250.

More importantly, for the NP system fabricated on a metal layer, the large local electromagnetic fields are mainly concentrated at the top surface of the nanopillars and extend deep into the surrounding medium. This is in sharp contrast with the nanopillar system fabricated on a dielectric substrate where most of the field is inaccessible since the field is concentrated under the supporting substrate. This result demonstrates that the NP system standing on a gold substrate fabricated by the manufacturing process described in methods herein is more advantageous compared to typical particle based systems fabricated on a dielectric substrate, such as rod or pillar configurations achieved through conventional lift-off based nanofabrication processes.

As used herein, "consisting essentially of" does not exclude materials or steps that do not materially affect the basic and novel characteristics of the claim. Any recitation herein of the term "comprising", particularly in a description of components of a composition or in a description of elements of a device, can be exchanged with "consisting essentially of" or "consisting of".

While the present invention has been described in conjunction with certain preferred embodiments, one of ordinary skill, after reading the foregoing specification, will be able to effect various changes, substitutions of equivalents, and other alterations to the compositions and methods set forth herein.

What is claimed is:

1. A method of fabricating a hybrid nanostructure by electric field directed assembly of nanoelements, the method comprising the steps of:
   providing a nanosubstrate comprising a base layer, a conductive layer deposited onto the base layer, and an insulating layer deposited onto the conductive layer, the insulating layer comprising a via, the via forming a void in the insulating layer and defining a pathway through the insulating layer that exposes the conductive layer;
   contacting the nanosubstrate with an aqueous suspension of first nanoelements;
   applying an electric field between the conducting layer and an electrode in the suspension for a period of time sufficient for migration of first nanoelements from the suspension into the via and their assembly in the via, wherein the electric field consists of the sum of a DC offset voltage and an AC voltage; and
   repeating, after the assembly, the contacting and the applying steps, using an aqueous suspension of second nanoelements different from the first nanoelements, thereby obtaining a hybrid nanostructure
   wherein the first and second nanoelements are insulating.

2. The method of claim 1, wherein the nanosubstrate comprises a plurality of vias, and a plurality of hybrid nanostructures are formed.

3. The method of claim 1, wherein the period of time for migration and assembly is adjusted to obtain a desired height or configuration of the nanostructure.

4. The method of claim 1, wherein the nanostructure possesses a geometry selected from the group consisting of nanopillars, nanoboxes and nanorings.

5. The method of claim 1, wherein the first and/or second nanoelements are selected from the group consisting of nanotubes, nanoparticles, and nanowires.

6. The method of claim 5 wherein the nanoparticles are insulating nanoparticles comprising a polymer.

7. The method of claim 1 further comprising fusing the first and/or second nanoelements to form a solid mass by either heating the assembled nanoelements or by applying a DC electric potential in the range from about 5V to about 30V.

8. The method of claim 1, wherein one more of the applied electric fields attain a magnitude of at least 2 MV/m within the via.

9. The method of claim 1, wherein a higher dielectrophoretic force is applied on the second nanoelements than on the first nanoelements.

10. The method of claim 1, wherein the second nanoelements are used at a higher concentration than the first nanoelements.

11. The method of claim 1 wherein the first and second nanoelements are conducting, and the first and second nanoelements are not the same.

12. The method of claim 1, wherein the fabricated hybrid nanostructure is a nanoantenna, an optical device, a plasmonic device, or a biosensor.

* * * * *

UNITED STATES PATENT AND TRADEMARK OFFICE
CERTIFICATE OF CORRECTION

| | | |
|---|---|---|
| PATENT NO. | : 11,220,756 B2 | Page 1 of 1 |
| APPLICATION NO. | : 16/131658 | |
| DATED | : January 11, 2022 | |
| INVENTOR(S) | : Busnaina et al. | |

It is certified that error appears in the above-identified patent and that said Letters Patent is hereby corrected as shown below:

In the Specification

Column 1, Line 20, please delete the following:
"The invention was developed with financial support from Grant No. 0832785 from the National Science Foundation. The U.S. Government has certain rights in the invention."
And replace it with:
--This invention was made with government support under 0425826 awarded by the National Science Foundation. The government has certain rights in the invention.--

Signed and Sealed this
Fifth Day of March, 2024

*Katherine Kelly Vidal*

Katherine Kelly Vidal
*Director of the United States Patent and Trademark Office*